United States Patent
Kikuchi et al.

(10) Patent No.: US 7,791,186 B2
(45) Date of Patent: Sep. 7, 2010

(54) WIRING BOARD, SEMICONDUCTOR DEVICE IN WHICH WIRING BOARD IS USED, AND METHOD FOR MANUFACTURING THE SAME

(75) Inventors: Katsumi Kikuchi, Tokyo (JP); Shintaro Yamamichi, Tokyo (JP); Yoichiro Kurita, Kanagawa (JP); Koji Soejima, Kanagawa (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 501 days.

(21) Appl. No.: 11/542,261

(22) Filed: Oct. 4, 2006

(65) Prior Publication Data

US 2007/0080439 A1 Apr. 12, 2007

(30) Foreign Application Priority Data

Oct. 12, 2005 (JP) .............................. 2005-297811

(51) Int. Cl.
*H01L 23/12* (2006.01)
(52) U.S. Cl. .................. 257/698; 257/700; 257/701; 257/702; 257/703; 257/693; 257/773; 257/774; 257/778
(58) Field of Classification Search ................. 257/737, 257/738, 700–703, 678, 777, 693, 772–776, 257/779–786, E23.01, E23.069; 228/180.22; 361/760–764
See application file for complete search history.

(56) References Cited

U.S. PATENT DOCUMENTS

| | | | | | |
|---|---|---|---|---|---|
| 5,721,451 | A | * | 2/1998 | Settles et al. | 257/679 |
| 5,892,271 | A | * | 4/1999 | Takeda et al. | 257/668 |
| 5,973,931 | A | * | 10/1999 | Fukasawa | 361/774 |
| 6,443,351 | B1 | * | 9/2002 | Huang et al. | 228/103 |
| 6,448,647 | B1 | * | 9/2002 | Kurita et al. | 257/738 |
| 6,744,122 | B1 | * | 6/2004 | Hashimoto | 257/668 |
| 6,753,612 | B2 | * | 6/2004 | Adae-Amoakoh et al. | 257/774 |
| 6,958,527 | B2 | * | 10/2005 | Hanaoka | 257/668 |
| 2005/0156326 | A1 | * | 7/2005 | Ito | 257/779 |

FOREIGN PATENT DOCUMENTS

| | | |
|---|---|---|
| CN | 1645604 A | 7/2005 |
| JP | 05-259639 A | 10/1993 |
| JP | 2000-323613 A | 11/2000 |
| JP | 2001-196643 A | 7/2001 |
| JP | 2003-229512 A | 8/2003 |
| JP | 2004-200668 A | 7/2004 |

* cited by examiner

*Primary Examiner*—Jasmine J Clark
(74) *Attorney, Agent, or Firm*—Sughrue Mion, PLLC

(57) ABSTRACT

A wiring board comprising a first surface on which a first electrode is disposed and a second surface on which a second electrode is disposed; at least a single insulation layer and at least a single wiring layer; and one or a plurality of mounted semiconductor elements, wherein the second electrode disposed on the second surface is embedded in the insulation layer, the surface on the opposite side of the exposed surface on the second surface side of the second electrode is connected to the wiring layer, and all or part of the side surface of the second electrode does not make contact with the insulation layer.

32 Claims, 15 Drawing Sheets

WIRING BOARD, SEMICONDUCTOR DEVICE IN WHICH WIRING BOARD IS USED, AND METHOD FOR MANUFACTURING THE SAME

BACKGROUND OF THE INVENTION

1. Field of the Invention

The present invention relates to a wiring board on which semiconductor elements are mounted, a semiconductor device in which semiconductor elements are mounted on the wiring board, and a method for manufacturing the same, and more specifically relates to a thin wiring board having excellent high-speed transmission characteristics and mounting reliability, and to a semiconductor device in which the wiring board is used.

2. Description of the Related Art

Electronic devices are rapidly becoming smaller, thinner, and increasingly dense, as recently seen in mobile equipment, and greater thinness, lighter weight, higher density, and other characteristics are needed in wiring boards used in device and semiconductor element mounting due to the increase in the number of terminals associated with higher speeds and functionality of semiconductor elements.

Built-up boards and other boards having through-holes have conventionally been commonly used as wiring boards, but boards having through-holes are thick and are furthermore not suited to high-speed signal transmission due to the presence of through-holes.

Tape boards and other thin boards, on the other hand, are also used, but such boards cannot meet the recent demand for higher density because the methods of manufacturing tape boards limit the wiring layers to one or two layers, and the pattern positioning accuracy is inferior to built-up boards due to considerable shrinkage of the tape material.

Coreless boards have been proposed as a method for improving the problems of these wiring boards. In these boards, a wiring structure body or the like is formed on a support board that has been prepared in advance, the support board is removed or separated after the wiring structure body has been formed, and through-holes are left unformed.

Disclosed in Japanese Laid-open Patent Application No. 2000-323613 is a technique in which a copper plate is used as a support board, a wiring structure is formed on the plate, and the support board is then etched away to obtain a coreless board.

Disclosed in Japanese Laid-open Patent Application No. 05-259639 is a technique in which a stainless steel plate is used as a support board, a wiring structure is formed on the plate, and the support board is then peeled away to obtain a coreless board.

Disclosed in Japanese Laid-open Patent Application No. 2004-200668 is a technique in which a copper foil is used as a support board, a wiring structure is formed and semiconductor elements are mounted on the foil, and the copper foil is etched to obtain a coreless board. Also disclosed in the publication is a semiconductor device in which a semiconductor chip is mounted on the coreless board.

Nevertheless, the wiring boards disclosed in the prior art described above have the following problems. With the techniques disclosed in Japanese Laid-open Patent Application Nos. 2000-323613, 05-259639, and 2004-200668, electrodes disposed on the surface obtained by removing a support board are embedded in an insulation resin, and the surface is smooth. Since the electrode surface on which soldering and connecting are to be performed is smooth, there is a problem in that a metal diffusion layer (alloy layer) between the solder and terminal electrode material is formed along the surface of the electrode, and the connection reliability is reduced because the alloy layer weakens the connection strength. In other words, when stress is applied after a connection is made, cracks are generated in the metal diffusion layer. It is therefore difficult to achieve stable reliability in connection structures in which a smooth electrode is used. Also, since the embedded electrodes are supported by an insulation resin that has a lower modulus of elasticity than an inorganic material, there is a problem in that ultrasonic waves are absorbed during wire-bonding and the bonding characteristics are degraded.

SUMMARY OF THE INVENTION

An object of the present invention is to provide a highly reliable wiring board, a semiconductor device in which the wiring board is used, and a method for manufacturing these boards wherein the connection reliability of the solder connection is improved as a result of the fact that a side surface of an electrode embedded and formed in the insulation resin layer is separated from the insulation resin layer to place the connection between the electrode and solder as far as the side surface of the electrode when another board or the like is connected to the electrodes, and wherein stable wire-bonding characteristics are obtained by preventing ultrasonic waves from being absorbed when another board or the like is connected to the electrode by wire bonding.

The wiring board according to the present invention comprises a first surface and a second surface including a first electrode disposed on the first surface, and a second electrode disposed on the second surface; at least a single insulation layer and at least a single wiring layer; and one or a plurality of mounted semiconductor elements. The second electrode disposed on the second surface is embedded in the insulation layer; the surface of the second electrode on the side opposite the surface exposed toward the second surface is connected to the wiring layer; and all or part of the side surface of the second electrode does not make contact with the insulation layer.

The surface of the second electrode that is exposed toward the second surface may be in the same plane as the second surface.

The surface of the second electrode that is exposed toward the second surface may be recessed with respect to the second surface.

The surface of the second electrode that is exposed toward the second surface may protrude from the second surface.

The first electrode and the second electrode may be directly connected.

The semiconductor device according to the present invention has the above-described wiring board, and one or a plurality of semiconductor elements connected to the first electrode and/or the second electrode in the wiring board.

In the semiconductor device according to the present invention, the first electrode and the second electrode may be directly connected, one or a plurality of semiconductor devices may be connected to the first electrode, and one or a plurality of semiconductor devices may be connected to the second electrode.

The semiconductor element may be flip-chip connected to the first electrode and/or the second electrode by using a material comprising a low-melting metal or an electroconductive resin.

The semiconductor element may be connected by wire bonding to the first electrode and/or the second electrode by using a wire in which the primary metal is gold.

The semiconductor element is preferably connected to the above-described wiring board by using at least one material selected from a group consisting of a low-melting metal, an organic resin, and a metal-containing resin.

In the semiconductor device according to the present invention, a metal ball comprising a solder material is preferably provided to the first electrode and/or the second electrode.

The method for manufacturing a wiring board according to the present invention comprises forming an insulation layer on a support board, forming an opening in the insulation layer in a position in which a second electrode will be formed so that the support board is exposed, forming the second electrode in the opening, forming a wiring layer on the insulation layer and the second electrode, forming a first electrode on the insulation layer and the second electrode, removing the support board, and forming a space between the side surface of the second electrode and the insulation layer.

The step for forming a wiring layer on the insulation layer and the second electrode, and the step for forming a first electrode on the insulation layer and the second electrode, may comprise simultaneously forming the insulation layer and the first electrode by patterning the same electroconductive film.

Another method for manufacturing a wiring board according to the present invention comprises forming an insulation layer on a support board, forming an opening in the insulation layer in a position in which a second electrode will be formed so that the support board is exposed, forming the second electrode in the opening, layering at least one or more wiring layers and at least one or more insulation layers, forming a first electrode on the topmost insulation layer, removing the support board, and forming a space between the side surface of the second electrode and the insulation layer.

A wiring layer may be formed on the topmost insulation layer in the step for forming a first electrode on the topmost insulation layer.

A step for providing the side surface of the opening with an insulating film more easily removable than the insulation layer by wet etching or dry etching may be included between the step for forming an opening in the insulation layer in a position in which a second electrode will be formed so that the support board is exposed, and the step for forming the second electrode in the opening.

Yet another method for manufacturing a wiring board according to the present invention comprises forming a second electrode on a support board, providing an insulation layer on the support board so as to cover the second electrode, exposing the surface of the second electrode on the side opposite the surface that is in contact with the support board, forming a wiring layer on the insulation layer and the second electrode, forming a first electrode on the insulation layer and the second electrode, removing the support board, and forming a space between the side surface of the second electrode and the insulation layer.

The wiring layer on the insulation layer and the second electrode, and the first electrode on the insulation layer and the second electrode, may be formed on the same electroconductive film and may be simultaneously formed by patterning the electroconductive film.

Yet another method for manufacturing a wiring board according to the present invention comprises forming a second electrode on a support board, providing an insulation layer on the support board so as to cover the second electrode, exposing the surface of the second electrode on the side opposite the surface that is in contact with the support board, layering at least one or more wiring layers and at least one or more insulation layers, forming a first electrode on the topmost insulation layer, removing the support board, and forming a space between the side surface of the second electrode and the insulation layer.

A wiring layer may be formed on the topmost insulation layer in the step for forming a first electrode on the topmost insulation layer.

A step for forming an insulating film more easily removable than the insulation layer by wet etching or dry etching may be included between the step for forming a second electrode on a support board and the step for providing an insulation layer on the support board so as to cover the second electrode.

The step for exposing the surface of the second electrode on the side opposite the surface that is in contact with the support board preferably comprises polishing both the insulation layer and the second electrode.

The step for exposing the surface of the second electrode on the side opposite the surface that is in contact with the support board may comprise providing the insulation layer with a concavity in which the second electrode is exposed and which is larger than the surface area of the second electrode.

The step for forming a space between the side surface of the second electrode and the insulation layer is preferably wet etching and/or dry etching.

A step for exposing the second electrode may be included between the step for removing the support board and the step for forming a space between the side surface of the second electrode and the insulation layer.

The step for removing the support board may be a peeling step.

The support board may be an electroconductive material or a material on which an electroconductive film is formed on the surface.

The method for manufacturing a semiconductor device according to the present invention comprises forming an insulation layer on a support board, forming an opening in the insulation layer in a position in which a second electrode will be formed so that the support board is exposed, forming the second electrode in the opening, forming a wiring layer on the insulation layer and the second electrode, forming a first electrode on the insulation layer and the second electrode, mounting one or a plurality of semiconductor elements on the first electrode, removing the support board, and forming a space between the side surface of the second electrode and the insulation layer.

The wiring layer on the insulation layer and the second electrode, and the first electrode on the insulation layer and the second electrode, are preferably formed from the same electroconductive film and are preferably formed simultaneously by patterning the electroconductive film.

Another method for manufacturing a semiconductor device according to the present invention comprises forming an insulation layer on a support board, forming an opening in the insulation layer in a position in which a second electrode will be formed so that the support board is exposed, forming the second electrode in the opening, layering at least one or more wiring layers and at least one or more insulation layers, forming a first electrode on the topmost insulation layer, mounting one or a plurality of semiconductor elements on the first electrode, removing the support board, and forming a space between the side surface of the second electrode and the insulation layer.

A wiring layer may be formed on the topmost insulation layer in the step for forming a first electrode on the topmost insulation layer.

A step for providing the side surface of the opening with an insulating film more easily removable than the insulation layer by wet etching or dry etching is preferably included between the step for forming an opening in the insulation layer in a position in which a second electrode will be formed so that the support board is exposed, and the step for forming the second electrode in the opening.

Another method for manufacturing a semiconductor device according to the present invention comprises forming a second electrode on a support board, providing an insulation layer on the support board so as to cover the second electrode, exposing the surface of the second electrode on the side opposite the surface that is in contact with the support board, forming a wiring layer on the insulation layer and the second electrode, forming a first electrode on the insulation layer and the second electrode, mounting one or a plurality of semiconductor elements on the first electrode, removing the support board, and forming a space between the side surface of the second electrode and the insulation layer.

The wiring layer on the insulation layer and the second electrode, and the first electrode on the insulation layer and the second electrode, are preferably formed from the same electroconductive film and are preferably formed simultaneously by patterning the electroconductive film.

Yet another method for manufacturing a semiconductor device according to the present invention comprises forming a second electrode on a support board, providing an insulation layer on the support board so as to cover the second electrode, exposing the surface of the second electrode on the side opposite the surface that is in contact with the support board, layering at least one or more wiring layers and at least one or more insulation layers, forming a first electrode on the topmost insulation layer, mounting one or a plurality of semiconductor elements on the first electrode, removing the support board, and forming a space between the side surface of the second electrode and the insulation layer.

A wiring layer may be formed on the topmost insulation layer in the step for forming a first electrode on the topmost insulation layer.

A step for forming an insulating film more easily removable than the insulation layer by wet etching or dry etching may be included between the step for forming a second electrode on a support board and the step for providing an insulation layer on the support board so as to cover the second electrode.

The step for exposing the surface of the second electrode on the side opposite the surface that is in contact with the support board preferably comprises polishing both the insulation layer and the second electrode.

The step for exposing the surface of the second electrode on the side opposite the surface that is in contact with the support board may comprise providing the insulation layer with a concavity in which the second electrode is exposed and which is larger than the surface area of the second electrode.

A step for mounting one or a plurality of semiconductor elements on the second electrode may be included after the step for forming a space between the side surface of the second electrode and the insulation layer.

Yet another method for manufacturing a semiconductor device comprises forming an insulation layer on a support board, forming an opening in the insulation layer in a position in which a second electrode will be formed so that the support board is exposed, forming the second electrode in the opening, forming a wiring layer on the insulation layer and the second electrode, forming a first electrode on the insulation layer and the second electrode, removing the support board, forming a space between the side surface of the second electrode and the insulation layer, and mounting one or a plurality of semiconductor elements on the second electrode.

The wiring layer on the insulation layer and the second electrode, and the first electrode on the insulation layer and the second electrode, are preferably formed from the same electroconductive film and are preferably formed simultaneously by patterning the electroconductive film.

Yet another method for manufacturing a semiconductor device comprises forming an insulation layer on a support board, forming an opening in the insulation layer in a position in which a second electrode will be formed so that the support board is exposed, forming the second electrode in the opening, layering at least one or more wiring layers and at least one or more insulation layers, forming a first electrode on the topmost insulation layer, removing the support board, forming a space between the side surface of the second electrode and the insulation layer, and mounting one or a plurality of semiconductor elements on the second electrode.

A wiring layer may be formed on the topmost insulation layer in the step for forming a first electrode on the topmost insulation layer.

A step for forming an insulating film more easily removable than the insulation layer by wet etching or dry etching may be included between the step for forming an opening in the insulation layer in a position in which a second electrode will be formed so that the support board is exposed, and the step for forming the second electrode in the opening.

Yet another method for manufacturing a semiconductor device comprises forming a second electrode on a support board, providing an insulation layer on the support board so as to cover the second electrode, exposing the surface of the second electrode on the side opposite the surface that is in contact with the support board, forming a wiring layer on the insulation layer and the second electrode, forming a first electrode on the insulation layer and the second electrode, removing the support board, forming a space between the side surface of the second electrode and the insulation layer, and mounting one or a plurality of semiconductor elements on the second electrode.

The wiring layer on the insulation layer and the second electrode, and the first electrode on the insulation layer and the second electrode, are preferably formed from the same electroconductive film and are preferably formed simultaneously by patterning the electroconductive film.

Yet another method for manufacturing a semiconductor device comprises forming a second electrode on a support board, providing an insulation layer on the support board so as to cover the second electrode, exposing the surface of the second electrode on the side opposite the surface that is in contact with the support board, layering at least one or more wiring layers and at least one or more insulation layers, forming a first electrode on the topmost insulation layer, removing the support board, forming a space between the side surface of the second electrode and the insulation layer, and mounting one or a plurality of semiconductor elements on the second electrode.

A wiring layer may be formed on the topmost insulation layer in the step for forming a first electrode on the topmost insulation layer.

A step for forming an insulating film more easily removable than the insulation layer by wet etching or dry etching may be included between the step for forming a second electrode on a support board and the step for providing an insulation layer on the support board so as to cover the second electrode.

The step for exposing the surface of the second electrode on the side opposite the surface that is in contact with the support board may comprise polishing both the insulation layer and the second electrode.

The step for exposing the surface of the second electrode on the side opposite the surface that is in contact with the support board may comprise providing the insulation layer with a concavity in which the second electrode is exposed and which is larger than the surface area of the second electrode.

The step for forming a space between the side surface of the second electrode and the insulation layer may be wet etching and/or dry etching.

A step for exposing the second electrode may be included between the step for removing the support board and the step for forming a space between the side surface of the second electrode and the insulation.

A step for mounting a metal ball comprising a solder material on the first electrode and/or second electrode may be included.

The step for removing the support board may be a peeling step.

The support board is preferably an electroconductive material or a material on which an electroconductive film is formed on the surface.

In the wiring board and the semiconductor device in which the wiring board is used according to the present invention, the brittle metal diffusion layer at the connection boundary can be effectively prevented from being broken by the stress generated after the components, board, and the like have been connected, or by the stress primarily applied to the electrode surface in the horizontal direction. This prevention is achieved as a result of the fact that a side surface of the electrode embedded and formed in the insulation resin layer is separated from the insulation resin layer to place the connection between the electrode and solder as far as the side surface of the electrode when another board or the like is connected to the electrodes. Stable wire bonding characteristics can be obtained by preventing ultrasonic waves from being absorbed when another board or the like is connected to the electrodes by wire bonding, and connection reliability is improved in relation to components, other boards, or the like connected to the wiring board.

In accordance with the method for manufacturing the wiring board according to the present invention, the wiring board according to the present invention can be effectively fabricated, wire formation can be stably performed by using a support board in the steps, and future high-density and precision wire formation can be achieved. Since the thickness of the wiring board can furthermore be minimized by removing the support board after wiring formation, the inductance can be reduced and electrical loss can be suppressed. Also, the support board can be reused and the costs reduced by peeling off the support board in the removal step.

In accordance with the method for manufacturing the semiconductor device according to the present invention, the semiconductor device according to the present invention can be effectively fabricated, and since the semiconductor elements are mounted while making use of the stable support board, connections can be stably made at a very narrow pitch of 50 µm or less. The thickness of the wiring board can furthermore be minimized by removing the support board after the semiconductor elements have been mounted, and the space between previously mounted semiconductor elements can be set to a very short distance by mounting another semiconductor element on the exposed surface. For this reason, a large number of micro-connections can be provided, and high-speed signal transmission and a wide bus width can be brought about between the semiconductor elements on the two surfaces.

DESCRIPTION OF THE PREFERRED EMBODIMENTS

Figure 1:
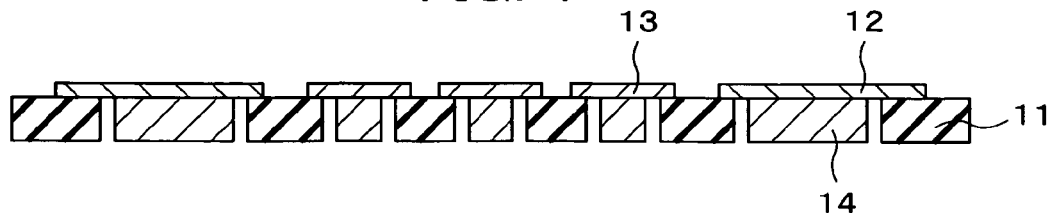
FIG. 1 is a schematic cross-sectional view showing an example of a wiring board according to the first embodiment of the present invention.

Embodiments of the present invention are described in detail below with reference to the attached diagrams. Described first is the first embodiment of the present invention. FIG. 1 is a schematic cross-sectional view showing an example of a wiring board according to the present embodiment. The wiring substrate shown in FIG. 1 has a structure comprising an insulation layer 11, second electrodes 14 embedded in the insulation layer 11, and a wiring layer 12 and first electrodes 13 disposed on the insulation layer 11 and second electrodes 14, and the side surfaces from among the exposed surfaces of the second electrodes 14 are not in contact with the insulation layer 11.

The insulation layer 11 is formed, e.g., from a photosensitive or non-photosensitive organic material, and examples of the organic material that may be used include epoxy resin, epoxy acrylate resin, urethane acrylate resin, polyester resin, phenolic resin, polyimide resin, BCB (benzocyclobutene), PBO (polybenzoxazole), polynorbornene resin, and the like; or a material in which a woven or a nonwoven made of a glass cloth, aramid fiber, or another fiber is impregnated with epoxy resin, epoxy acrylate resin, urethane acrylate resin, polyester resin, phenolic resin, polyimide resin, BCB (benzocyclobutene), PBO (polybenzoxazole), polynorbornene resin, or the like. The material in which polyimide resin, PBO, or a woven or nonwoven cloth is used has particularly good membrane strength, tensile modulus of elasticity, elongation at break, and other mechanical characteristics, and high reliability can therefore be achieved. In the present embodiment, polyimide resin is used as the insulation layer 11, for example, and is formed to a thickness of 10 µm.

The principal material of the wiring layer 12 is preferably composed of one or more metals selected from copper, gold, nickel, aluminum, silver, and palladium, but copper is most advantageous from the aspect of cost and resistance. Also, nickel can prevent a boundary reaction with the insulation material or another material, and can be used as resistance wiring or as an inductor in which the magnetic characteristics are utilized.

The wiring layer 12 is formed from copper, as described above, and the thickness is 10 µm, for example. Examples of the method for forming the wiring layer 12 include the subtractive, semi-additive, and fully additive methods.

The subtractive method is a method in which a resist of a desired pattern is formed on a copper foil disposed on a board, the unneeded copper foil is etched away, and the resist is thereafter peeled away to obtain the desired pattern.

The semi-additive method is a method in which a power supply layer is formed by electroless plating, sputtering, CVD (Chemical Vapor Deposition), or another method; a resist having a desired pattern is then formed; a metal is deposited by electrolytic plating in the resist openings; the resist is removed; and the power supply layer is the etched to obtain the desired wiring pattern.

The fully additive method is a method in which an electroless plating catalyst is adsorbed onto a board, a resist pattern is then formed, the catalyst is activated while the resist is left behind as an insulation layer, and a metal is deposited in the openings in the insulating film by electroless plating to obtain a desired wiring pattern.

Also, the wiring layer 12 may be formed by providing concavities that form the wiring pattern in the insulation layer (not shown) on which the wiring layer 12 is disposed; forming a power supply layer by electroless plating, sputtering, CVD, or another method; thereafter filling the concavities using electroless plating or electrolytic plating; and smoothing the surface by polishing.

First electrodes 13 are disposed on the insulation layer 11 and second electrodes 14, and are electrically connected by direct connection to the second electrodes 14, or are electrically connected to the second electrodes 14 by way of the wiring layer 12.

The first electrodes 13 can be formed by laminating a plurality of layers, for example, and the surface of the first electrodes 13 is preferably formed from at least one metal or an alloy selected from the group consisting of gold, silver, copper, tin, and solder materials, with consideration given to the connectivity of the bonding wire or the wettability of solder balls formed on the surface of the first electrodes 13 in a later step. In the present embodiment, the first electrodes 13 can be formed by sequentially layering copper to a thickness of 5 µm, nickel to a thickness of 3 µm, and gold to a thickness of 0.5 µm, wherein gold is the topmost layer.

Although not depicted, a solder resist in a pattern having openings on the inner side of the first electrodes 13, or in a pattern having openings that do not make contact with the first electrodes 13, may be added to the top of the wiring layer 12 and first electrodes 13. The structure may furthermore be one in which a solder resist pattern is formed and a first electrode pattern is then disposed so as to cover the openings. The wiring layer 12 and first electrodes 13 may be simultaneously formed by patterning the same electroconductive film.

The second electrodes 14 are embedded in the insulation layer 11 and are electrically connected to the wiring layer 12 or the first electrodes 13. The surface of the second electrodes 14 on the side opposite the surface that is in contact with the wiring layer 12 or first electrodes 13 is exposed to the exterior, and this surface is positioned in the same plane as the surface of the insulation layer 11 on the side opposite the surface on which the wiring layer 12 and first electrodes 13 are formed.

Also, the side surface of the exposed surfaces of the second electrodes 14 has a structure in which all or part of the surface is not in contact with the insulation layer 11. When a connection that uses solder material is made in this structure, a gap needed for the solder material to flow during reflow may be formed, and contact may be maintained at room temperature.

The second electrodes 14 can be formed by laminating a plurality of layers, for example, and the surface of the second electrodes 14 is preferably formed from at least one metal or an alloy selected from the group consisting of gold, silver, copper, tin, and solder materials, with consideration given to the connectivity of the bonding wire or the wettability of solder balls formed on the surface of the second electrodes 14 in a later step. Nickel, rhodium, or another very hard metal layer may be disposed on the side surface of the second electrodes 14 in order to stabilize the wire-bonding characteristics. In the present embodiment, the second electrodes 14 can be formed by sequentially layering copper to a thickness of 5 µm, nickel to a thickness of 3 µm, and gold to a thickness of 0.5 µm, wherein gold is the topmost layer.

In accordance with the present embodiment, a solder connection is also made on the side surface of the second electrodes 14 when components, another board, or the like are connected with solder to the wiring board according to the present embodiment because the side surfaces of the second electrodes 14 are not in contact with the insulation layer 11. Connection reliability is thereby improved because the brittle metal diffusion layer at the connection boundary can be effectively prevented from being broken by the stress generated after the components, board, and the like have been connected, or by the stress primarily applied to the electrode surface in the horizontal direction. Stable wire bonding characteristics can be achieved by preventing ultrasonic waves from being absorbed when another board or the like is connected to the electrodes by wire bonding. Stable wire bonding characteristics can be achieved and connection reliability is improved if a rigid metal is disposed on the side surfaces of the second electrodes 14.

Figure 2:
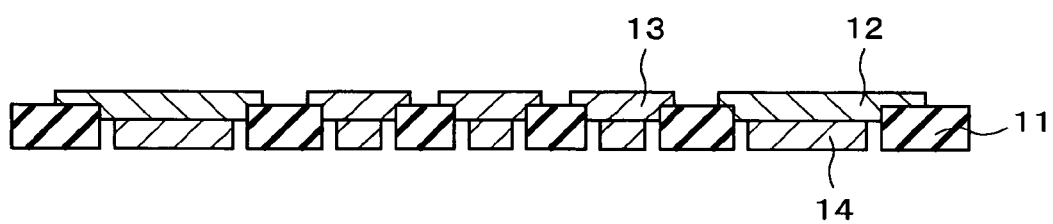
FIG. 2 is a schematic cross-sectional view showing a first modified example of the wiring board according to the first embodiment of the present invention.

FIG. 2 is a schematic cross-sectional view showing a first modified example of the wiring board according to the present embodiment. In FIG. 2, the same reference numerals are used for the same constituent elements as in FIG. 1, and a detailed description thereof is omitted. In relation to the configuration of the wiring board according to the first embodiment described above, the wiring board according to the first modified example of the present embodiment has the same structure as the first embodiment except that a portion of the first electrodes 13 and a portion of the wiring layer 12 in contact with the second electrodes 14 is formed in the opening in which the second electrodes 14 of the insulation layer 11 are embedded, and the wiring layer 12 and first electrodes 13 are in contact with a portion of the side surfaces of the insulation layer 11.

In addition to the effects obtained with the wiring board according to the first embodiment described above, the wiring board according to the first modified example of the present embodiment can ensure further improvement in connection reliability in comparison with the first embodiment. The improvement can be achieved because a portion of the wiring layer 12 is in contact with the interior of the opening of the insulation layer 11, making it possible for both the wiring layer 12 and the insulation layer 11 to alleviate stress that is generated when a solder ball is formed on the second electrodes 14, and semiconductor elements, another board, or the like are mounted.

Figure 3:
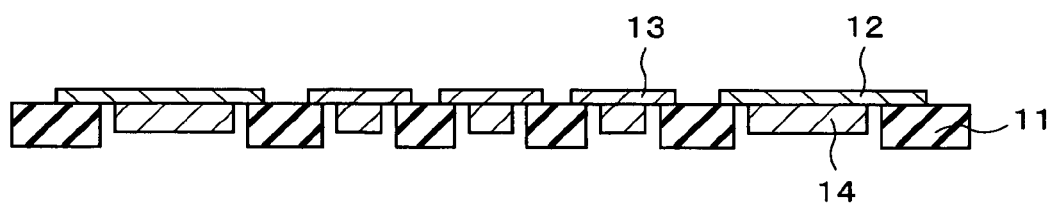
FIG. 3 is a schematic cross-sectional view showing a second modified example of the wiring board according to the first embodiment of the present invention.

FIG. 3 is a schematic cross-sectional view showing a second modified example of the wiring board according to the present embodiment. In FIG. 3, the same reference numerals are used for the same constituent elements as in FIGS. 1 and 2, and a detailed description thereof is omitted. In relation to the configuration of the wiring board according to the first embodiment described above, the wiring board according to the second modified example of the present embodiment has the same structure as the first embodiment except that the surface of the second electrodes 14 on the side opposite the surface that is in contact with the wiring layer 12 is recessed with respect to the surface of the insulation layer 11 on which the wiring layer 12 is not disposed.

In addition to the effects obtained with the wiring board according to the first embodiment described above, the wiring board according to the second modified example of the present embodiment can prevent solder rolling when a solder ball is formed on the second electrodes 14, because the surfaces of the second electrodes 14 are recessed with respect to the surface of the insulation layer 11.

Figure 4:
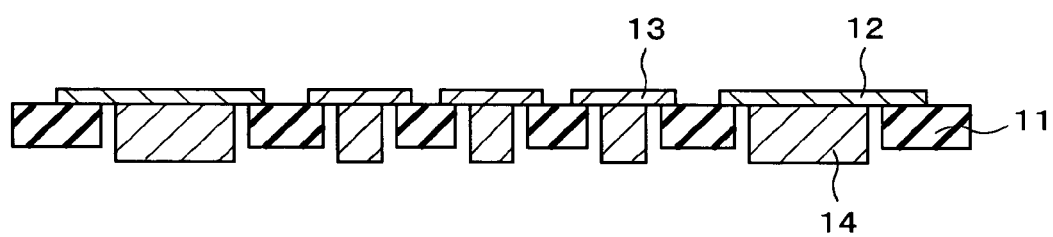
FIG. 4 is a schematic cross-sectional view showing a third modified example of the wiring board according to the first embodiment of the present invention.

FIG. 4 is a schematic cross-sectional view showing a third modified example of the wiring board according to the present embodiment. In FIG. 4, the same reference numerals are used for the same constituent elements as in FIGS. 1 to 3, and a detailed description thereof is omitted. In relation to the configuration of the wiring board according to the first embodiment described above, the wiring board according to the third modified example of the present embodiment has the same structure as the first embodiment except that the surface on opposite side of the surface of the second electrodes 14 that is in contact with the wiring layer 12 protrudes from the surface of the insulation layer 11 on which the wiring layer 12 is not disposed.

In addition to the effects obtained with the wiring board according to the first embodiment described above, the wiring board according to the third modified example of the present embodiment can prevent the generation of cracks from the bottom of the solder ball when a solder ball is formed on the second electrodes 14, and semiconductor elements, another board, or the like are mounted, because the surfaces of the second electrodes 14 are in a position that protrudes from the surface of the insulation layer 11. The connection reliability obtained by the wiring board according to the first embodiment described above can be further improved.

Figure 5:
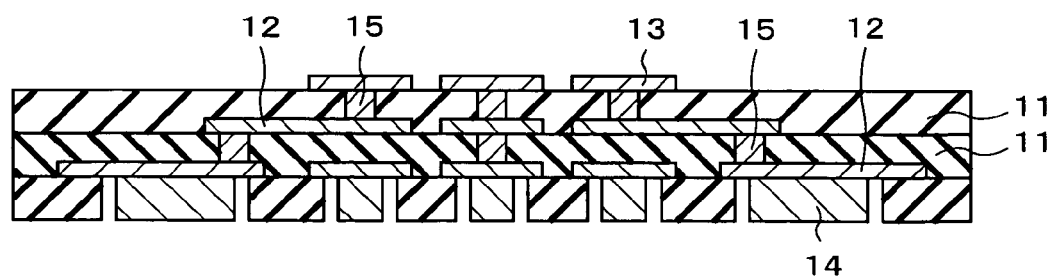
FIG. 5 is a schematic cross-sectional view showing an example of the wiring board according to the second embodiment of the present invention.

The second embodiment of the present invention is described next. FIG. 5 is a schematic cross-sectional view showing an example of the wiring board according to the present embodiment. In FIG. 5, the same reference numerals are used for the same constituent elements as in FIGS. 1 to 4, and a detailed description thereof is omitted. The wiring board according to the present embodiment has a structure in which a plurality of insulation layers 11 and wiring layers 12 is laminated, and different wiring layers 12 are connected to each other by way of vias 15. The diagram in FIG. 5 shows three insulation layers 11 and two wiring layers 12 laminated together, but no limitation is imposed by this configuration, and the insulation layers 11 and wiring layers 12 may have any required number of layers. The structure may also be one in which a plurality of insulation layers 11 and wiring layers 12 is laminated based on the structure shown in FIGS. 2 to 4 described above in the first embodiment. Described below is an example of a structure in which a plurality of insulation layers 11 and wiring layers 12 is laminated together based on the structure shown in FIG. 1.

In the wiring board according to the present embodiment, a plurality of insulation layers 11 and wiring layers 12 is alternately laminated and different wiring layers 12 are electrically connected to each other by way of the vias 15 disposed in the insulation layer 11, as shown in FIG. 5. First electrodes 13 are disposed on one side of the insulation layer 11, second electrodes 14 are disposed on the opposite side of the insulation layer 11, and the exposed side surfaces of the second electrodes 14 are embedded so as to not be in contact with the insulation layer 11.

The material of the insulation layer 11 can be selected and used in the same manner as in the first embodiment described above. When a photosensitive organic material having a high pattern resolution is used as the material of the insulation layer 11, the openings formed in the insulation layer 11 for providing vias 15 can be photolithographically formed. Also, when a non-photosensitive organic material or a photosensitive organic material having a low pattern resolution is used as the material of the insulation layer 11, the openings formed in the insulation layer 11 for providing the vias 15 can be formed by laser machining, dry etching, blasting, or another method. Also, there is no need to form the vias in the insulation layer 11 in advance by a method in which an insulating film is formed after plating posts are formed in advance in the positions of the vias 15, and the surface of the insulating film is planed by polishing to expose the plated posts and to form vias 15. In the present embodiment, a photosensitive polyimide resin can be used as the material of the insulation layer 11, and the openings formed in the insulation layer 11 for providing the vias 15 at this point can be photolithographically formed.

The material and method for forming the wiring layer 12 are the same as in the first embodiment described above. In the present embodiment, the semi-additive method can be performed using, e.g., a sputtered film as the power supply layer.

The first electrodes 13 are disposed on the insulation layer 11 and are electrically connected to the wiring layer 12 by way of the vias 15. The first electrodes 13 can be electrodes in which a plurality of layers, for example, is laminated, and the material suitable for forming the surface of the first electrodes 13 is the same as in the first embodiment described above.

Although not depicted, a solder resist in a pattern having openings on the inner side of the first electrodes 13, or in a pattern having openings that do not make contact with the first electrodes 13, may be added to the top of the first electrodes 13. The structure may furthermore be one in which a solder resist pattern is formed and a first electrode pattern is then disposed so as to cover the openings. In the present embodiment, the first electrodes 13 can be formed by sequentially layering copper to a thickness of 5 μm, nickel to a thickness of 3 μm, and gold to a thickness of 0.5 μm, wherein gold is the topmost layer, for example.

The second electrodes 14 are embedded in the insulation layer 11 and are electrically connected to the wiring layer 12. The surface of the second electrodes 14 on the side opposite the surface that is in contact with the wiring layer 12 is exposed, and this surface is positioned in the same plane as the surface of the insulation layer 11 on the side opposite the surface on which the wiring layer 12 is formed. All or part of the side surfaces from among the exposed surfaces of the second electrodes 14 is structured so as to not be in contact with the insulation layer 11. When a connection that uses solder material is made in this structure, a gap needed for solder material to flow during reflow may be formed, and contact may be maintained at room temperature.

The second electrodes 14 can be formed by laminating a plurality of layers, for example, and the material and method that is suitable for forming the surface of the second electrodes 14 are the same as in the first embodiment described above. In the present embodiment, the second electrodes 14 can be formed by sequentially layering copper to a thickness of 5 μm, nickel to a thickness of 3 μm, and gold to a thickness of 0.5 μm, wherein gold is the topmost layer.

In addition to the effects obtained with the wiring board according to the first embodiment described above, the wiring board according to the present embodiment allows the power source, ground, signals, and other circuits of stripline structures, micro-stripline structures, and other structures to be optimized because the degree of freedom of design is increased by layering the insulation layers 11 and wiring layers 12.

Figure 6:
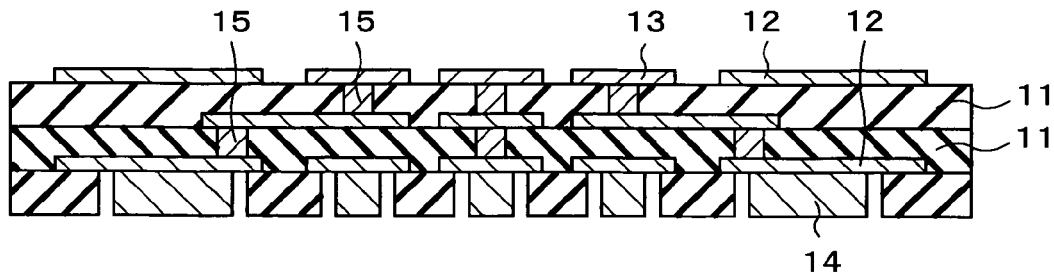
FIG. 6 is a schematic cross-sectional view showing a modified example of the wiring board according to the second embodiment of the present invention.

FIG. 6 is a schematic cross-sectional view showing a modified example of the wiring board according to the present embodiment. In FIG. 6, the same reference numerals are used for the same constituent elements as in FIGS. 1 to 5, and a description thereof is omitted. In relation to the configuration of the wiring board according to the second embodiment described above, the wiring board according to the modified example of the present embodiment has the same structure as the second embodiment except that a wiring layer 12 is disposed on the surface of the insulation layer 11 on which the first electrodes 13 are disposed. The diagram in FIG. 6 shows three insulation layers 11 and two wiring layers 12 laminated together, but no limitation is imposed by this configuration, and the insulation layers 11 and wiring layers 12 may have any required number of layers. The structure may also be one in which a plurality of insulation layers 11 and wiring layers 12 is laminated based on the structure shown in FIGS. 2 to 4 described above in the first embodiment. Described below is an example of a structure in which a plurality of insulation layers 11 and wiring layers 12 is laminated together based on the structure shown in FIG. 1.

A modified example of the present embodiment will be described in relation to the points that are different from the second embodiment described above. The material and method for forming the wiring layer 12 disposed on the surface of the insulation layer 11 on which the first electrodes 13 are disposed are the same as in the method for forming the wiring layer 12 of the first embodiment described above. The wiring layer 12 and first electrodes 13 may be simultaneously formed by patterning the same electroconductive film. In the present embodiment, the semi-additive method can be used as the method for forming the wiring layer 12 in which a sputtered film, for example, is used as the power supply layer.

In addition to the effects obtained with the wiring board according to the second embodiment described above, the wiring board according to the modified example of the present embodiment allows the wiring density to be increased above that of the wiring board according to the second embodiment by providing a wiring layer 12 on the surface of the insulation layer 11 on which the first electrodes 13 are disposed, and allows the electrical characteristics of the wiring board to be improved by disposing a ground circuit as a noise shield.

In the embodiments described above, capacitors that serve as circuit noise filters may be disposed in desired locations on the wiring boards. The dielectric material constituting the capacitors is preferably titanium oxide, tantalum oxide, $Al_2O_3$, $SiO_2$, $ZrO_2$, $HfO_2$, $Nb_2O_5$, or another metal oxide; BST ($Ba_xSr_{1-x}TiO_3$), PZT ($PbZr_xTi_{1-x}O_3$), PLZT ($Pb_{1-y}La_yZr_xTi_{1-x}O_3$), or another perovskite material; or $SrBi_2Ta_2O_9$ or another Bi-based layered compound. The above compounds satisfy the conditions $0 \leq x \leq 1$ and $0 < y < 1$. Also, an organic material or the like in which an inorganic material or a magnetic material is added may be used as the dielectric material constituting the capacitors.

The capacitors serving as circuit noise filters may be disposed by constituting the layer or plurality of layers of the insulation layer 11 with a material that has a dielectric constant of 9 or higher, and by forming opposing electrodes in the desired positions of the first electrodes 13, second electrodes 14, and wiring layer 12 positioned above and below the insulation layer. The dielectric material constituting the capacitors is preferably $Al_2O_3$, $ZrO_2$, $HfO_2$, $Nb_2O_5$, or another metal oxide; BST ($Ba_xSr_{1-x}TiO_3$), PZT ($PbZr_xTi_{1-x}O_3$), PLZT ($Pb_{1-y}La_yZr_xTi_{1-x}O_3$), or another perovskite material; or $SrBi_2Ta_2O_9$ or another Bi-based layered compound. The above compounds satisfy the conditions $0 \leq x \leq 1$ and $0 < y < 1$. Also, an organic material or the like to which an inorganic material or a magnetic material is added may be used as the dielectric material constituting the capacitors.

Figure 7:
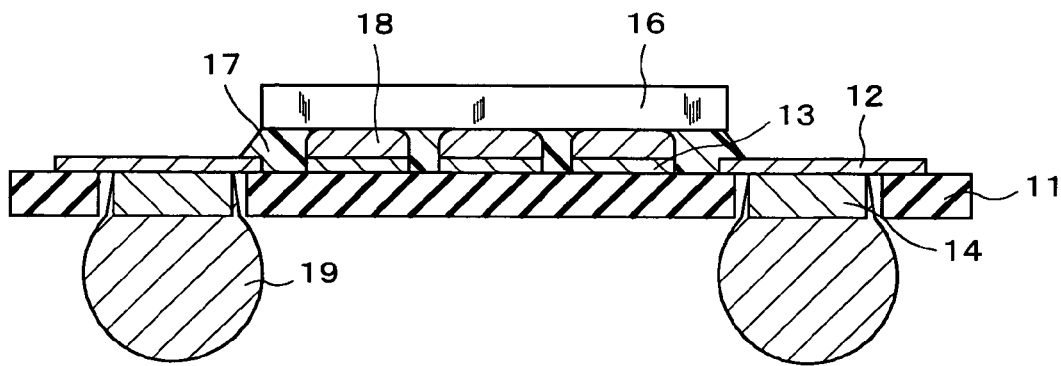
FIG. 7 is a schematic cross-sectional view showing an example of the semiconductor device according to the third embodiment of the present invention.

The third embodiment of the present invention is described next. FIG. 7 is a schematic cross-sectional view showing an example of the semiconductor device according to the present embodiment. In FIG. 7, the same reference numerals are used for the same constituent elements as in FIGS. 1 to 6, and a detailed description thereof is omitted. In the semiconductor device according to the present embodiment, a semiconductor element 16 is flip-chip connected by way of solder balls 18 to the first electrodes 13 of the wiring board. The board has a structure comprising an insulation layer 11, second electrodes 14 embedded in the insulation layer 11, and a wiring layer 12 and first electrodes 13 disposed on the insulation layer 11 and second electrodes 14, and the side surfaces from among the exposed surfaces of the second electrodes 14 are not in contact with the insulation layer 11. An underfill resin 17 is filled into the connection portion, and solder balls 19 are disposed on the second electrodes 14, as shown in FIG. 7. The semiconductor device according to the present embodiment is constituted in the manner described above.

The diagram in FIG. 7 shows the semiconductor element 16 mounted on the first electrodes 13 of the wiring board according to the present embodiment, and solder balls 19 disposed on the second electrodes 14, but no limitation is imposed by this configuration, and it is also possible to use any of the wiring boards of the first, second, and third modified examples of the first embodiment, as well as the second embodiment and the modified example of the second embodiment shown in FIGS. 2 to 6. The diagram in FIG. 7 shows a single mounted semiconductor element 16, but a plurality of semiconductor elements may be mounted, and capacitors, resistors, and other components may furthermore be mounted.

The material of the insulation layer 11 can be selected and used in the same manner as in the first embodiment described above. In the present embodiment, polyimide resin is used as the insulation layer 11, for example, and is formed to a thickness of 10 μm.

The material and method for forming the wiring layer 12 are the same as in the first embodiment described above.

The first electrodes 13 are disposed on the insulation layer 11 and second electrode 14, and are electrically connected by direct connection to the second electrodes 14, or are electrically connected to the second electrodes 14 by way of the wiring layer 12. The first electrodes 13 can be electrodes in which a plurality of layers, for example, is laminated, and the material suitable for forming the surface of the first electrodes 13 is the same as in the first embodiment described above.

Although not depicted, a solder resist in a pattern having openings on the inner side of the first electrodes 13, or in a pattern having openings that do not make contact with the first electrodes 13, may be added to the top of the first electrodes 13 and the wiring layer 12. The structure may furthermore be one in which a solder resist pattern is formed and a first electrode pattern is then disposed so as to cover the openings. The wiring layer 12 and first electrodes 13 may be simultaneously formed by patterning the same electroconductive film. In the present embodiment, the first electrodes 13 can be formed by sequentially layering copper to a thickness of 5 μm, nickel to a thickness of 3 μm, and gold to a thickness of 0.5 μm, wherein gold is the topmost layer, for example.

The second electrodes 14 are embedded in the insulation layer 11 and are electrically connected to the wiring layer 12 and first electrodes 13. The surface of the second electrodes 14 on the side opposite the surface that is in contact with the wiring layer 12 and first electrodes 13 is exposed to the exterior, and this surface is positioned in the same plane as the surface of the insulation layer 11 on the side opposite the surface on which the wiring layer 12 and first electrodes 13 are formed.

All or part of the side surface of the exposed surfaces of the second electrodes 14 is structured so as to not be in contact with the insulation layer 11. When a connection that uses solder material is made in this structure, a gap needed for solder material to flow during reflow may be formed, and contact may be maintained at room temperature. In the present embodiment, the second electrodes 14 can be formed by sequentially layering copper to a thickness of 5 μm, nickel to a thickness of 3 μm, and gold to a thickness of 0.5 μm, wherein gold is the topmost layer, for example.

The semiconductor element 16 has electrodes (not shown) formed on its surface, the electrodes (not shown) and the first electrodes 13 are electrically connected by way of solder balls 18, and an underfill resin 17 is filled into the space between the semiconductor element 16 and wiring board. The underfill resin 17 is used for the purpose of reducing the difference in the coefficient of thermal expansion in order to prevent the solder balls 18 from breaking due to the difference in the coefficient of thermal expansion between the wiring board and the semiconductor element 16. An underfill resin 17 is not required to be filled as long as the solder ball 18 has sufficient strength to ensure the desired reliability.

The solder balls 18 are micro-balls composed of solder material, and are formed by plating, ball transfer, or printing on the electrodes (not shown) of the semiconductor element 16. The material of the solder balls 18 may be suitably selected from a lead-tin eutectic solder or a lead-free solder material.

The underfill resin 17 is composed of an epoxy-based material and is filled after the semiconductor element 16 has been connected to the first electrodes 13 of the wiring board using the solder balls 18.

Solder balls 19 are attached to the second electrodes 14 in order for the semiconductor device according to the present embodiment to be mounted on another wiring board. The solder balls 19 are balls composed of solder material and are formed by ball transfer or printing on the second electrodes 14. Depending on the mode of attachment, metal pins may be soldered without attaching the solder balls 19 to the second electrodes 14. Even when metal pins are soldered, the connection reliability is good because the joining portion with the solder is also formed on the side surface of the second electrodes 14.

A frame in which the area of the semiconductor element 16 is opened may be separately attached when the rigidity of the wiring board is insufficient in areas in which the semiconductor element 16 of the semiconductor device according to the present embodiment is not mounted.

In the semiconductor device according to the present embodiment, the side surfaces of the second electrodes 14 are not in contact with the insulation layer 11. Therefore, a solder connection is also made on the side surfaces of the second electrodes 14. Connection reliability is thereby improved because the brittle metal diffusion layer at the connection boundary can be effectively prevented from being broken by the stress generated after the components, board, and the like have been connected, or by the stress primarily applied to the electrode surface in the horizontal direction.

Figure 8:
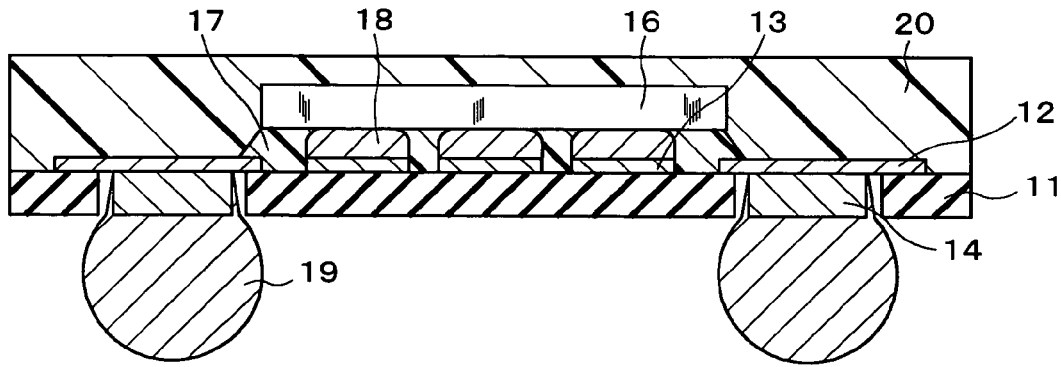
FIG. 8 is a schematic cross-sectional view showing an example of the semiconductor device according to the fourth embodiment of the present invention.

The fourth embodiment of the present invention is described next. FIG. 8 is a schematic cross-sectional view showing an example of the semiconductor device according to the present embodiment. In FIG. 8, the same reference numerals are used for the same constituent elements as in FIGS. 1 to 7, and a detailed description thereof is omitted. The semiconductor device according to the present embodiment has a structure in which a sealing resin 20 is disposed so as to cover the semiconductor element 16 in the semiconductor device according to the first embodiment described above.

The diagram in FIG. 8 shows the semiconductor element 16 mounted on the first electrodes 13 of the wiring board according to the first embodiment of the present invention shown in FIG. 1, and solder balls 19 disposed on the second electrodes 14, but no limitation is imposed by this configuration, and it is also possible to use any of the wiring boards of the first, second, and third modified examples of the first embodiment, as well as the second embodiment and the modified example of the second embodiment shown in FIGS. 2 to 6. The diagram in FIG. 8 furthermore shows a single mounted semiconductor element 16, but a plurality of semiconductor elements may be mounted, and capacitors, resistors, and other components may also be mounted. The present embodiment will be described in relation to the points that are different from the third embodiment described above.

The sealing resin 20 may be one comprising a material obtained by adding a silica filler to an epoxy-based material, and may be applied using the printing method, compression molding, or transfer molding in which a metal mold is used, so as to cover the mounted semiconductor element 16 and the connecting portions of the element. The diagram in FIG. 8 shows a structure in which the sealing resin 20 covers the entire surface of the wiring board on which the semiconductor element 16 is mounted, but the entire surface does not necessarily need to be covered, and the structure may be one in which the sealing resin 20 covers a part of the surface that includes the semiconductor element 16 and the connection portions of the element, and in which a part of the wiring board is exposed.

In addition to the effects obtained with the semiconductor device according to the third embodiment described above, the semiconductor element 16 in the semiconductor device according to the present embodiment can be protected because the semiconductor element 16 is covered by the sealing resin 20. Also, the rigidity of the entire semiconductor device can be improved by providing a sealing resin 20, and the reliability of the entire package can be improved as well.

Figure 9:
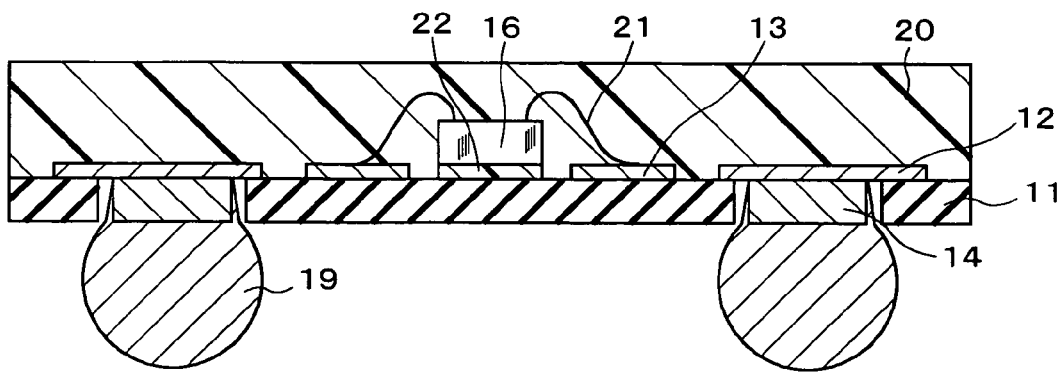
FIG. 9 is a schematic cross-sectional view showing an example of the semiconductor device according to the fifth embodiment of the present invention.

The fifth embodiment of the present invention is described next. FIG. 9 is a schematic cross-sectional view showing an example of the semiconductor device according to the present embodiment. In FIG. 9, the same reference numerals are used for the same constituent elements as in FIGS. 1 to 8, and a detailed description thereof is omitted. The semiconductor device according to the present embodiment has a structure in which the semiconductor element 16 in the semiconductor device according to the fourth embodiment described above is connected by wire bonding. The semiconductor device according to the present embodiment has a structure in which the surface of the semiconductor element 16 on which the circuitry is not formed is bonded with an adhesive 22 to the surface of the wiring board on which the first electrodes 13 are formed, and the electrodes (not shown) of the semiconductor element 16 and the first electrodes 13 are connected by bonding wires 21 and are covered with the sealing resin 20, as shown in FIG. 9.

The diagram in FIG. 9 shows an example in which the semiconductor element 16 is connected to the first electrodes 13 of the wiring board according to the first embodiment of the present invention shown in FIG. 1, and solder balls 19 are disposed on the second electrodes 14 to form the semiconductor device according to the present embodiment, but no limitation is imposed by this configuration, and it is also possible to use any of the wiring boards of the first, second, and third modified examples of the first embodiment, as well as the second embodiment and the modified example of the second embodiment shown in FIGS. 2 to 6. The diagram in FIG. 9 furthermore shows a single mounted semiconductor element 16, but a plurality of semiconductor elements may be mounted, and capacitors, resistors, and other components may also be mounted. The present embodiment will be described in relation to the points that are different from the third and fourth embodiments described above.

The adhesive 22 is applied to the surface of the semiconductor element 16 on which the circuitry is not disposed, and an organic material, or Ag paste or the like may be used.

A bonding wire 21 electrically connects the electrodes (not shown) of the semiconductor element 16 and the first electrodes 13, and a material primarily comprising gold can be used.

The diagram in FIG. 9 shows a structure in which the sealing resin 20 covers the entire surface of the wiring board on which the semiconductor element 16 is mounted, but the entire surface does not necessarily need to be covered, and the structure may be one in which the sealing resin 20 covers a part of the surface that includes the semiconductor element 16 and the connection portions of the element, and in which a part of the wiring board is exposed.

The effects obtained by the semiconductor device according to the present embodiment are the same as the effects obtained by the semiconductor device according to the fourth embodiment described above.

Figure 10:
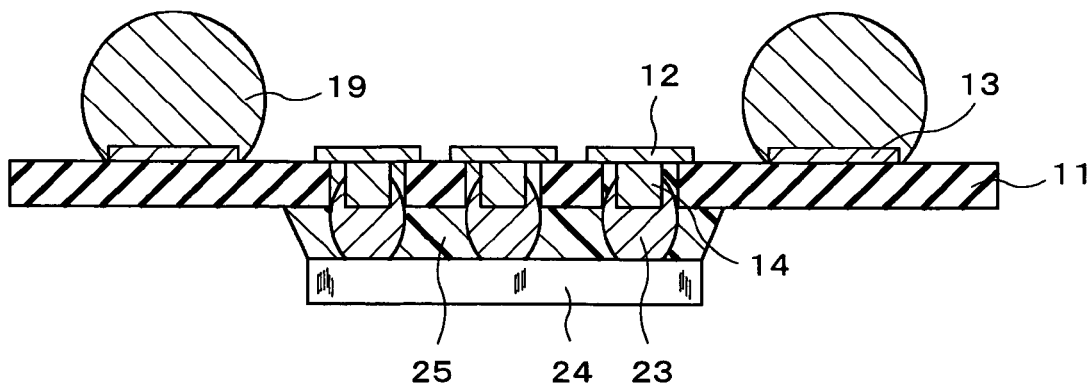
FIG. 10 is a schematic cross-sectional view showing an example of the semiconductor device according to the sixth embodiment of the present invention.

The sixth embodiment of the present invention is described next. FIG. 10 is a schematic cross-sectional view showing an example of the semiconductor device according to the present embodiment. In FIG. 10, the same reference numerals are used for the same constituent elements as in FIGS. 1 to 9, and a detailed description thereof is omitted. The semiconductor device according to the present embodiment has a structure in which a semiconductor element 24 is mounted on the second electrodes 14, rather than the first electrodes 13 in the semiconductor device according to the third embodiment described above.

The diagram in FIG. 10 shows an example in which the semiconductor element 24 is mounted on the second electrodes 14 of the wiring board according to the first embodiment of the present invention shown in FIG. 1, and solder balls 19 are disposed on the first electrodes 13 to form the semiconductor device according to the present embodiment, but no limitation is imposed by this configuration, and it is also possible to use any of the wiring boards of the first, second, and third modified examples of the first embodiment, as well as the second embodiment and the modified example of the second embodiment shown in FIGS. 2 to 6. The diagram in FIG. 10 furthermore shows a single mounted semiconductor element 24, but a plurality of semiconductor elements may be mounted, and capacitors, resistors, and other components may also be mounted. The present embodiment will be described in relation to the points that are different from the third embodiment described above.

The material of the insulation layer 11 can be selected and used in the same manner as in the first embodiment described above. In the present embodiment, polyimide resin is used as the insulation layer 11, for example, and is formed to a thickness of 10 μm.

The material and method for forming the wiring layer 12 are the same as in the first embodiment described above.

The first electrodes 13 are disposed on the insulation layer 11 and the second electrodes 14, and are electrically connected by direct connection to the second electrodes 14, or are electrically connected to the second electrodes 14 by way of the wiring layer 12. The first electrodes 13 can be electrodes in which a plurality of layers, for example, is laminated, and the material suitable for forming the surface of the first electrodes 13 is the same as in the first embodiment described above.

Although not depicted, a solder resist in a pattern having openings on the inner side of the first electrodes 13, or in a pattern having openings that do not make contact with the first electrodes 13, may be added to the top of the wiring layer 12 and first electrodes 13. The structure may furthermore be one in which a solder resist pattern is formed and a first electrode pattern is then disposed so as to cover the openings. The wiring layer 12 and first electrodes 13 may furthermore be simultaneously formed by patterning the same electroconductive film. In the present embodiment, the first electrodes 13 can be formed by sequentially layering copper to a thickness of 5 μm, nickel to a thickness of 3 μm, and gold to a thickness of 0.5 μm, wherein gold is the topmost layer, for example.

The second electrodes 14 are embedded in the insulation layer 11 and are electrically connected to the wiring layer 12 and the first electrodes 13. The surface of the second electrodes 14 on the side opposite the surface that is in contact with the wiring layer 12 and first electrodes 13 is exposed to the exterior, and this surface is positioned in the same plane as the surface of the insulation layer 11 on the side opposite the surface on which the wiring layer 12 and first electrodes 13 are formed.

The side surfaces from among the exposed surfaces of the second electrodes 14 are structured so as to partially or entirely not be in contact with the insulation layer 11. When a connection that uses solder material is made in this structure, a gap needed for solder material to flow during reflow may be formed, and contact may be maintained at room temperature. In the present embodiment, the second electrodes 14 can be formed by sequentially layering copper to a thickness of 5 μm, nickel to a thickness of 3 μm, and gold to a thickness of 0.5 μm, wherein gold is the topmost layer, for example.

The semiconductor element 24 has electrodes (not shown) formed on the surface of the element, the electrodes (not shown) and the second electrodes 14 are electrically connected by way of solder balls 23, and an underfill resin 25 is filled into the space between the semiconductor element 24 and wiring board. The underfill resin 25 is used for the purpose of reducing the difference in the coefficient of thermal expansion in order to prevent the solder balls 23 from breaking due to the difference in the coefficient of thermal expansion between the wiring board and the semiconductor element 24. An underfill resin 25 is not required to be filled as long as the solder balls 23 have sufficient strength to ensure the desired reliability.

The solder balls 23 are micro-balls composed of solder material, and are formed by plating, ball transfer, or printing on the electrodes (not shown) of the semiconductor element 24. The material of the solder balls 23 may be suitably selected from a lead-tin eutectic solder or a lead-free solder material.

The underfill resin 25 is composed of an epoxy-based material and is filled after the semiconductor element 24 has been connected to the second electrodes 14 of the wiring board using the solder balls 23.

The solder balls 19 are attached to the first electrodes 13 in order for the semiconductor device according to the present embodiment to be mounted on another wiring board. The solder balls 19 are balls composed of solder material and are formed by ball transfer or printing on the first electrodes 13. Depending on the mode of attachment, metal pins may be soldered without attaching the solder balls 19 to the first electrodes 13.

A frame in which the area of the semiconductor element 24 is opened may be separately attached when the rigidity of the wiring board is insufficient in areas in which the semiconductor element 24 of the semiconductor device according to the present embodiment is not mounted.

In the semiconductor device according to the present embodiment, the side surfaces of the second electrodes 14 are not in contact with the insulation layer 11. There is therefore a connection with the solder material on the side surfaces of the second electrodes 14 as well in the connection with the semiconductor element 24 by way of the solder balls 23, and the connection reliability is improved.

Figure 11:
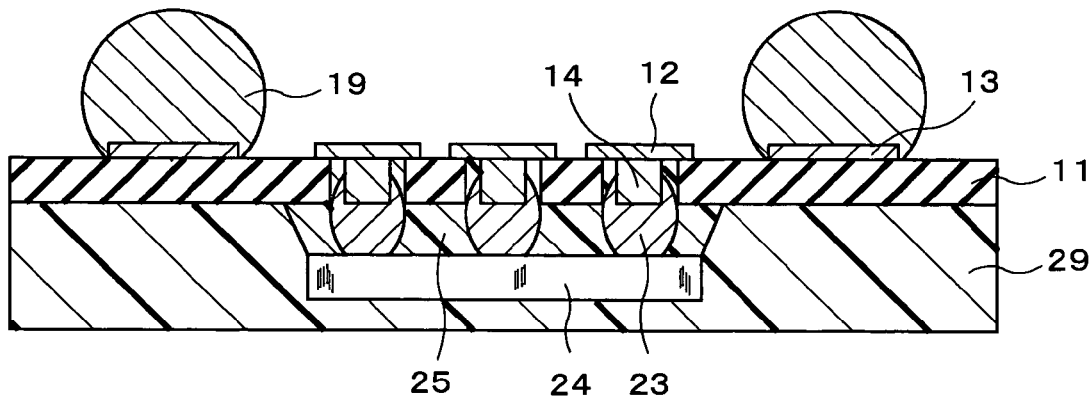
FIG. 11 is a schematic cross-sectional view showing an example of the configuration of the semiconductor device according to the seventh embodiment of the present invention.

The seventh embodiment of the present invention is described next. FIG. 11 is a schematic cross-sectional view showing an example of the semiconductor device according to the present embodiment. In FIG. 11, the same reference numerals are used for the same constituent elements as in FIGS. 1 to 10, and a detailed description thereof is omitted. The semiconductor device according to the present embodiment has a structure in which a sealing resin 29 is disposed so as to cover the semiconductor element 24 in the semiconductor device according to the sixth embodiment described above.

The diagram in FIG. 11 shows an example in which the semiconductor device 24 is mounted on the second electrodes 14 of the wiring board according to the first embodiment of the present invention shown in FIG. 1, and solder balls 19 disposed on the first electrodes 13, but no limitation is imposed by this configuration, and it is also possible to use any of the wiring boards of the first, second, and third modified examples of the first embodiment, as well as the second embodiment and the modified example of the second embodiment shown in FIGS. 2 to 6. The diagram in FIG. 11 furthermore shows a single mounted semiconductor element 24, but a plurality of semiconductor elements may be mounted, and capacitors, resistors, and other components may also be mounted. The present embodiment will be described in relation to the points that are different from the sixth embodiment described above.

The sealing resin 29 may be one comprising a material obtained by adding a silica filler to an epoxy-based material, and may be applied using the printing method, compression molding, or transfer molding in which a metal mold is used, so as to cover the mounted semiconductor element 24 and the connecting portions of the element. The diagram in FIG. 11 shows a structure in which the sealing resin 29 covers the entire surface of the wiring board on which the semiconductor element 24 is mounted, but the entire surface does not necessarily need to be covered, and the structure may be one in which the sealing resin 29 covers a part of the surface that includes the semiconductor element 24 and the connection portions of the element, and in which a part of the wiring board is exposed.

In addition to the effects obtained with the semiconductor device according to the sixth embodiment described above, the semiconductor element 24 in the semiconductor device according to the present embodiment can be protected because the semiconductor element 24 is covered by the sealing resin 29. Also, the rigidity of the entire semiconductor device can be improved by providing a sealing resin 29, and the reliability of the entire package can be improved as well.

Figure 12:
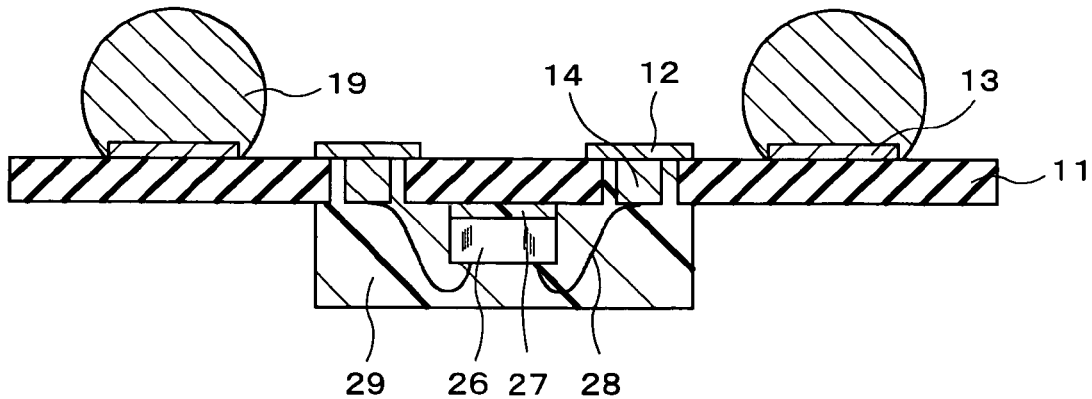
FIG. 12 is a schematic cross-sectional view showing an example of the semiconductor device according to the eighth embodiment of the present invention.

The eighth embodiment of the present invention is described next. FIG. 12 is a schematic cross-sectional view showing an example of the semiconductor device according to the present embodiment. In FIG. 12, the same reference numerals are used for the same constituent elements as in FIGS. 1 to 11, and a detailed description thereof is omitted. The semiconductor device according to the present embodiment has a structure in which the semiconductor element 26 in the semiconductor device according to the seventh embodiment described above is connected by wire bonding, and a part of the semiconductor element 26, including the connection portions of the element, is covered by the sealing resin 29. Specifically, the semiconductor device according to the present embodiment has a structure in which the surface of the semiconductor element 26 on which the circuitry is not formed is bonded with an adhesive 27 to the surface of the wiring board on which the second electrodes 14 of the wiring board are formed, the electrodes (not shown) of the semiconductor element 26 and the second electrodes 14 are connected by bonding wires 28, and a part of the semiconductor element 26, including the connection portions of the element, is covered by the sealing resin 29.

The diagram in FIG. 12 shows an example of the semiconductor device according to the present embodiment in which the semiconductor device 26 is connected to the second electrodes 14 of the wiring board according to the first embodiment of the present invention shown in FIG. 1, and solder balls 19 are disposed on the first electrodes 13, but no limitation is imposed by this configuration, and it is also possible to use any of the wiring boards of the first, second, and third modified examples of the first embodiment, as well as the second embodiment and the modified example of the second embodiment shown in FIGS. 2 to 6. The diagram in FIG. 12 furthermore shows a single mounted semiconductor element 26, but a plurality of semiconductor elements may be mounted, and capacitors, resistors, and other components may also be mounted. The present embodiment will be described in relation to the points that are different from the sixth and seventh embodiments described above.

The adhesive 27 is applied to the surface of the semiconductor element 26 on which the circuitry is not disposed, and an organic material, or Ag paste or the like may be used.

Bonding wires 28 electrically connect the electrodes (not shown) of the semiconductor element 26 and the second electrodes 14, and a material primarily comprising gold can be used.

The diagram in FIG. 12 shows a structure in which the sealing resin 29 covers a part of the surface of the wiring board on which the semiconductor element 26, including the semiconductor element 26, but the structure may be one in which the sealing resin 29 covers the entire surface of the wiring board on which the semiconductor element 26 is mounted.

The effects obtained by the semiconductor device according to the present embodiment are the same as the effects obtained by the semiconductor device according to the seventh embodiment described above.

Figure 13:
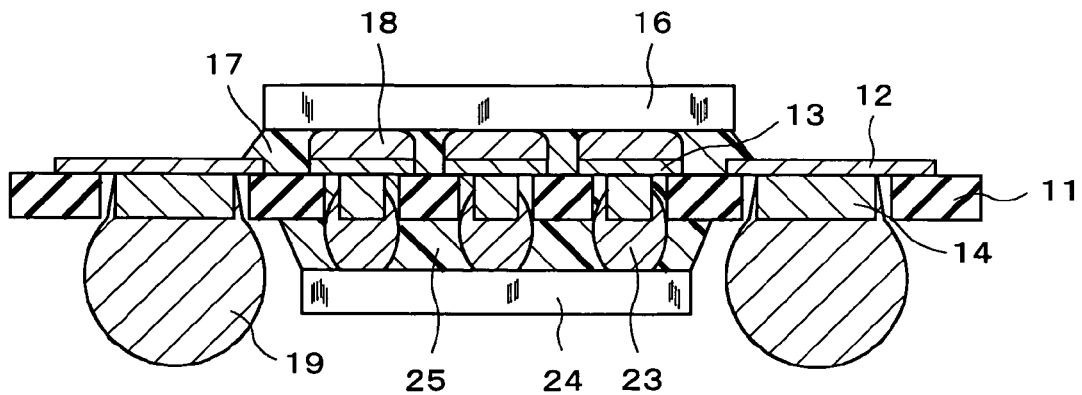
FIG. 13 is a schematic cross-sectional view showing an example of the semiconductor device according to the ninth embodiment of the present invention.

The ninth embodiment of the present invention is described next. FIG. 13 is a schematic cross-sectional view showing an example of the semiconductor device according to the present embodiment. In FIG. 13, the same reference numerals are used for the same constituent elements as in FIGS. 1 to 12, and a detailed description thereof is omitted. In the semiconductor device according to the present embodiment, a semiconductor element 16 is flip-chip connected by way of solder balls 18 to the first electrodes 13 of the wiring board. The board has a structure comprising an insulation layer 11, second electrodes 14 embedded in the insulation layer 11, and a wiring layer 12 and first electrodes 13 disposed on the insulation layer 11 and second electrodes 14, and the side surfaces from among the exposed surfaces of the second electrodes 14 are not in contact with the insulation layer 11. An underfill resin 17 is added to the connection portion, as shown in FIG. 13. The semiconductor element 24 is flip-chip connected to the second electrode 14 by way of the solder ball 23, underfill resin 25 is filled into the connection portions, and solder balls 19 are disposed on the other second electrodes 14. The semiconductor device according to the present embodiment is constituted in the manner described above.

The diagram in FIG. 13 shows an example in which the semiconductor element 16 is connected to the first electrodes 13, and the semiconductor element 24 is connected to the second electrodes 14 of the wiring board according to the first embodiment of the present invention shown in FIG. 1, and solder balls 19 are disposed on the other second electrodes 14 to form the semiconductor device according to the present embodiment, but no limitation is imposed by this configuration, and it is also possible to use any of the wiring boards of the first, second, and third modified examples of the first embodiment, as well as the second embodiment and the modified example of the second embodiment shown in FIGS. 2 to 6. The diagram in FIG. 13 furthermore shows a single semiconductor element mounted on the surfaces of the wiring board, but a plurality of semiconductor elements may be mounted, and capacitors, resistors, and other components may also be mounted.

The material of the insulation layer 11 can be selected and used in the same manner as in the first embodiment described above. In the present embodiment, polyimide resin is used as the insulation layer 11, for example, and is formed to a thickness of 10 μm.

The material and method for forming the wiring layer 12 are the same as in the first embodiment described above.

The first electrodes 13 are disposed on the insulation layer 11 and second electrodes 14, and are electrically connected by direct connection to the second electrodes 14, or are electrically connected to the second electrodes 14 by way of the wiring layer 12. The first electrodes 13 can be electrodes in which a plurality of layers, for example, is laminated, and the material suitable for forming the surface of the first electrodes 13 is the same as in the first embodiment described above.

Although not depicted, a solder resist in a pattern having openings on the inner side of the first electrodes 13, or in a pattern having openings that do not make contact with the first electrodes 13, may be added to the top of the wiring layer 12 and first electrodes 13. The structure may furthermore be one in which a solder resist pattern is formed and a first electrode pattern is then disposed so as to cover the openings. The wiring layer 12 and first electrodes 13 may be simultaneously formed by patterning the same electroconductive film. In the present embodiment, the first electrodes 13 can be formed by sequentially layering copper to a thickness of 5 μm, nickel to a thickness of 3 μm, and gold to a thickness of 0.5 μm, wherein gold is the topmost layer, for example.

The second electrodes 14 are embedded in the insulation layer 11 and are electrically connected to the wiring layer 12 and first electrodes 13. The surface of the second electrodes 14 on the side opposite the surface that is in contact with the wiring layer 12 and first electrodes 13 is exposed to the exterior, and this surface is positioned in the same plane as the surface of the insulation layer 11 on the side opposite the surface on which the wiring layer 12 and first electrodes 13 are formed.

All or part of the side surface of the exposed surfaces of the second electrodes 14 is structured so as to not be in contact with the insulation layer 11. When a connection that uses solder material is made in this structure, a gap needed for solder material to flow during reflow may be formed, and contact may be maintained at room temperature. In the present embodiment, the second electrodes 14 can be formed by sequentially layering copper to a thickness of 5 µm, nickel to a thickness of 3 µm, and gold to a thickness of 0.5 µm, wherein gold is the topmost layer, for example.

The semiconductor element 16 has electrodes (not shown) formed on the surface of the element, the electrodes (not shown) and the first electrodes 13 are electrically connected by way of solder balls 18, and an underfill resin 17 is filled into the space between the semiconductor element 16 and wiring board. The underfill resin 17 is used for the purpose of reducing the difference in the coefficient of thermal expansion in order to prevent the solder balls 18 from breaking due to the difference in the coefficient of thermal expansion between the wiring board and the semiconductor element 16. An underfill resin 17 is not required to be filled as long as the solder balls 18 have sufficient strength to ensure the desired reliability.

The material and method for forming the solder balls 18 are the same as in the third embodiment described above.

The underfill resin 17 is composed of an epoxy-based material and is filled after the semiconductor element 16 has been connected to the first electrodes 13 of the wiring board using the solder balls 18.

The semiconductor element 24 has electrodes (not shown) formed on the surface of the element, the electrodes (not shown) and the second electrodes 14 are electrically connected by way of solder balls 23, and an underfill resin 25 is filled into the space between the semiconductor element 24 and wiring board. The underfill resin 25 is used for the purpose of reducing the difference in the coefficient of thermal expansion in order to prevent the solder balls 23 from breaking due to the difference in the coefficient of thermal expansion between the wiring board and the semiconductor element 24. An underfill resin 25 is not required to be filled as long as the solder balls 23 have sufficient strength to ensure the desired reliability.

The material and method for forming the solder balls 23 are the same as in the sixth embodiment described above.

The underfill resin 25 is composed of an epoxy-based material and is filled after the semiconductor element 24 has been connected using the solder balls 23.

The solder balls 19 are attached to the second electrodes 14 in order for the semiconductor device according to the present embodiment to be mounted on another wiring board. The solder balls 19 are balls composed of solder material and are formed by ball transfer or printing on the second electrodes 14. Depending on the mode of attachment, metal pins may be soldered without attaching the solder balls 19 to the second electrodes 14. Even when metal pins are soldered, the connection reliability is good because the joining portion with the solder is also formed on the side surfaces of the second electrodes 14. The diagram in FIG. 13 shows an example in which the solder balls 19 are attached to the second electrodes 14, but no limitation is imposed by this configuration, and it is also possible to attach the solder balls 19 to the first electrodes 13.

A frame in which the area of the semiconductor element 16 is opened may be separately attached when the rigidity of the wiring board is insufficient in areas in which the semiconductor element 16 of the semiconductor device according to the present embodiment is not mounted.

In the semiconductor device according to the present embodiment, there are solder connections on the side surfaces as well because the side surfaces of the second electrodes 14 are not in contact with the insulation layer 11, and the connection reliability is improved.

Figure 14:
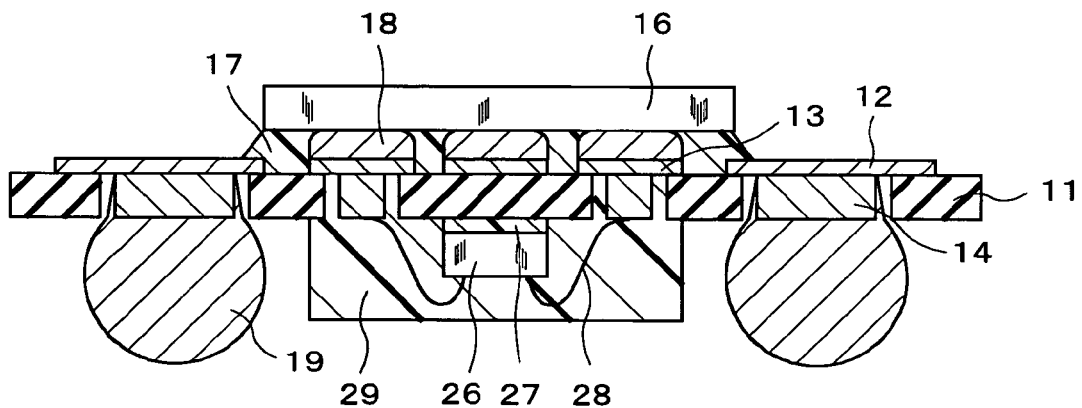
FIG. 14 is a schematic cross-sectional view showing an example of the semiconductor device according to the tenth embodiment of the present invention.

The tenth embodiment of the present invention is described next. FIG. 14 is a schematic cross-sectional view showing an example of the semiconductor device according to the present embodiment. In FIG. 14, the same reference numerals are used for the same constituent elements as in FIGS. 1 to 13, and a detailed description thereof is omitted. The semiconductor device according to the present embodiment has a structure in which wire bonding is used to connect the semiconductor element mounted on the second electrodes 14 in the semiconductor device according to the ninth embodiment described above. Specifically, in the semiconductor device according to the present embodiment, a semiconductor element 16 is flip-chip connected by way of solder balls 18 to the first electrode 13 of the wiring board, as shown in FIG. 14. The board has a structure comprising an insulation layer 11, second electrodes 14 embedded in the insulation layer 11, and a wiring layer 12 and first electrodes 13 disposed on the insulation layer 11 and second electrodes 14, and the side surfaces from among the exposed surfaces of the second electrodes 14 are not in contact with the insulation layer 11. An underfill resin 17 is added to the connection portion. The surface of the semiconductor element 26 on which the circuitry is not formed is bonded using adhesive 27 to the surface of the wiring board on which the second electrodes 14 are formed, the electrodes (not shown) of the semiconductor element 26 and the second electrodes 14 are connected by bonding wires 28, and a part of the semiconductor element 26, including the connection portions of the element, is covered by the sealing resin 29. Solder balls 19 are also disposed on the other second electrodes 14. The semiconductor device according to the present embodiment is constituted in the manner described above.

The diagram in FIG. 14 shows an example in which the semiconductor element 16 is connected to the first electrodes 13, and the semiconductor element 26 is connected to the second electrodes 14 of the wiring board according to the first embodiment of the present invention shown in FIG. 1, and solder balls 19 are disposed on the other second electrodes 14 to form the semiconductor device according to the present embodiment, but no limitation is imposed by this configuration, and it is also possible to use any of the wiring boards of the first, second, and third modified examples of the first embodiment, as well as the second embodiment and the modified example of the second embodiment shown in FIGS. 2 to 6. The diagram in FIG. 14 furthermore shows an example in which a single semiconductor element is mounted on the surfaces of the wiring board, but a plurality of semiconductor elements may be mounted, and capacitors, resistors, and other components may also be mounted. The present embodiment will be described in relation to the points that are different from the ninth embodiment described above.

The adhesive 27 is applied to the surface of the semiconductor element 26 on which the circuitry is not disposed, and an organic material, or Ag paste or the like may be used.

Bonding wires 28 electrically connect the electrodes (not shown) of the semiconductor element 26 and the second electrodes 14, and a material primarily comprising gold can be used.

The diagram in FIG. 14 shows a structure in which the sealing resin 29 covers a portion of the surface of the wiring board on which the semiconductor element 26 is mounted, but the structure may be one in which the sealing resin 29 covers the entire surface of the wiring board on which the semiconductor element 26 is mounted. In this case, the structure is one in which the solder balls 19 are attached to the first electrodes 13.

In addition to the effects obtained with the semiconductor device according to the ninth embodiment described above, the semiconductor element 26 in the semiconductor device according to the present embodiment can be protected because the semiconductor element 26 is covered by the sealing resin 29. Also, the rigidity of the entire semiconductor device can be improved by providing a sealing resin 29, and the reliability of the entire package can be improved as well.

Figure 15:
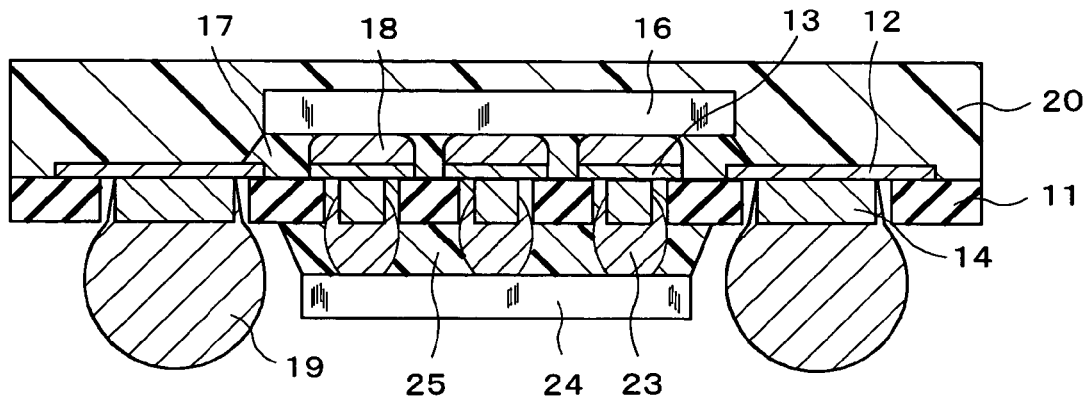
FIG. 15 is a schematic cross-sectional view showing an example of the semiconductor device according to the eleventh embodiment of the present invention.

The eleventh embodiment of the present invention is described next. FIG. 15 is a schematic cross-sectional view showing an example of the semiconductor device according to the present embodiment. In FIG. 15, the same reference numerals are used for the same constituent elements as in FIGS. 1 to 14, and a detailed description thereof is omitted. The semiconductor device according to the present embodiment has a structure in which a sealing resin 20 is applied so as to cover the semiconductor element 16 in the semiconductor device according to the ninth embodiment described above.

The diagram in FIG. 15 shows an example in which the semiconductor element 16 is connected to the first electrodes 13, and the semiconductor element 26 is connected to the second electrodes 14 of the wiring board according to the first embodiment of the present invention shown in FIG. 1, and solder balls 19 are disposed on the other second electrode 14 to form the semiconductor device according to the present embodiment, but no limitation is imposed by this configuration, and it is also possible to use any of the wiring boards of the first, second, and third modified examples of the first embodiment, as well as the second embodiment and the modified example of the second embodiment shown in FIGS. 2 to 6. The diagram in FIG. 14 furthermore shows an example in which a single semiconductor element is mounted on the surfaces of the wiring board, but a plurality of semiconductor elements may be mounted, and capacitors, resistors, and other components may also be mounted. The present embodiment will be described in relation to the points that are different from the ninth embodiment described above.

The sealing resin 20 may be one comprising a material obtained by adding a silica filler to an epoxy-based material, and may be applied using the printing method, compression molding, or transfer molding in which a metal mold is used, so as to cover the mounted semiconductor element 16 and the connecting portions of the element. The diagram in FIG. 15 shows a structure in which the sealing resin 20 covers the entire surface of the wiring board on which the semiconductor element 16 is mounted, but the entire surface does not necessarily need to be covered, and the structure may be one in which the sealing resin 20 covers a part of the surface that includes the semiconductor element 16 and the connection portions of the element, and in which a part of the wiring board is exposed.

In addition to the effects obtained with the semiconductor device according to the ninth embodiment described above, the semiconductor element 16 in the semiconductor device according to the present embodiment can be protected because the semiconductor element 16 is covered by the sealing resin 20. Also, the rigidity of the entire semiconductor device can be improved by providing a sealing resin 20, and the reliability of the entire package can be improved as well.

Figure 16:
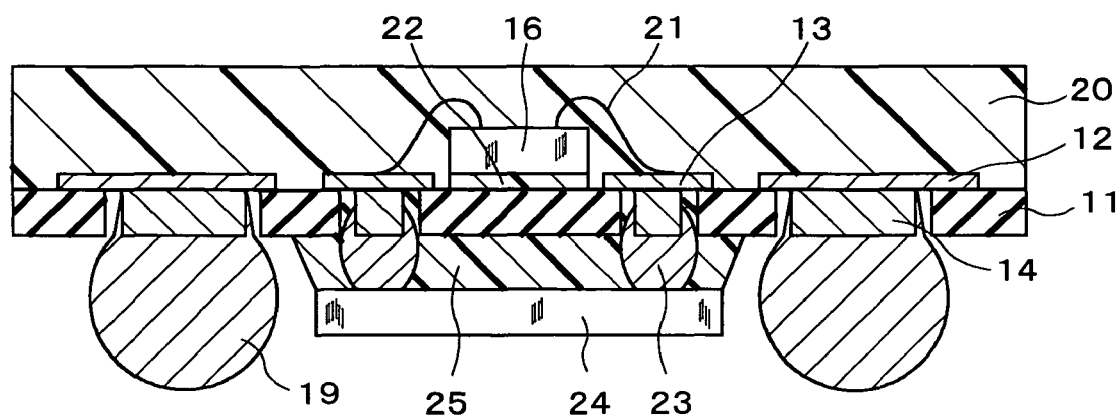
FIG. 16 is a schematic cross-sectional view showing an example of the semiconductor device according to the twelfth embodiment of the present invention.

The twelfth embodiment of the present invention is described next. FIG. 16 is a schematic cross-sectional view showing an example of the semiconductor device according to the present embodiment. In FIG. 16, the same reference numerals are used for the same constituent elements as in FIGS. 1 to 15, and a detailed description thereof is omitted. The semiconductor device according to the present embodiment has a structure in which the semiconductor element 16 in the semiconductor device according to the eleventh embodiment described above is connected by wire bonding. The semiconductor device according to the present embodiment has a structure in which the surface of the semiconductor element 16 on which the circuitry is not formed is bonded with an adhesive 22 to the surface of the wiring board on which the first electrode 13 is formed, and the electrodes (not shown) of the semiconductor element 16 and the first electrodes 13 are connected by bonding wires 21 and are covered with the sealing resin 20, as shown in FIG. 16. The semiconductor element 24 is flip-chip connected to the second electrodes 14 by way of solder balls 23, the underfill resin 25 is filled into the connection portions, and solder balls 19 are disposed on the other second electrodes 14. The semiconductor device according to the present embodiment is constituted in the manner described above.

The diagram in FIG. 16 shows an example in which the semiconductor element 16 is connected to the first electrodes 13, and the semiconductor element 26 is connected to the second electrodes 14 of the wiring board according to the first embodiment of the present invention shown in FIG. 1, and solder balls 19 are disposed on the other second electrodes 14 to form the semiconductor device according to the present embodiment, but no limitation is imposed by this configuration, and it is also possible to use any of the wiring boards of the first, second, and third modified examples of the first embodiment, as well as the second embodiment and the modified example of the second embodiment shown in FIGS. 2 to 6. The diagram in FIG. 16 furthermore shows an example in which a single semiconductor element is mounted on the surfaces of the wiring board, but a plurality of semiconductor elements may be mounted, and capacitors, resistors, and other components may also be mounted. The semiconductor element 24 mounted on side that faces the second electrodes 14 may be connected by wire bonding in the same manner as in the tenth embodiment described above. The present embodiment will be described in relation to the points that are different from the tenth and eleventh embodiments described above.

The adhesive 22 is applied to the surface of the semiconductor element 16 on which the circuitry is not disposed, and an organic material, or Ag paste or the like may be used.

Bonding wires 21 electrically connect the electrodes (not shown) of the semiconductor element 16 and the first electrodes 13, and a material primarily comprising gold can be used.

The diagram in FIG. 16 shows a structure in which the sealing resin covers the entire surface of the wiring board on which the semiconductor element 16 is mounted, but the entire surface does not necessarily need to be covered, and the structure may be one in which the sealing resin 20 covers a part of the surface that includes the semiconductor element 16 and the connection portions of the element, and in which a part of the wiring board is exposed.

The effects obtained by the semiconductor device according to the present embodiment are the same as the effects obtained by the semiconductor device according to the eleventh embodiment described above.

The thirteenth embodiment of the present invention will be described next. The present embodiment involves a method for manufacturing the wiring board according to the first embodiment described above. FIGS. 17A to 17G are schematic cross-sectional views showing, as a sequence of steps, an example of a method for manufacturing the wiring board according to the first embodiment of the present invention shown in FIG. 1. In FIG. 17, the same reference numerals are used for the same constituent elements as in FIGS. 1 to 16, and a detailed description thereof is omitted. Washing and heating treatments are suitably carried out between each step.

Figure 17A:
FIGS. 17A to 17G are schematic cross-sectional views showing an example of the method for manufacturing a wiring board according to the thirteenth embodiment of the present invention.

First, a support board 30 is prepared and the surface is wet washed, dry washed, smoothed, roughened, or subjected to other treatments as required (step 1), as shown in FIG. 17A. The support board 30 is an electroconductive material or a material coated with an electroconductive film on the surface, and preferably has adequate rigidity. Materials that can be used include silicon, sapphire, GaAs, or another semiconductor wafer material; or metal, quartz, glass, ceramic, printed board, or the like. Specifically, the support board 30 may be one in which a release layer (not shown) and an electroconductive seed metal layer (not shown) are sequentially disposed on a silicon wafer that has a thickness of 0.725 mm and a diameter of 8 inches (200 mm) and is provided with a thermal oxidation layer, for example.

Figure 17B:
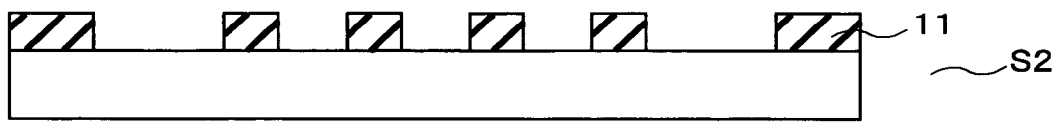

Next, an insulation layer 11 is formed so that the portions in which second electrodes 14 will be formed are opened (step 2), as shown in FIG. 17B. In the case that an electroconductive film is formed on the support board 30, the insulation layer 11 is disposed on the electroconductive film. The material of the insulation layer 11 can be selected and used in the same manner as in the first embodiment described above. When a photosensitive organic material having a high pattern resolution is used as the material of the insulation layer 11, the openings formed in the insulation layer 11 for forming second electrodes 14 can be photolithographically formed. Also, when a non-photosensitive organic material or a photosensitive organic material having a low pattern resolution is used as the material of the insulation layer 11, the openings formed in the portions of the insulation layer 11 in which the second electrodes 14 are to be formed can be formed by laser machining, dry etching, blasting, or another method. In the present embodiment, a photosensitive polyimide resin, for example, is used as the material of the insulation layer 11, and the insulation layer 11 can be formed to a thickness of 7 µm. In this case, the openings formed in the portions of the insulation layer 11 in which the second electrodes 14 are to be formed may be formed by photolithography.

Figure 17C:
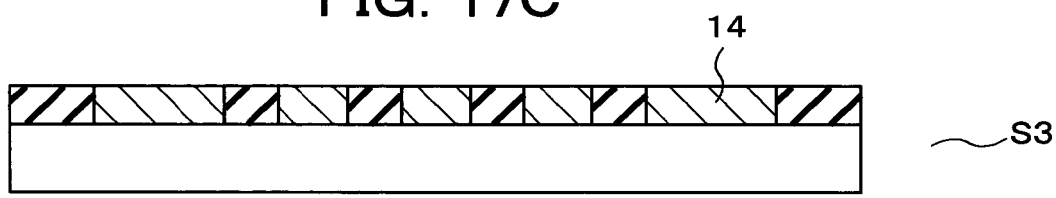

The second electrodes 14 are subsequently formed in the openings of the insulation layer 11 (step 3), as shown in FIG. 17C. The second electrodes 14 can be formed by one or a plurality of metal layers, and the metal constituting the metal layer can be primarily selected from copper, nickel, gold, silver or another material, or an alloy or the like. In the case that an electroconductive film is formed on the support board 30, the second electrodes 14 can be formed by electrolytic plating, electroless plating, printing, vapor deposition, or another method using the insulation layer 11 formed on the electroconductive film as a mask. The diagram in FIG. 17C shows the state in which the second electrodes 14 are formed to the same thickness as the insulation layer 11, but no limitation is imposed by this configuration, and the wiring board according to the first modified example of the first embodiment of the present invention shown in FIG. 2 can be obtained by making the thickness of the second electrodes 14 to be less than the thickness of the insulation layer 11. In the present embodiment, the second electrodes 14 can be formed to the same thickness as the insulation layer 11 by layering copper to a thickness of 2 µm and nickel to a thickness of 5 µm in order from the support board 30 by feeding power from the seed metal layer (not shown) formed on the support board 30, for example.

Figure 17D:
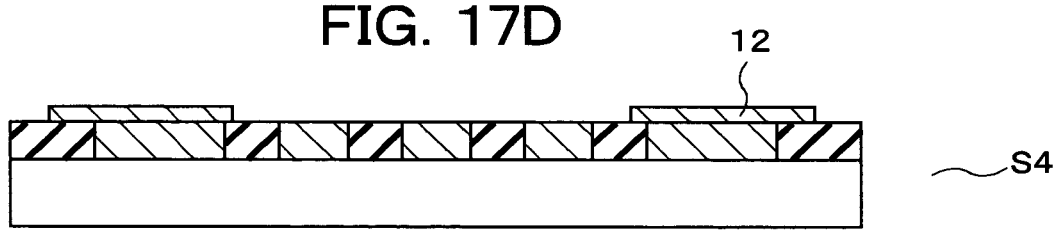

Next, a wiring layer 12 is formed on the second electrodes 14 and insulation layer 11 (step 4), as shown in FIG. 17D. The material and method for forming the wiring layer 12 are the same as in the first embodiment described above. In the present embodiment, the semi-additive method can be performed using, e.g., a sputtered film as the power supply layer.

Figure 17E:
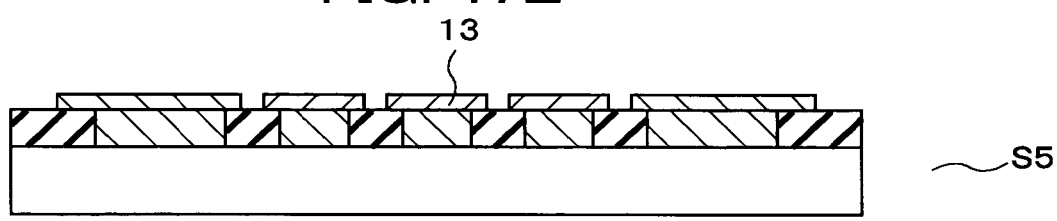

First electrodes 13 are subsequently formed on the insulation layer 11 and second electrodes 14 (step 5), as shown in FIG. 17E. The first electrodes 13 are disposed on the insulation layer 11 and the second electrodes 14, and are electrically connected by direct connection to the second electrodes 14, or are electrically connected to the second electrodes 14 by way of the wiring layer 12. The first electrodes 13 can be electrodes in which a plurality of layers, for example, is laminated, and the material suitable for forming the surface of the first electrodes 13 is the same as in the first embodiment described above. The first electrodes 13 can be formed by the subtractive, semi-additive, and fully additive methods described above in the same manner as the wiring layer 12. Although not depicted, a solder resist may be added in a pattern having openings on the inner side of the first electrodes 13, or in a pattern having openings that do not make contact with the first electrodes 13. The structure may furthermore be one in which a solder resist pattern is formed and a first electrode pattern is then disposed so as to cover the openings. The wiring layer 12 and first electrodes 13 may be simultaneously formed by patterning the same electroconductive film. In the present embodiment, the first electrodes 13 can be formed by sequentially layering copper to a thickness of 5 µm, nickel to a thickness of 3 µm, and gold to a thickness of 0.5 µm by the semi-additive method, for example, wherein gold is the topmost layer.

Figure 17F:

Next, the support board 30 is removed (step 6) as shown in FIG. 17F. The method for removing the support board 30 may be comprise grinding, chemical and mechanical polishing, etching, or another method, or a combination of these methods. After the support board 30 has been ground off, the remaining portion may be removed by chemical and mechanical polishing and/or etching. Etching may be dry etching or wet etching, but when the final removal step is dry etching, the seed metal layer can be stably left behind because the etching selection ratio can be set to a high value. Removal of the support board 30 can furthermore be facilitated if a release layer is disposed between the support board 30 and the seed metal layer. If a material that thermally decomposes is used as the release layer, the seed metal layer and the support board 30 can be separated by heating the layer to the thermal decomposition temperature or higher in the step for removing the support board 30. In this case, heating is preferably carried out using a laser or another method for providing localized heating. The release layer alone can be locally heated by setting the wavelength of the laser to a level at which the light passes through the support board 30 but does not pass through the release layer. Apart from this method, it is also possible to select in advance a material whose adhesive strength weakens at the boundary between the support board 30 and the release layer or at the boundary between the release layer and the seed metal layer, and to apply mechanical force to peel away the support board 30. By selecting as the release layer a material that dissolves in a specific solution or a material whose adhesion to the seed metal layer or the support board 30 is dramatically reduced when permeated by a solution, it is possible to allow a solution to permeate the material via the surface facing the release layer and to then peel away the support board 30. In the present embodiment, a release layer (not shown) that has low adhesiveness and is formed between the silicon and seed metal layers (not shown) is used, for example, and after the release layer has been peeled away, the seed metal layer (not shown) can be removed by etching.

Figure 17G:

Next, the second electrodes 14 and insulation layer 11 are reliably separated (step 7) as shown in FIG. 17G. The separation of the second electrodes 14 and insulation layer 11 can be carried out by wet etching or dry etching. In this case, etching is not necessarily required as long as a gap needed for solder material to flow during reflow is formed between the insulation layer 11 and the second electrodes 14 when the solder material is reflowed without etching. In the etching step, the wiring board according to the second modified example of the first embodiment described above can be fabricated by primarily etching the second electrodes 14, and the wiring board according to the third modified example of the first embodiment described above can be fabricated by primarily etching the insulation layer 11. After etching has been completed, the surfaces of the second electrodes 14 may be treated by electrolytic plating, electroless plating, vapor deposition, printing, inkjet deposition, dipping, or another method so as to form the surfaces of the second electrodes 14 from at least one metal or an alloy selected from the group consisting of gold, silver, copper, tin, and solder materials. In the present embodiment, a gold film can be formed by electroless plating on the exposed copper surfaces of the second electrodes 14, for example.

In accordance with the present embodiment, the wiring board according to the first embodiment of the present invention and the wiring boards according to the first to third modified examples of the first embodiment can be efficiently fabricated. Stable wire formation is made possible by using a support board 30 in the steps, and future high-density and precision wire formation can be achieved. Since the thickness of the wiring board can furthermore be minimized by removing the support board 30 after wiring formation, the inductance can be reduced and electrical loss can be suppressed. Also, the support board 30 can be reused and the costs reduced by peeling away the support board 30 in the removal step.

The fourteenth embodiment of the present invention will be described next. The present embodiment is an embodiment of another method for manufacturing the wiring board according to the first embodiment described above. FIGS. 18A to 18H are schematic cross-sectional views showing, as a sequence of steps, an example of another method for manufacturing the wiring board according to the first embodiment of the present invention shown in FIG. 1. In FIG. 18, the same reference numerals are used for the same constituent elements as in FIGS. 1 to 17, and a detailed description thereof is omitted. Washing and heating treatments are suitably carried out between each step.

Figure 18A:
FIGS. 18A to 18H are schematic cross-sectional views showing an example of the method for manufacturing a wiring board according to the fourteenth embodiment of the present invention.

First, a support board 30 is prepared, and the surface is wet washed, dry washed, smoothed, roughened, or subjected to other treatments as required (step 1), as shown in FIG. 18A. The same material as that in the thirteenth embodiment described above can be used as the material of the support board 30. In the present embodiment, the support board 30 may be one in which a release layer (not shown) and an electroconductive seed metal layer (not shown) are sequentially disposed on a silicon wafer that has a thickness of 0.725 mm and a diameter of 8 inches (200 mm) and is provided with a thermal oxidation layer, for example.

Figure 18B:
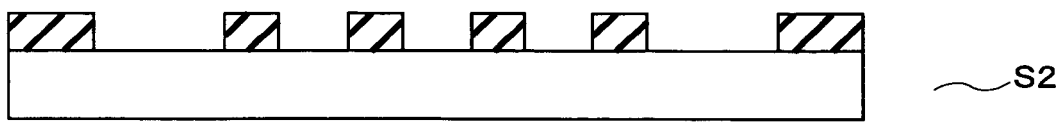

Next, an insulation layer 11 is formed so that the portions in which second electrodes 14 will be formed are opened (step 2), as shown in FIG. 18B. The insulation layer 11 and the openings formed in the insulation layer 11 can be formed by the same method as in step 2 of the method for manufacturing a wiring board according to the thirteenth embodiment of the present invention described above.

Figure 18C:
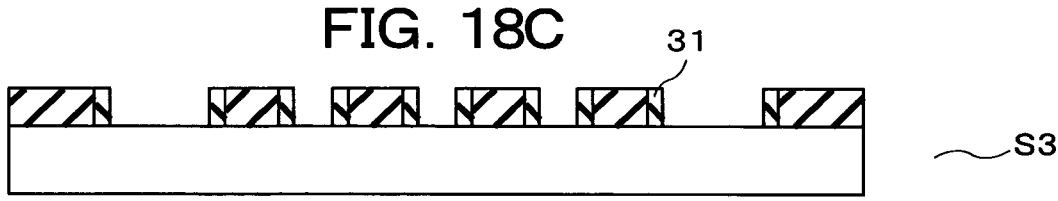

An insulating film 31 that is more easily removed by wet etching or dry etching than is the insulation layer 11 is formed on the side walls of the insulation layer 11 (step 3), as shown in FIG. 18C. The insulating film 31 can be formed from a photosensitive or non-photosensitive organic material, for example, and examples of the organic material that may be used include epoxy resin, epoxy acrylate resin, urethane acrylate resin, polyester resin, phenolic resin, polyimide resin, BCB, PBO, polynorbornene resin, and the like. Examples of the inorganic material that can be used include silicon oxide, silicon nitride, silicon oxynitride, silicon carbide, low-k material, alumina, alumina nitride, glass ceramic, or the like. When a photosensitive organic material having a high pattern resolution is used as the material of the insulating film 31, the openings formed in the insulation layer 11 can be filled with the organic material, and the openings in the portions in which the second electrodes 14 will be formed can be formed by photolithography. Also, when a non-photosensitive organic material or a photosensitive organic material having a low pattern resolution is used as the material of the insulating film 31, the openings formed in the insulation layer 11 can be filled with the organic material, and the openings can be formed in the portions in which the second electrodes 14 will be formed by laser machining, dry etching, blasting, or another method. When an insulating film 31 is formed on the surface of the insulation layer 11, the insulating film 31 can be formed only on the side walls of the openings by removing the insulating film 31 formed on the surface of the insulation layer 11 by etching or polishing. Also, in the diagram shown in FIG. 18C, an insulating film 31 is formed on the side walls of the openings of the insulation layer 11, but if there are no problems in reliability and in later steps, the insulating film 31 may be formed so as to cover the surface of the insulation layer 11 as well. In the present embodiment, a photosensitive epoxy resin is used, for example, as the material of the insulating film 31, and the openings can be formed by photolithography.

Figure 18D:
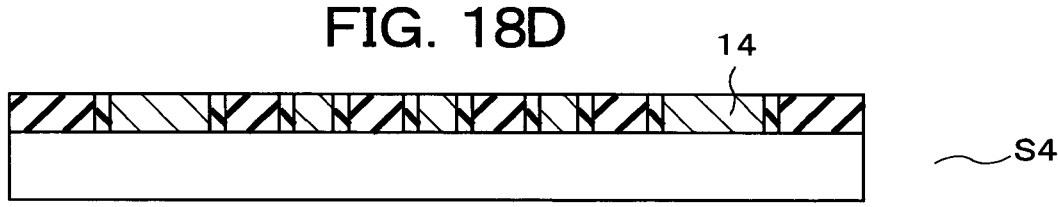

Next, the second electrodes 14 are formed in the openings in the insulation layer 11 on whose side walls the insulating film 31 is formed (step 4), as shown in FIG. 18D. The material and method for forming the second electrodes 14 are the same as in step 3 of the method for manufacturing a wiring board according to the thirteenth embodiment described above. The diagram in FIG. 18D shows the state in which the second electrodes 14 are formed to the same thickness as the insulation layer 11, but no limitation is imposed by this configuration, and the wiring board according to the first modified example of the first embodiment of the present invention shown in FIG. 2 can be obtained by making the thickness of the second electrodes 14 to be less than the thickness of the insulation layer 11. In the present embodiment, the second electrodes 14 can be formed to the same thickness as the insulation layer 11 by layering copper to a thickness of 2 μm and nickel to a thickness of 5 μm in order from the support board 30 by feeding power from the seed metal layer (not shown) formed on the support board 30, for example.

Figure 18E:
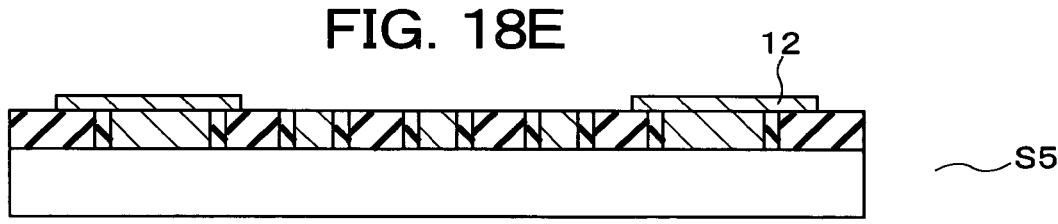

Next, the wiring layer 12 is formed on the insulation layer 11 and second electrodes 14 (step 5), as shown in FIG. 18E.

The material and method for forming the wiring layer 12 are the same as in the first embodiment described above. In the present embodiment, the semi-additive method can be performed using, e.g., a sputtered film as the power supply layer.

Figure 18F:
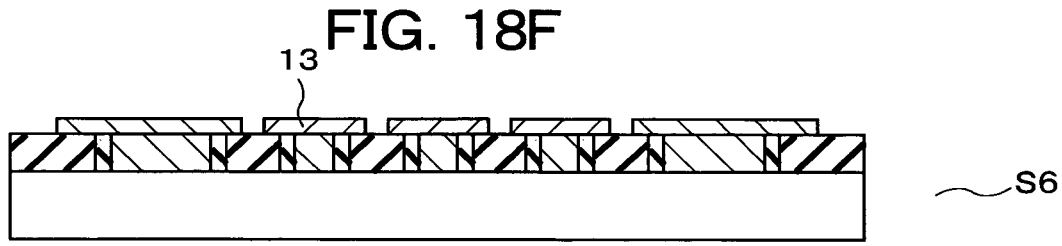

Next, the first electrodes 13 are formed on the insulation layer 11 and second electrodes 14 (step 6), as shown in FIG. 18F. The first electrodes 13 are disposed on the insulation layer 11 and second electrodes 14, and are electrically connected by direct connection to the second electrodes 14, or are electrically connected to the second electrodes 14 by way of the wiring layer 12. The material and method for forming the first electrodes 13 are the same as in step 5 of the method for manufacturing a wiring board according to the thirteenth embodiment described above. In the present embodiment, the first electrodes 13 can be formed by sequentially layering copper to a thickness of 5 μm, nickel to a thickness of 3 μm, and gold to a thickness of 0.5 μm by the semi-additive method, for example, wherein gold is the topmost layer.

Figure 18G:
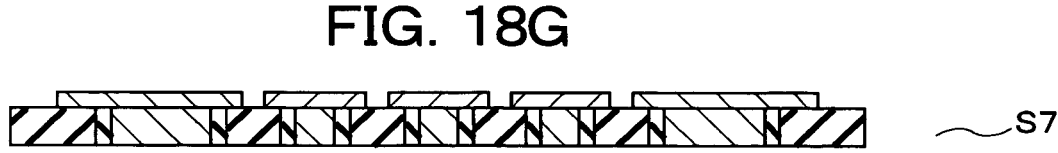

Next, the support board 30 is removed (step 7) as shown in FIG. 18G. The method for removing the support board 30 is the same as in step 6 of the method for manufacturing a wiring board according to the thirteenth embodiment described above. In the present embodiment, a release layer (not shown) that has low adhesiveness and is formed between the silicon and seed metal layers (not shown) is used, for example, and after the release layer has been peeled away, the seed metal layer (not shown) can be removed by etching.

Figure 18H:

Next, the second electrodes 14 and insulation layer 11 are reliably separated (step 8) as shown in FIG. 18H. The separation of the second electrodes 14 and insulation layer 11 can be carried out by wet etching or dry etching the insulating film 31 or the second electrodes 14. In this case, etching is not necessarily required as long as a gap needed for solder material to flow during reflow is formed between the insulation layer 11 and the second electrodes 14 when the solder material is reflowed without etching. In the etching step, the wiring board according to the second modified example of the first embodiment described above can be fabricated by primarily etching the second electrodes 14, and the wiring board according to the third modified example of the first embodiment described above can be fabricated by primarily etching the insulating film 31 and insulation layer 11. After etching has been completed, the surfaces of the second electrodes 14 may be treated by electrolytic plating, electroless plating, vapor deposition, printing, inkjet deposition, dipping, or another method so as to form the surfaces of the second electrodes 14 from at least one metal or an alloy selected from the group consisting of gold, silver, copper, tin, and solder materials. In the present embodiment, a gold film can be formed by electroless plating on the exposed copper surfaces of the second electrodes 14, for example.

In accordance with the present embodiment, the wiring board according to the first embodiment of the present invention and the wiring boards according to the first to third modified examples of the first embodiment can be efficiently fabricated. Other effects of the present embodiment are the same as those in the thirteenth embodiment described above.

The fifteenth embodiment of the present invention will be described next. The present embodiment is an embodiment of yet another method for manufacturing the wiring board according to the first embodiment described above. FIGS. 19A to 19H are schematic cross-sectional views showing, as a sequence of steps, an example of yet another method for manufacturing the wiring board according to the first embodiment of the present invention shown in FIG. 1. In FIG. 19, the same reference numerals are used for the same constituent elements as in FIGS. 1 to 18, and a detailed description thereof is omitted. Washing and heating treatments are suitably carried out between each step.

Figure 19A:
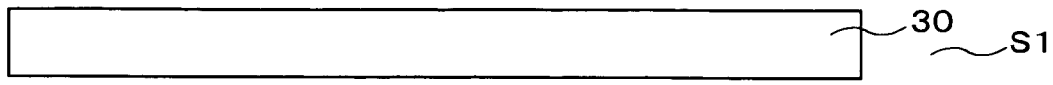
FIGS. 19A to 19H are schematic cross-sectional views showing an example of the method for manufacturing a wiring board according to the fifteenth embodiment of the present invention.
Figure 19B:
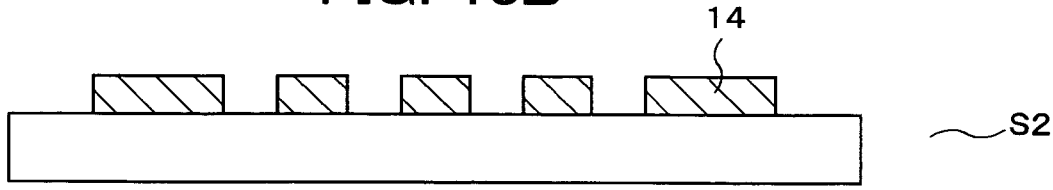

First, a support board 30 is prepared, and the surface is wet washed, dry washed, smoothed, roughened, or subjected to other treatments as required (step 1), as shown in FIG. 19A. The same material as that in the thirteenth embodiment described above can be used as the material of the support board 30. In the present embodiment, the support board 30 may be one in which a release layer (not shown) and an electroconductive seed metal layer (not shown) are sequentially disposed on a silicon wafer that has a thickness of 0.725 mm and a diameter of 8 inches (200 mm) and is provided with a thermal oxidation layer, for example.

Next, the second electrodes 14 are formed on the support board 30 by the subtractive, semi-additive, and fully additive method, or another method, as described above (step 2), as shown in FIG. 19B. The second electrodes 14 can be formed from one or a plurality of metal layers, and the metal constituting the metal layers can be primarily selected from copper, nickel, gold, silver or another material, or an alloy or the like. In the present embodiment, the second electrodes 14 can be formed by layering copper to a thickness of 2 μm and nickel to a thickness of 5 μm in order from the support board 30 by feeding power from the electroconductive seed metal layer using the semi-additive method, for example.

Figure 19C:
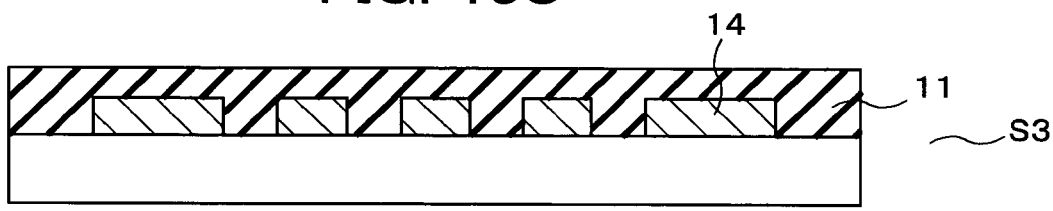

Next, the insulation layer 11 is formed on the surface on which the second electrodes 14 are formed is formed so as to cover the second electrodes 14 (step 3), as shown in FIG. 19C. The material of the insulation layer 11 can be selected and used in the same manner as in the first embodiment described above. In the present embodiment, non-photosensitive polyimide resin is used as the material of the insulation layer 11, for example, and the insulation layer 11 can be formed to a thickness of 10 μm.

Figure 19D:
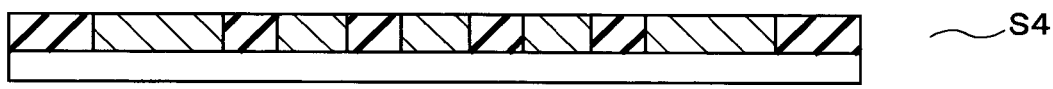

Next, the surface of the insulation layer 11 is removed so as to expose the surface of the second electrodes 14, which are covered by the insulation layer 11, on the side opposite the surface in contact with the support board 30 (step 4), as shown in FIG. 19D. Removal can be carried out by wet etching, dry etching, belt sanding, buff polishing, parallel-plate polishing, CMP (Chemical Mechanical Polish), grinding, or dividing at a desired position by using a water cutter or a slicer. Also, the surface of the second electrodes 14 on the side opposite the surface that is in contact with the support board 30 may be exposed from the insulation layer 11 by partially machining the insulation layer 11 with the aid of a laser, dry etching, or wet etching. In the present embodiment, the second electrodes 14 are exposed using the CMP method, for example.

Figure 19E:
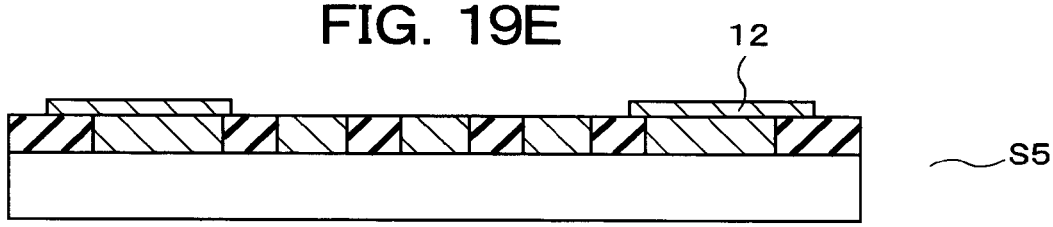

Next, the wiring layer 12 is formed on the second 5 electrodes 14 and insulation layer 11 (step 5), as shown in FIG. 19E. The material and method for forming the wiring layer 12 are the same as in the first embodiment described above. In the present embodiment, the semi-additive method may be used in which the sputtering layer is used as the power supply layer, for example.

Figure 19F:
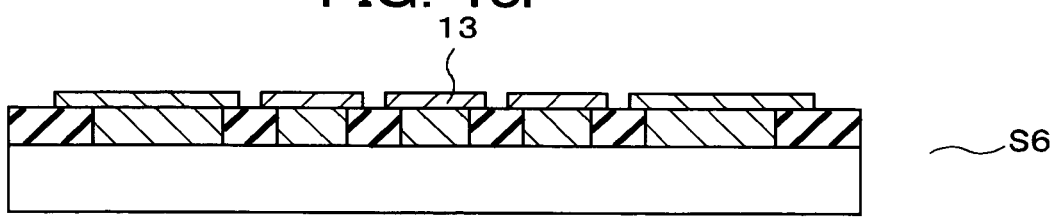

Next, the first electrodes 13 are formed on the insulation layer 11 and second electrodes 14 (step 6), as shown in FIG. 19F. The first electrodes 13 are disposed on the insulation layer 11 and second electrodes 14, and are electrically connected by direct connection to the second electrodes 14, or are electrically connected to the second electrodes 14 by way of the wiring layer 12. The material and method for forming the first electrodes 13 are the same as in step 5 of the method for manufacturing a wiring board according to the thirteenth embodiment described above. In the present embodiment, the first electrodes 13 can be formed by sequentially layering copper to a thickness of 5 μm, nickel to a thickness of 3 μm, and gold to a thickness of 0.5 μm by the semi-additive method, for example, wherein gold is the topmost layer.

Figure 19G:
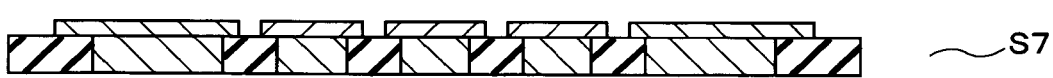

Next, the support board 30 is removed (step 7) as shown in FIG. 19G. The method for removing the support board 30 is the same as in step 6 of the method for manufacturing a wiring board according to the thirteenth embodiment described above. In the present embodiment, a release layer (not shown) that has low adhesiveness and is formed between the silicon and seed metal layers (not shown) is used, for example, and after the release layer has been peeled away, the seed metal layer (not shown) can be removed by etching.

Figure 19H:
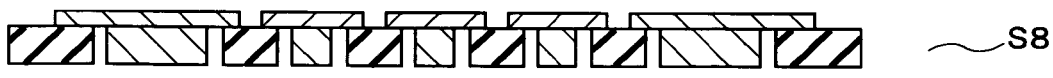

Next, the second electrodes 14 and insulation layer 11 are reliably separated (step 8) as shown in FIG. 19H. The separation of the second electrodes 14 and insulation layer 11 can be carried out by wet etching or dry etching. In this case, etching is not necessarily required as long as a gap needed for solder material to flow during reflow is formed between the insulation layer 11 and the second electrodes 14 when the solder material is reflowed without etching. In the etching step, the wiring board according to the second modified example of the first embodiment described above can be fabricated by primarily etching the second electrodes 14, and the wiring board according to the third modified example of the first embodiment described above can be fabricated by primarily etching the insulation layer 11. After etching has been completed, the surfaces of the second electrodes 14 may be treated by electrolytic plating, electroless plating, vapor deposition, printing, inkjet deposition, dipping, or another method so as to form the surfaces of the second electrodes 14 from at least one metal or an alloy selected from the group consisting of gold, silver, copper, tin, and solder materials. In the present embodiment, a gold film can be formed by electroless plating on the exposed copper surfaces of the second electrodes 14, for example.

In accordance with the present embodiment, the wiring board according to the first embodiment of the present invention and the wiring boards according to the first to third modified examples of the first embodiment can be efficiently fabricated. Other effects of the present embodiment are the same as those in the thirteenth embodiment described above.

The sixteenth embodiment of the present invention will be described next. The present embodiment is an embodiment of another method for manufacturing the wiring board according to the first embodiment described above. FIGS. 20A to 20H are schematic cross-sectional views showing, as a sequence of steps, an example of a method for manufacturing the wiring board according to the first embodiment of the present invention shown in FIG. 4. In FIG. 20, the same reference numerals are used for the same constituent elements as in FIGS. 1 to 19, and a detailed description thereof is omitted. Washing and heating treatments are suitably carried out between each step.

Figure 20A:
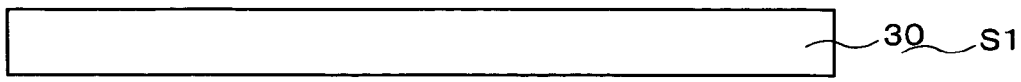
FIGS. 20A to 20H are schematic cross-sectional views showing an example of the method for manufacturing a wiring board according to the sixteenth embodiment of the present invention.

First, a support board 30 is prepared, and the surface is wet washed, dry washed, smoothed, roughened, or subjected to other treatments as required (step 1), as shown in FIG. 20A. The same material as that in the thirteenth embodiment described above can be used as the material of the support board 30. In the present embodiment, the support board 30 may be one in which a release layer (not shown) and an electroconductive seed metal layer (not shown) are sequentially disposed on a silicon wafer that has a thickness of 0.725 mm and a diameter of 8 inches (200 mm) and is provided with a thermal oxidation layer, for example.

Figure 20B:
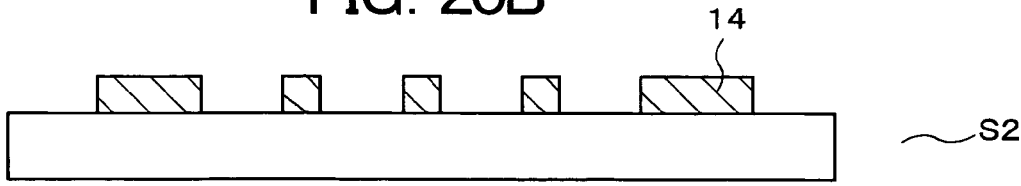

Next, the second electrodes 14 are formed on the support board 30 (step 2), as shown in FIG. 20B. The material and method for forming the second electrodes 14 are the same as in step 2 of the method for manufacturing a wiring board according to the fifteenth embodiment described above. In the present embodiment, the second electrodes 14 can be formed by using, e.g., the electroconductive seed metal layer as a power supply layer, feeding power from the support board 30, and using the semi-additive method to layer copper to a thickness of 3 μm and nickel to a thickness of 5 μm in order from the support board 30.

Figure 20C:
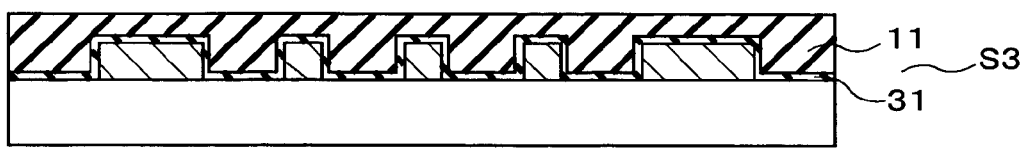

Next, an insulating film 31 that is more easily removed than the insulation layer 11 by wet etching or dry etching is formed so as to cover the second electrodes 14 on the surface on which the second electrodes 14 are formed, and the insulation layer 11 is subsequently formed from above (step 3), as shown in FIG. 20C. The material of the insulating film 31 can be selected and used in the same manner as in the fourteenth embodiment described above, and the material of the insulation layer 11 can be selected and used in the same manner as in the first embodiment described above. In the present embodiment, an epoxy resin as the insulating film 31 is formed to a thickness of 2 μm, for example, and a non-photosensitive polyimide resin as the insulation layer 11 can be formed to a thickness of 8 μm.

Figure 20D:

Next, the surface of the insulating film 31 and the insulation layer 11 is removed so as to expose the surface of the second electrodes 14, which are covered by the insulation layer 11 and the insulating film 31, on the side opposite the surface in contact with the support board 30 (step 4), as shown in FIG. 20D. The insulation layer 11 and insulating film 31 can be removed by using the same removal method as in step 4 of the method for manufacturing a wiring board according to the fifteenth embodiment described above. In the present embodiment, the second electrodes 14 can be exposed using the CMP method, for example.

Figure 20E:
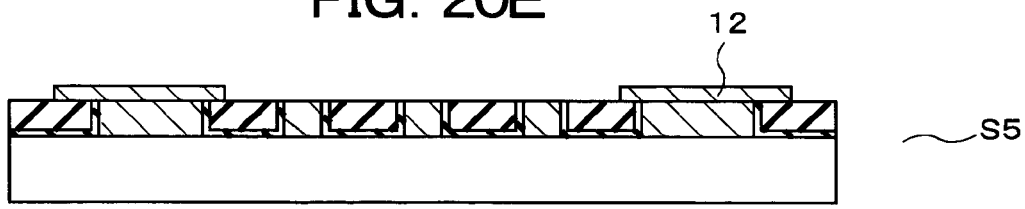

Next, the wiring layer 12 is formed on the second electrodes 14 and the insulation layer 11 (step 5), as shown in FIG. 20E. The material and method for forming the wiring layer 12 are the same as in the first embodiment described above. In the present embodiment, the semi-additive method can be performed using, e.g., a sputtered film as the power supply layer.

Figure 20F:
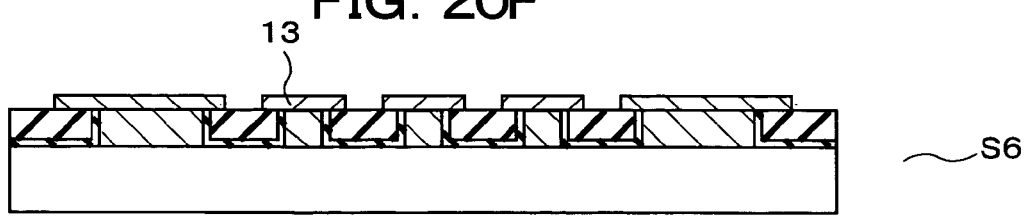

Next, the first electrodes 13 are formed on the insulation layer 11 and second electrodes 14 (step 6), as shown in FIG. 20F. The first electrodes 13 are disposed on the insulation layer 11 and second electrodes 14, and are electrically connected by direct connection to the second electrodes 14, or are electrically connected to the second electrodes 14 by way of the wiring layer 12. The material and method for forming the first electrodes 13 are the same as in step 5 of the method for manufacturing a wiring board according to the thirteenth embodiment described above. In the present embodiment, the first electrodes 13 can be formed by sequentially layering copper to a thickness of 5 μm, nickel to a thickness of 3 μm, and gold to a thickness of 0.5 μm by the semi-additive method, for example, wherein gold is the topmost layer.

Figure 20G:
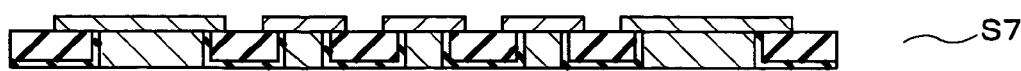

Next, the support board 30 is removed (step 7) as shown in FIG. 20G. The method for removing the support board 30 is the same as in step 6 of the method for manufacturing a wiring board according to the thirteenth embodiment described above. In the present embodiment, a release layer (not shown) that has low adhesiveness and is formed between the silicon and seed metal layers (not shown) is used, for example, and after the release layer has been peeled away, the seed metal layer (not shown) can be removed by etching.

Figure 20H:
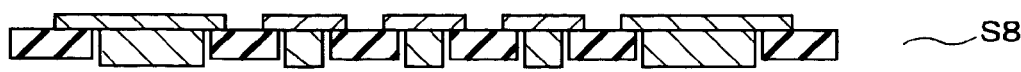

Next, the second electrodes 14 and insulation layer 11 are reliably separated (step 8) as shown in FIG. 20H. The separation of the second electrodes 14 and insulation layer 11 can be carried out by etching the insulating film 31 or the second electrodes 14 using wet etching or dry etching. In this case, etching is not necessarily required as long as a gap needed for solder material to flow during reflow is formed between the insulating film 31 and the second electrodes 14 when the solder material is reflowed without etching. In the etching step, the wiring board according to the second modified example of the first embodiment described above can be fabricated by primarily etching the second electrodes 14, and the wiring board according to the third modified example of the first embodiment described above can be fabricated by primarily etching the insulating film 31. After etching has been completed, the surfaces of the second electrodes 14 may be treated by electrolytic plating, electroless plating, vapor deposition, printing, inkjet deposition, dipping, or another method so as to form the surfaces of the second electrodes 14 from at least one metal or an alloy selected from the group consisting of gold, silver, copper, tin, and solder materials. In the present embodiment, a gold film can be formed by electroless plating on the exposed copper surfaces of the second electrodes 14, for example.

In accordance with the present embodiment, the wiring board according to the first embodiment of the present invention and the wiring boards according to the first to third modified examples of the first embodiment can be efficiently fabricated. Other effects of the present embodiment are the same as those in the thirteenth embodiment described above.

The seventeenth embodiment of the present invention will be described next. The present embodiment is an embodiment of a method for manufacturing the wiring board according to the second embodiment described above. FIGS. 21A to 21H are schematic cross-sectional views showing, as a sequence of steps, an example of a method for manufacturing the wiring board according to the second embodiment of the present invention shown in FIG. 2. In FIG. 21, the same reference numerals are used for the same constituent elements as in FIGS. 1 to 20, and a detailed description thereof is omitted. Washing and heating treatments are suitably carried out between each step.

Figure 21A:
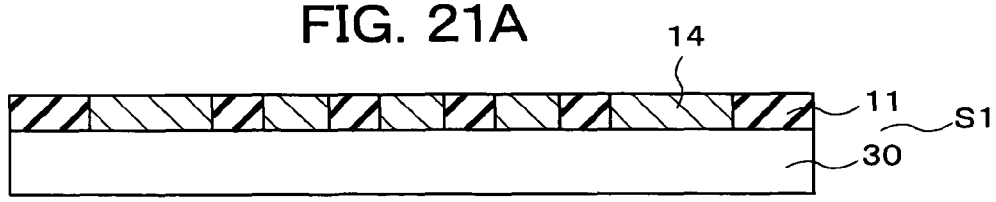
FIGS. 21A to 21G are schematic cross-sectional views showing an example of the method for manufacturing a wiring board according to the seventeenth embodiment of the present invention.

The present embodiment is described based on the state in which the second electrodes 14 and insulation layer 11 are formed on the support board 30, and the surfaces of the second electrodes 14 that are not in contact with the support board 30 are exposed (step 1) in the method for manufacturing a wiring board according to the thirteenth to sixteenth embodiments described above. The diagram in FIG. 21A shows the state of step 3 of the above-described thirteenth embodiment shown in FIG. 17C, or step 4 of the above-described fifteenth embodiment shown in FIG. 19D. However, no limitation is imposed thereby, and it is possible to carry out steps that are subsequent to the state of step 4 of the above-described fourteenth embodiment shown in FIG. 18D or to the state of step 4 of the above-described sixteenth embodiment shown in FIG. 20D. In the present embodiment, the support board 30 may be one in which a release layer (not shown) and an electroconductive seed metal layer (not shown) are sequentially disposed on a silicon wafer that has a thickness of 0.725 mm and a diameter of 8 inches (200 mm) and is provided with a thermal oxidation layer, for example. The insulation layer 11 is formed to a thickness of 7 μm from a photosensitive polyimide resin, and the second electrodes 14 are formed to the same thickness as the insulation layer 11 by layering copper to a thickness of 2 μm and nickel to a thickness of 5 μm in order from the support board 30 by feeding power from the seed metal layer (not shown) formed on the support board 30.

Figure 21B:
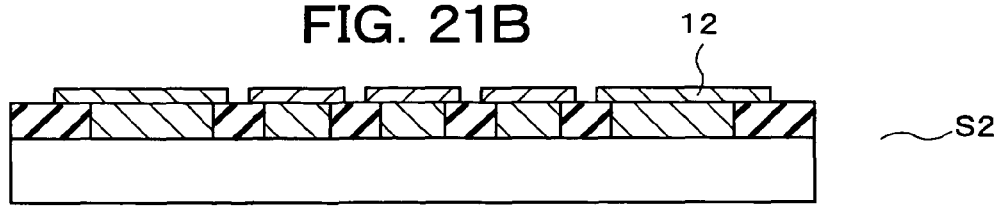

Next, a wiring layer 12 is formed on the second electrodes 14 and insulation layer 11 (step 2), as shown in FIG. 21B. The material and method for forming the wiring layer 12 are the same as in the first embodiment described above. In the present embodiment, the semi-additive method can be performed using, e.g., a sputtered film as the power supply layer.

Figure 21C:
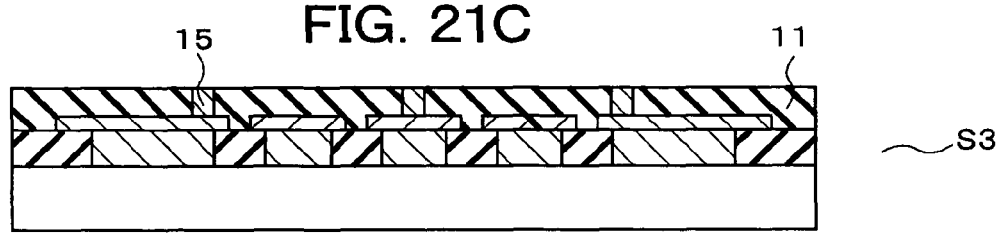

Next, the insulation layer 11 is formed so as to cover the wiring layer 12, and vias are formed in the insulation layer 11 in order to electrically connect the wiring layer 12 and another wiring layer 12 that is to be formed on the insulation layer 11 (step 3), as shown in FIG. 21C. The material of the insulation layer 11 can be selected and used in the same manner as in the first embodiment described above. When a photosensitive organic material having a high pattern resolution is used as the material of the insulation layer 11, the openings formed in the insulation layer 11 for providing vias can be photolithographically formed. Also, when a non-photosensitive organic material or a photosensitive organic material having a low pattern resolution is used as the material of the insulation layer 11, the openings formed in the insulation layer 11 for providing vias can be formed by laser machining, dry etching, blasting, or another method. Also, there is no need to form openings in the insulation layer 11 in advance by a method in which an insulating film is formed after plating posts are formed in advance in the positions of the vias 15, and the surface of the insulating film is planed by polishing to expose the plated posts and to form vias 15. In the present embodiment, a photosensitive polyimide resin is used as the material of the insulation layer 11, and the insulation layer 11 can be formed to a thickness of 8 μm. In this case, the openings formed in the insulation layer 11 for providing vias can be formed by photolithography.

Figure 21D:
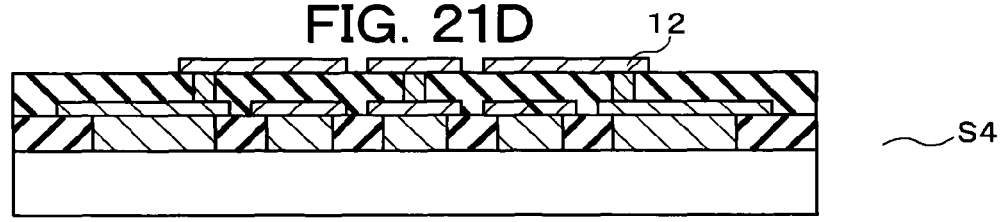

Next, the wiring layer 12 is formed on the vias and insulation layer 11 (step 4), as shown in FIG. 21D. The material and method for forming the wiring layer 12 are the same as in the step 2 described above.

Figure 21E:
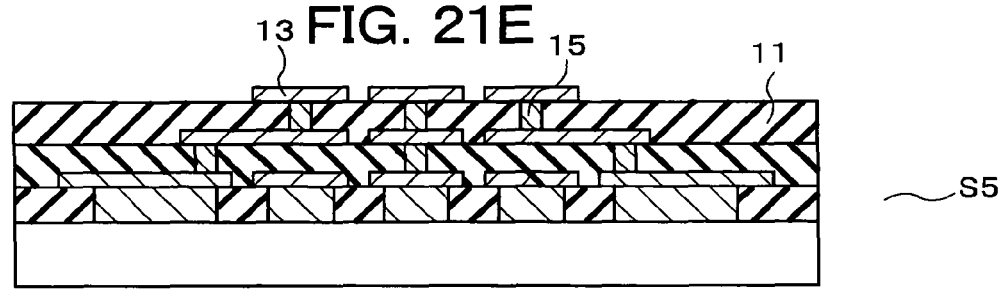

The insulation layer 11 and vias are formed in the same manner as in step 3 shown in FIG. 21C, and the first electrodes 13 are formed on the vias and the insulation layer 11 (step 5), as shown in FIG. 21E. The diagram in FIG. 21E shows an example in which the first electrodes 13 are formed on the vias 15, but no limitation is imposed by this configuration, and the first electrodes 13 may be formed on the insulation layer 11. The first electrodes 13 are disposed on the insulation layer 11 and vias 15, and are electrically connected by direct connection to the vias 15, or are electrically connected to the vias by way of the wiring layer 12. The material and method for forming the first electrodes 13 are the same as in step 5 of the method for manufacturing a wiring board according to the thirteenth embodiment described above. The wiring board according to the modified example of the second embodiment of the present invention can be fabricated by forming the wiring layer 12 on the surface on which the first electrodes 13 are formed. In this case, the first electrodes 13 and wiring layer 12 may be fabricated in separate steps or may be formed at the same time by pattering the same electroconductive film. In the present embodiment, the first electrodes 13 can be formed by sequentially layering copper to a thickness of 5 μm, nickel to a thickness of 3 μm, and gold to a thickness of 0.5 μm by the semi-additive method, for example, wherein gold is the topmost layer.

Figure 21F:
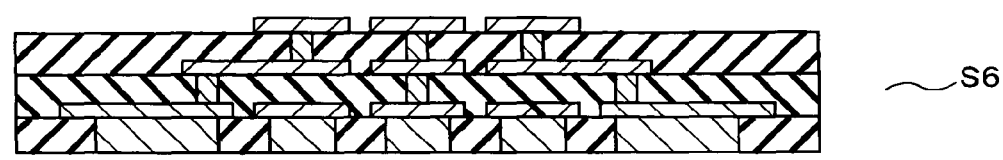

Next, the support board 30 is removed (step 6) as shown in FIG. 21F. The method for removing the support board 30 is the same as in step 6 of the method for manufacturing a wiring board according to the thirteenth embodiment described above. In the present embodiment, a release layer (not shown) that has low adhesiveness and is formed between the silicon and seed metal layers (not shown) is used, for example, and after the release layer has been peeled away, the seed metal layer (not shown) can be removed by etching.

Figure 21G:
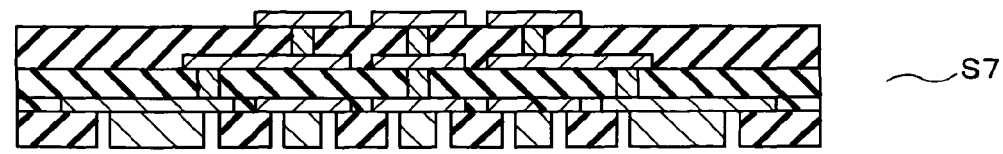

Next, the second electrodes 14 and insulation layer 11 are reliably separated (step 7) as shown in FIG. 21G. The separation of the second electrodes 14 and insulation layer 11 can be carried out by wet etching or dry etching. In this case, etching is not necessarily required as long as a gap needed for solder material to flow during reflow is formed between the insulation layer 11 and the second electrodes 14 when the solder material is reflowed without etching. In the case that step 3 of the above-described thirteenth embodiment shown in FIG. 17C or step 4 of the above-described fifteenth embodiment shown in FIG. 19D is used in step 1 shown in FIG. 21A, the wiring board in which the insulation layer 11 and wiring layer 12 are laminated on the wiring board according to the second modified example of the first embodiment described above can be fabricated by primarily etching the second electrodes 14 in the etching step, and the wiring board in which the insulation layer 11 and wiring layer 12 are laminated on the wiring board according to the third modified example of the first embodiment described above can be fabricated by primarily etching the insulation layer 11. Also, in the case that step 4 of the above-described fourteenth embodiment shown in FIG. 18D is used in step 1 shown in FIG. 21A, the wiring board in which the insulation layer 11 and wiring layer 12 are laminated on the wiring board according to the second modified example of the first embodiment described above can be fabricated by primarily etching the second electrodes 14 in the etching step, and the wiring board in which the insulation layer 11 and wiring layer 12 are laminated on the wiring board according to the third modified example of the first embodiment described above can be fabricated by primarily etching the insulating film 31 and insulation layer 11. Also, in the case that step 4 of the above-described sixteenth embodiment shown in FIG. 20D is used in step 1 shown in FIG. 21A, the wiring board in which the insulation layer 11 and wiring layer 12 are laminated on the wiring board according to the second modified example of the first embodiment described above can be fabricated by primarily etching the second electrodes 14 in the etching step, and the wiring board in which the insulation layer 11 and wiring layer 12 are laminated on the wiring board according to the third modified example of the first embodiment described above can be fabricated by primarily etching the insulating film 31. After etching has been completed, the surfaces of the second electrodes 14 may be treated by electrolytic plating, electroless plating, vapor deposition, printing, inkjet deposition, dipping, or another method so as to form the surfaces of the second electrodes 14 from at least one metal or an alloy selected from the group consisting of gold, silver, copper, tin, and solder materials. In the present embodiment, a gold film can be formed by electroless plating on the exposed copper surfaces of the second electrodes 14, for example.

In accordance with the present embodiment, the wiring board according to the second embodiment of the present invention and the wiring boards according to the modified example of the second embodiment can be efficiently fabricated. The example in the present embodiment shows three insulation layers 11 and two wiring layers 12 laminated together, but no limitation is imposed by this configuration, and the insulation layers 11 and wiring layers 12 can be formed with a required number of insulation layers 11 and wiring layers 12 by repeating step 3 shown in FIG. 21C and step 4 shown in FIG. 21D described above. Other effects of the present embodiment are the same as those in the thirteenth embodiment described above.

The eighteenth embodiment of the present invention will be described next. The present embodiment involves a method for manufacturing the wiring board according to the third embodiment described above. FIGS. 22A to 22E are schematic cross-sectional views showing, as a sequence of steps, an example of a method for manufacturing the wiring board according to the third embodiment of the present invention shown in FIG. 7. In FIG. 22, the same reference numerals are used for the same constituent elements as in FIGS. 1 to 21, and a detailed description thereof is omitted. Washing and heating treatments are suitably carried out between each step.

Figure 22A:
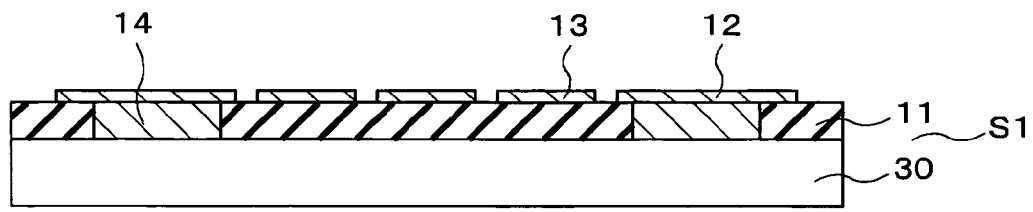
FIGS. 22A to 22E are schematic cross-sectional views showing an example of the method for manufacturing a semiconductor device according to the eighteenth embodiment of the present invention.

The present embodiment is described based on the state immediately prior to the step for removing the support board 30 (step 1) in the method for manufacturing a wiring board according to the thirteenth to seventeenth embodiments described above. The diagram in FIG. 22A shows the state of step 5 of the above-described thirteenth embodiment shown in FIG. 17E, and step 6 of the above-described fifteenth embodiment shown in FIG. 19F. However, no limitation is imposed thereby, and it is possible to carry out steps that are subsequent to the state of step 6 of the above-described fourteenth embodiment shown in FIG. 18F, step 6 of the above-described sixteenth embodiment shown in FIG. 20F, or step 5 of the above-described seventeenth embodiment shown in FIG. 21E. In the present embodiment, the support board 30 may be one in which a release layer (not shown) and an electroconductive seed metal layer (not shown) are sequentially disposed on a silicon wafer that has a thickness of 0.725 mm and a diameter of 8 inches (200 mm) and is provided with a thermal oxidation layer, for example. The insulation layer 11 is formed to a thickness of 7 μm from a photosensitive polyimide resin, and the second electrodes 14 are formed to the same thickness as the insulation layer 11 by layering copper to a thickness of 2 μm and nickel to a thickness of 5 μm in order from the support board 30 by feeding power from the seed metal layer (not shown) formed on the support board 30. A wiring layer 12 can be formed on the second electrodes 14 and insulation layer 11 using copper to a thickness of 10 μm by the semi-additive method in which a sputtered film is used as a power supply layer, and the first electrodes 13 can be formed by sequentially layering copper to a thickness of 5 μm, nickel to a thickness of 3 μm, and gold to a thickness of 0.5 μm, wherein gold is the topmost layer.

Figure 22B:
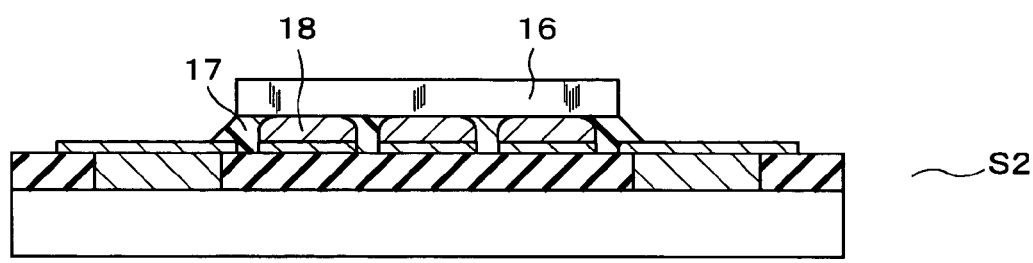

Next, the electrodes (not shown) of the semiconductor element 16 are flip-chip connected to the first electrodes 13 by way of solder balls 18, as shown in FIG. 22B. An underfill resin 17 is thereafter filled into the space between the semiconductor element 16 and the wiring board on which the solder balls 18 are formed (step 2). The material and method for forming the solder balls 18 are the same as in the third embodiment described above. The underfill resin 17 is composed of an epoxy-based material and is used for the purpose of reducing the difference in the coefficient of thermal expansion in order to prevent the solder balls 18 from breaking due to the difference in the coefficient of thermal expansion between the wiring board and the semiconductor element 16. An underfill resin 17 is not required to be used as long as the solder balls 18 have sufficient strength to ensure the desired reliability. A frame in which the area of the semiconductor element 16 is opened may be separately attached when the rigidity of the wiring board is insufficient in areas in which the semiconductor element 16 is not mounted.

Figure 22C:
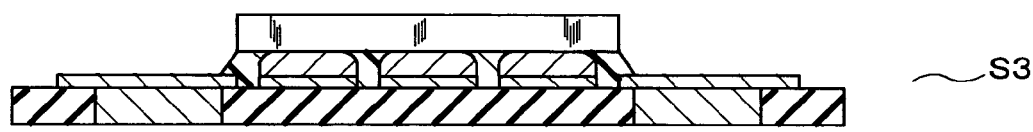

Next, the support board 30 is removed (step 3) as shown in FIG. 22C. The method for removing the support board 30 is the same as in step 6 of the method for manufacturing a wiring board according to the thirteenth embodiment described above. In the present embodiment, a release layer (not shown) that has low adhesiveness and is formed between the silicon and seed metal layers (not shown) is used, for example, and after the release layer has been peeled away, the seed metal layer (not shown) can be removed by etching.

Figure 22D:
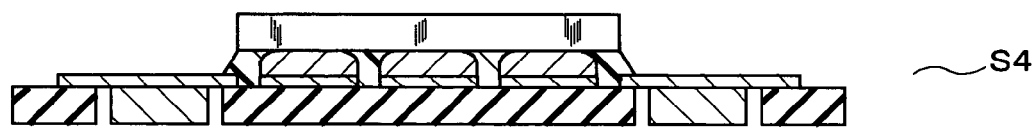

Next, the second electrodes 14 and insulation layer 11 are reliably separated (step 4) as shown in FIG. 22D. The separation of the second electrodes 14 and insulation layer 11 (or the insulating film 31) can be carried out using the same method as in step 7 of the method for manufacturing a wiring board according to the seventeenth embodiment described above. In this case, etching is not necessarily required as long as a gap needed for solder material to flow during reflow is formed between the insulation layer 11 (or the insulating film 31) and the second electrodes 14 when the solder material is reflowed without etching. After etching has been completed, the surfaces of the second electrodes 14 may be treated by electrolytic plating, electroless plating, vapor deposition, printing, inkjet deposition, dipping, or another method so as to form the surfaces of the second electrodes 14 from at least one metal or an alloy selected from the group consisting of gold, silver, copper, tin, and solder materials. In the present embodiment, a gold film can be formed by electroless plating on the exposed copper surfaces of the second electrodes 14, for example.

Figure 22E:
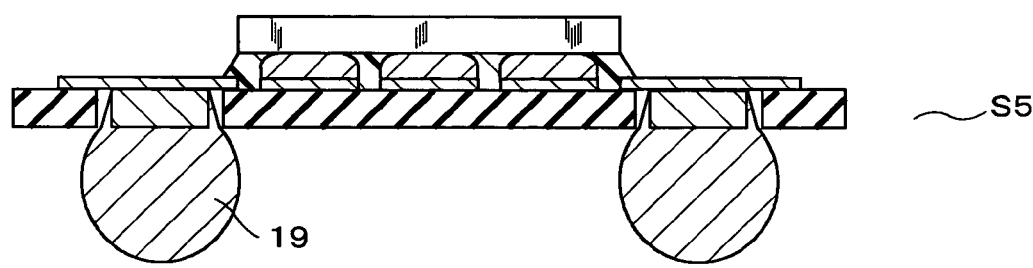

Next, solder balls 19 are attached to the second electrodes 14 (step 5), as shown in FIG. 22E. The solder balls 19 are attached to the second electrodes 14 in order for the semiconductor device of the present invention to be mounted on another base board. The solder balls 19 are balls composed of solder material and are formed by ball transfer or printing on the second electrodes 14. Depending on the mode of attachment, metal pins may be soldered without attaching the solder balls 19 to the second electrodes 14. The diagram in FIG. 22E shows an example in which the solder balls 19 are formed on the second electrodes 14, but no limitation is imposed by this configuration, and the solder balls 19 may be formed on the first electrodes 13, or may be optionally formed both on the first electrodes 13 and on the second electrodes 14.

In accordance with the present embodiment, the semiconductor device according to the third embodiment of the present invention can be efficiently fabricated. Since the semiconductor element 16 is mounted while making use of the stable support board 30, connections can be stably made at a very narrow pitch of 50 µm or less. The thickness of the wiring board can furthermore be minimized by removing the support board 30 after the semiconductor element 16 has been mounted, and the space between previously mounted semiconductor elements can be set to a very short distance by mounting another semiconductor element on the exposed surface. For this reason, a large number of micro-connections can be provided, and high-speed signal transmission and a wide bus width can be brought about between the semiconductor elements on the two surfaces.

The nineteenth embodiment of the present invention will be described next. The present embodiment involves a method for manufacturing the semiconductor device according to the fourth embodiment described above. FIGS. 23A to 23F are schematic cross-sectional views showing, as a sequence of steps, an example of a method for manufacturing the semiconductor device according to the fourth embodiment of the present invention shown in FIG. 8. In FIG. 23, the same reference numerals are used for the same constituent elements as in FIGS. 1 to 22, and a description thereof is omitted. Washing and heating treatments are suitably carried out between each step.

Figure 23A:
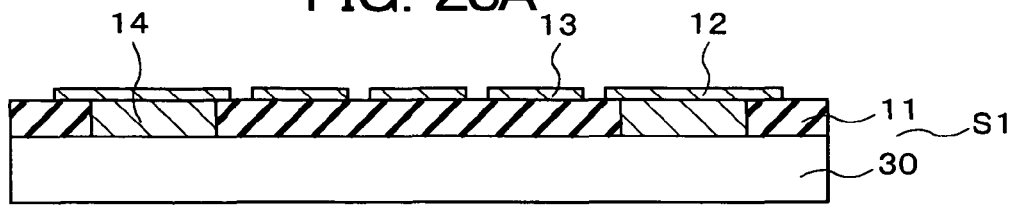
FIGS. 23A to 23F are schematic cross-sectional views showing an example of the method for manufacturing a semiconductor device according to the nineteenth embodiment of the present invention.

Step 1 of the method for manufacturing a semiconductor device according to the present embodiment shown in FIG. 23A is the same as step 1 of the method for manufacturing a semiconductor device according to the above-described eighteenth embodiment shown in FIG. 22A.

Figure 23B:
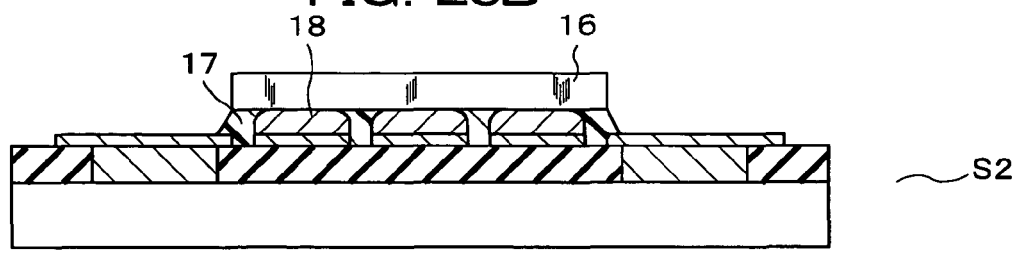

Next, the electrodes (not shown) of the semiconductor element 16 are flip-chip connected to the first electrodes 13 by way of solder balls 18, as shown in FIG. 23B. An underfill resin 17 is thereafter filled into the space between the semiconductor element 16 and the wiring board on which the solder balls 18 are formed (step 2). The material and method for forming the solder balls 18 are the same as in the third embodiment described above. The underfill resin 17 is composed of an epoxy-based material and is used for the purpose of reducing the difference in the coefficient of thermal expansion in order to prevent the solder balls 18 from breaking due to the difference in the coefficient of thermal expansion between the wiring board and the semiconductor element 16. An underfill resin 17 is not required to be used as long as the solder balls 18 have sufficient strength to ensure the desired reliability. The semiconductor element 16 in the diagram shown in FIG. 23B is connected by flip-chip connection, but no limitation is imposed by this configuration, and the connection may be a wire bonding connection that is carried out in a later step to fabricate a semiconductor device according to the fifth embodiment of the present invention shown in FIG. 9. In this case, the adhesive 22 is applied to the surface of the semiconductor element 16 on which the circuitry is not disposed, and an organic material, or Ag paste or the like may be used. The electrodes (not shown) of the semiconductor element 16 and the first electrodes 13 can be electrically connected by a bonding wire 21 primarily comprising gold. A frame in which the area of the semiconductor element 16 is opened may be separately attached when the rigidity of the wiring board is insufficient in areas in which the semiconductor element 16 is not mounted.

Figure 23C:
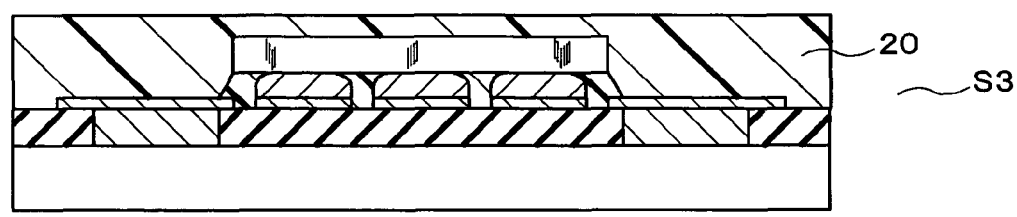

A sealing resin is formed so as to cover the semiconductor element 16 (step 3), as shown in FIG. 23C. The sealing resin may be one comprising a material obtained by adding a silica filler to an epoxy-based material and may be applied using the printing method, compression molding, or transfer molding in which a metal mold is used, so as to cover the mounted semiconductor element 16 and the connecting portions of the element. The diagram in FIG. 23C shows a structure in which the sealing resin covers the entire surface of the wiring board on which the semiconductor element 16 is mounted, but the entire surface does not necessarily need to be covered, and the structure may be one in which the sealing resin 20 covers a part of the surface that includes the semiconductor element 16 and the connection portions of the element, and in which a part of the wiring board is exposed. The semiconductor element 16 in the semiconductor device can be protected because the semiconductor element 16 is covered by the sealing resin 20. Also, the rigidity of the entire semiconductor device can be improved by disposing a sealing resin 20, and the reliability of the entire package can be improved as well.

Figure 23D:
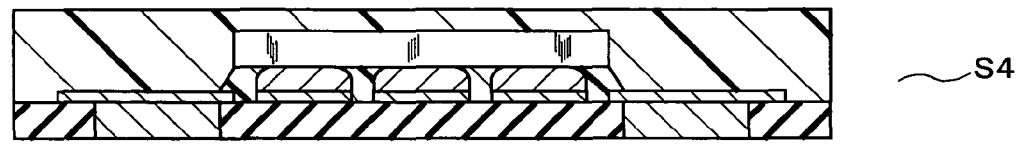

Next, the support board 30 is removed (step 4), as shown in FIG. 23D. The method for removing the support board 30 is the same as in step 6 of the method for manufacturing a wiring board according to the thirteenth embodiment described above. In the present embodiment, a release layer (not shown) that has low adhesiveness and is formed between the silicon and seed metal layers (not shown) is used, for example, and after the release layer has been peeled away, the seed metal layer (not shown) can be removed by etching.

Figure 23E:
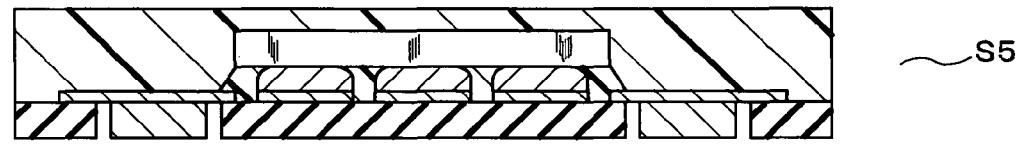

Next, the second electrodes 14 and insulation layer 11 are reliably separated (step 5), as shown in FIG. 23E. The separation of the second electrodes 14 and insulation layer 11 (or the insulating film 31) can be carried out using the same method as in step 7 of the method for manufacturing a wiring board according to the seventeenth embodiment described above. In this case, etching is not necessarily required as long as a gap needed for solder material to flow during reflow is formed between the insulation layer 11 (or the insulating film 31) and the second electrodes 14 when the solder material is reflowed without etching. After etching has been completed, the surfaces of the second electrodes 14 may be treated by electrolytic plating, electroless plating, vapor deposition, printing, inkjet deposition, dipping, or another method so as to form the surfaces of the second electrodes 14 from at least one metal or an alloy selected from the group consisting of gold, silver, copper, tin, and solder materials. In the present embodiment, a gold film can be formed by electroless plating on the exposed copper surfaces of the second electrodes 14, for example.

Figure 23F:
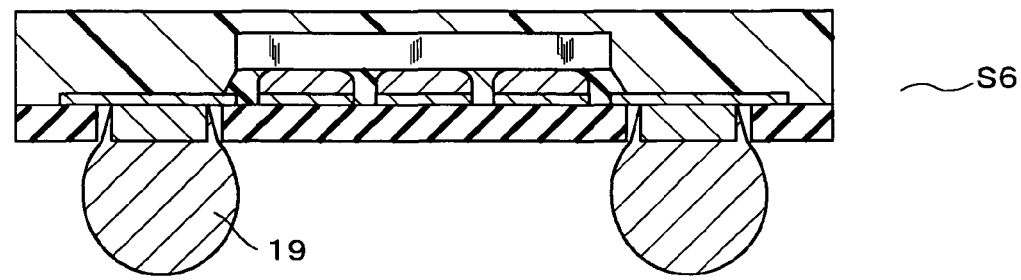

Next, the solder balls 19 are attached to the second electrodes 14 (step 6), as shown in FIG. 23F. The solder balls 19 are attached to the second electrodes 14 in order for the semiconductor device according to the present invention to be mounted on another wiring board. The material and method for forming the solder balls 19 are the same as in the eighteenth embodiment described above. The diagram in FIG. 23F shows an example in which the solder balls 19 are formed on the second electrodes 14, but no limitation is imposed by this configuration, and the sealing resin may cover a portion of the surface that includes the semiconductor element 16 and the connection portions of the element. When the structure is one in which the first electrodes 13 are exposed, the solder balls 19 may be formed on the first electrodes 13, and the solder balls 19 may alternatively be formed as required on both the first electrodes 13 and the second electrodes 14.

In accordance with the present embodiment, the semiconductor device according to the fourth embodiment and the semiconductor device according to the fifth embodiment of the present invention can be efficiently fabricated. Other effects of the present embodiment are the same as those in the eighteenth embodiment described above.

The twentieth embodiment of the present invention is described next. The present embodiment involves a method for manufacturing the semiconductor device according to the sixth embodiment described above. FIGS. 24A to 24D are schematic cross-sectional views showing, as a sequence of steps, an example of a method for manufacturing the semiconductor device according to the sixth embodiment of the present invention shown in FIG. 10. In FIG. 24, the same reference numerals are used for the same constituent elements as in FIGS. 1 to 23, and a description thereof is omitted. Washing and heating treatments are suitably carried out between each step.

Figure 24A:
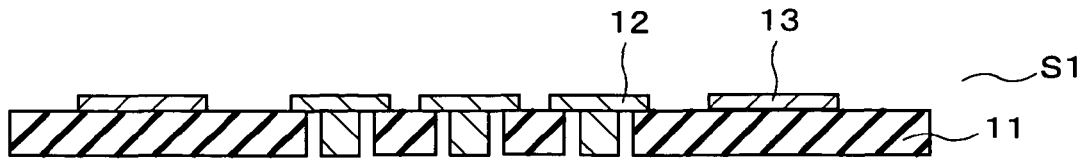
FIGS. 24A to 24D are schematic cross-sectional views showing an example of the method for manufacturing a semiconductor device according to the twentieth embodiment of the present invention.

In the present embodiment, description begins in a state in which the second electrodes 14 and the insulation layer 11 (or the insulating film 31) are separated in the method for manufacturing the wiring board according to the thirteenth to seventeenth embodiments described above. The diagram in FIG. 24A shows the state of step 7 of the above-described thirteenth embodiment shown in FIG. 17G, step 8 of the above-described fourteenth embodiment shown in FIG. 18H, and step 8 of the above-described fifteenth embodiment shown in FIG. 19H. However, no limitation is imposed thereby, and it is possible to carry out steps that are subsequent to the state of step 6 of the above-described fourteenth embodiment shown in FIG. 18F, step 8 of the above-described sixteenth embodiment shown in FIG. 20H, or step 7 of the above-described seventeenth embodiment shown in FIG. 21G.

First, a wiring board according to the present invention is prepared (step 1), as shown in FIG. 24A. When rigidity is insufficient in the wiring board alone and the remaining steps are difficult to carry out, a method may be used in which a supporting film or board is transferred in the step for removing the support board 30. In the present embodiment, the support board 30 may be one in which a release layer (not shown) and an electroconductive seed metal layer (not shown) are sequentially disposed on a silicon wafer that has a thickness of 0.725 mm and a diameter of 8 inches (200 mm) and is provided with a thermal oxidation layer, for example. The insulation layer 11 is formed to a thickness of 7 μm from a photosensitive polyimide resin, and the second electrodes 14 are formed by layering copper to a thickness of 2 μm and nickel to a thickness of 3 μm in order from the support board 30 by feeding power from the seed metal layer (not shown) formed on the support board 30. A wiring layer 12 can be formed on the second electrodes 14 and insulation layer 11 using copper to a thickness of 10 μm by the semi-additive method in which a sputtered film is used as a power supply layer, and the first electrodes 13 can be formed by sequentially layering copper to a thickness of 5 μm, nickel to a thickness of 3 μm, and gold to a thickness of 0.5 μm, wherein gold is the topmost layer. After the support board 30 is separated and removed, the second electrodes 14 and insulation layer 11 are separated by wet etching.

Figure 24B:
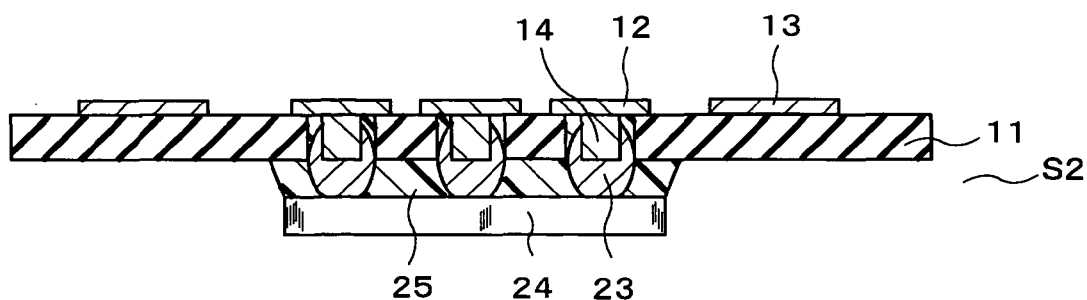

Next, the electrodes (not shown) of the semiconductor element 24 are flip-chip connected to the second electrodes 14 by way of solder balls 23, as shown in FIG. 24B. An underfill resin is thereafter filled into the space between the semiconductor element 24 and the wiring board on which the solder balls 23 are formed (step 2). The material and method for forming the solder balls 23 are the same as in the sixth embodiment of the present invention. The underfill resin is composed of an epoxy-based material and is used for the purpose of reducing the difference in the coefficient of thermal expansion in order to prevent the solder balls 23 from breaking due to the difference in the coefficient of thermal expansion between the wiring board and the semiconductor element 24. An underfill resin is not necessarily required to be used as long as the solder balls 23 have sufficient strength to ensure the desired reliability. A frame in which the area of the semiconductor element 24 is opened may be separately attached when the rigidity of the wiring board is insufficient in areas in which the semiconductor element 24 is not mounted.

Figure 24C:
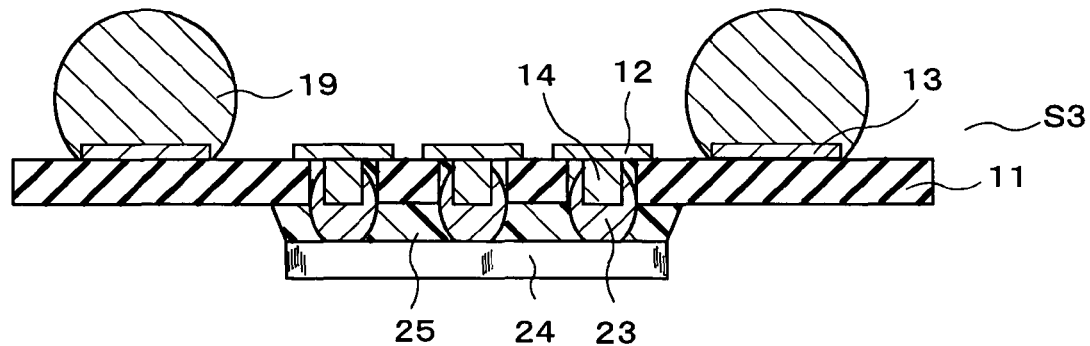

Next, the solder balls 19 are attached to the first electrodes 13 (step 3), as shown in FIG. 24C. The solder balls 19 are attached to the second electrodes 14 in order for the semiconductor device of the present invention to be mounted on another base board. The material and method for forming the solder balls 19 are the same as in the eighteenth embodiment described above. The semiconductor device according to the sixth embodiment of the present invention shown in FIG. 10 can thereby be fabricated. The diagram in FIG. 24C shows an example in which the solder balls 19 are formed on the first electrodes 13, but no limitation is imposed by this configuration, and the solder balls 19 may be formed on the second electrodes 14, or may be optionally formed both on the first electrodes 13 and on the second electrodes 14.

Figure 24D:
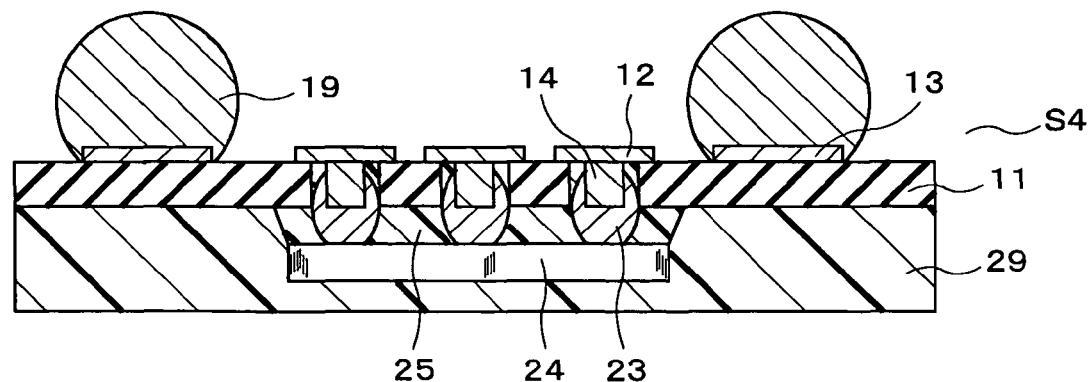

When the sealing resin 29 is formed so as to cover the semiconductor element 24, as shown in FIG. 24D, a step for forming the sealing resin 29 is added between the step of FIG. 24B and the step of FIG. 24C. The material and method for forming the sealing resin 29 are the same as in the seventh embodiment described above. The diagram in FIG. 24D shows a structure in which the sealing resin 29 covers the entire surface of the wiring board on which the semiconductor element 24 is mounted, but the entire surface does not necessarily need to be covered, and the structure may be one in which the sealing resin 29 covers a part of the surface that includes the semiconductor element 24 and the connection portions of the element, and in which a part of the wiring board is exposed. The solder balls 19 are formed after the sealing resin 29 has been formed, as shown in FIG. 24D. The solder balls 19 are attached for mounting the semiconductor device of the present invention on another base board, and depending on the attachment mode, metal pins may be soldered instead of the solder balls 19. The diagram in FIG. 24D shows an example in which the solder balls 19 are formed on the first electrodes 13, but no limitation is imposed by this configuration, and the sealing resin 29 may cover a portion that includes the semiconductor element 24 and the connection portions of the element. In the case that the structure is one in which the second electrodes 14 are exposed, the solder balls 19 may be formed on the second electrodes 14, or may be optionally formed both on the first electrodes 13 and on the second electrodes 14. The semiconductor device according to the seventh embodiment of the present invention shown in FIG. 11 can thereby be formed.

In the diagram shown in FIG. 24D, the semiconductor element 24 is connected by flip-chip connection, but no limitation is imposed by this configuration, and the semiconductor device according to the eighth embodiment of the present invention shown in FIG. 12 can be fabricated by a wire-bonding connection. In this case, the adhesive 27 is applied to the surface of the semiconductor element 26 on which the circuitry is not disposed, and an organic material, or Ag paste or the like may be used. The electrodes (not shown) of the semiconductor element 26 and the second electrodes 14 can be electrically connected using bonding wires 28 composed of a material that primarily comprises gold. The solder balls 19 are attached in order for the semiconductor device of the present invention to be mounted on another base board, and depending on the attachment mode, metal pins may be soldered rather than the solder balls 19. The diagram in FIG. 24D shows an example in which the solder balls 19 are formed on the first electrodes 13, but no limitation is imposed by this configuration, and the sealing resin 29 may cover a part that includes the semiconductor element 24, including and the connection portions of the element. In the case that the structure is one in which the second electrodes 14 are exposed, the solder balls 19 may be formed on the second electrodes 14, or the solder balls 19 may be optionally formed both on the first electrodes 13 and on the second electrodes 14. The semiconductor device according to the eighth embodiment of the present invention shown in FIG. 12 can be formed in the manner described above.

In accordance with the present embodiment, it is possible to efficiently fabricate the semiconductor device according to the sixth embodiment, the semiconductor device according to the seventh embodiment, and the semiconductor device according to the eighth of the present invention.

The twenty-first embodiment of the present invention is described next. The present embodiment involves a method for manufacturing the semiconductor device according to the ninth embodiment described above. FIGS. 25A to 25F are schematic cross-sectional views showing, as a sequence of steps, an example of a method for manufacturing the wiring board according to the ninth embodiment of the present invention shown in FIG. 13. In FIG. 25, the same reference numerals are used for the same constituent elements as in FIGS. 1 to 24, and a description thereof is omitted. Washing and heating treatments are suitably carried out between each step.

Figure 25A:
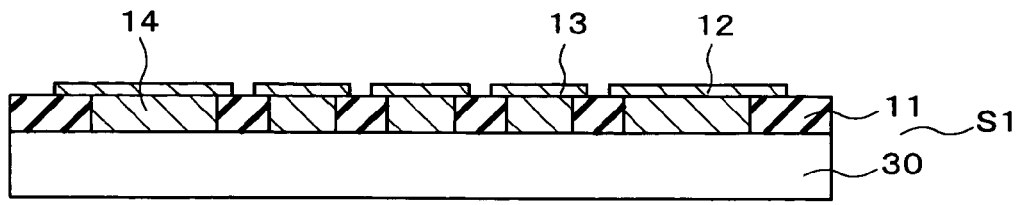
FIGS. 25A to 25F are schematic cross-sectional views showing an example of the method for manufacturing a semiconductor device according to the twenty-first embodiment of the present invention.

In the present embodiment, description begins just prior to the state in which the support board 30 is removed (step 1) in the method for manufacturing the wiring board according to the thirteenth to seventeenth embodiments described above. The diagram in FIG. 25A shows the state of step 5 of the above-described thirteenth embodiment shown in FIG. 17E, and step 6 of the above-described fifteenth embodiment shown in FIG. 19F. However, no limitation is imposed thereby, and it is possible to carry out steps that are subsequent to the state of step 6 of the above-described fourteenth embodiment shown in FIG. 18F, step 6 of the above-described sixteenth embodiment shown in FIG. 20F, or step 5 of the above-described seventeenth embodiment shown in FIG. 21E. In the present embodiment, the support board 30 may be one in which a release layer (not shown) and an electroconductive seed metal layer (not shown) are sequentially disposed on a silicon wafer that has a thickness of 0.725 mm and a diameter of 8 inches (200 mm) and is provided with a thermal oxidation layer, for example. The insulation layer 11 is formed to a thickness of 7 μm from a photosensitive polyimide resin, and the second electrodes 14 are formed to the same thickness as the insulation layer 11 by layering copper to a thickness of 2 μm and nickel to a thickness of 5 μm in order from the support board 30 by feeding power from the seed metal layer (not shown) formed on the support board 30. A wiring layer 12 can be formed on the second electrodes 14 and insulation layer 11 using copper to a thickness of 10 μm by the semi-additive method in which a sputtered film is used as a power supply layer, and the first electrodes 13 can be formed by sequentially layering copper to a thickness of 5 μm, nickel to a thickness of 3 μm, and gold to a thickness of 0.5 μm, wherein gold is the topmost layer.

Figure 25B:
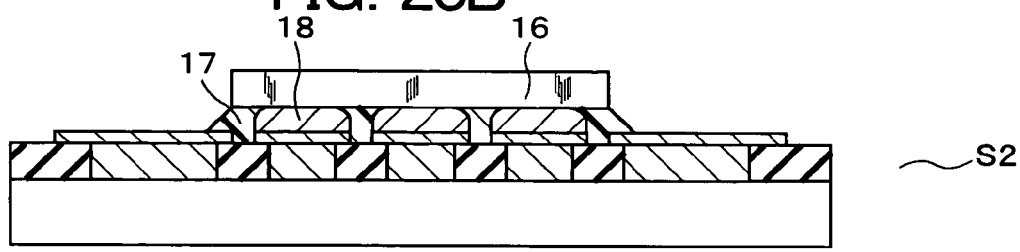

Next, the electrodes (not shown) of the semiconductor element 16 are flip-chip connected to the first electrodes 13 by way of solder balls 18, as shown in FIG. 25B. An underfill resin 17 is thereafter filled into the space between the semiconductor element 16 and the wiring board on which the solder balls 18 are formed (step 2). The material and method for forming the solder balls 18 are the same as in the third embodiment described above. The underfill resin 17 is composed of an epoxy-based material and is used for the purpose of reducing the difference in the coefficient of thermal expansion in order to prevent the solder balls 18 from breaking due to the difference in the coefficient of thermal expansion between the wiring board and the semiconductor element 16. An underfill resin 17 is not necessarily required to be used as long as the solder balls 18 have sufficient strength to ensure the desired reliability. A frame in which the area of the semiconductor element 16 is opened may be separately attached when the rigidity of the wiring board is insufficient in areas in which the semiconductor element 16 is not mounted.

Figure 25C:
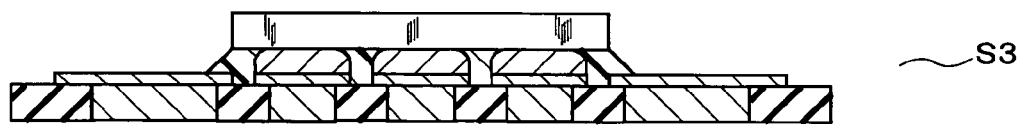

Next, the support board 30 is removed (step 3), as shown in FIG. 25C. The method for removing the support board 30 is the same as in step 6 of the method for manufacturing a wiring board according to the thirteenth embodiment described above. In the present embodiment, a release layer (not shown) that has low adhesiveness and is formed between the silicon and seed metal layers (not shown) is used, for example, and after the release layer has been peeled away, the seed metal layer (not shown) can be removed by etching.

Figure 25D:
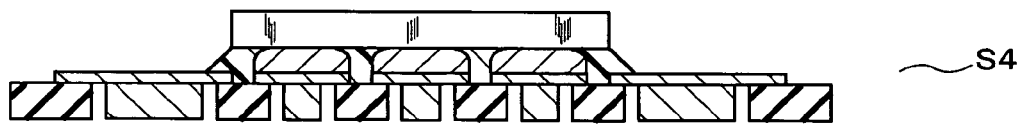

Next, the second electrodes 14 and insulation layer 11 are reliably separated (step 4), as shown in FIG. 25D. The separation of the second electrodes 14 and insulation layer 11 (or the insulating film 31) can be carried out using the same method as in step 7 of the method for manufacturing a wiring board according to the seventeenth embodiment described above. In this case, etching is not necessarily required as long as a gap needed for solder material to flow during reflow is formed between the insulation layer 11 (or the insulating film 31) and the second electrodes 14 when the solder material is reflowed without etching. After etching has been completed, the surfaces of the second electrodes 14 may be treated by electrolytic plating, electroless plating, vapor deposition, printing, inkjet deposition, dipping, or another method so as to form the surfaces of the second electrodes 14 from at least one metal or an alloy selected from the group consisting of gold, silver, copper, tin, and solder materials. In the present embodiment, a gold film can be formed by electroless plating on the exposed copper surfaces of the second electrodes 14, for example.

Figure 25E:
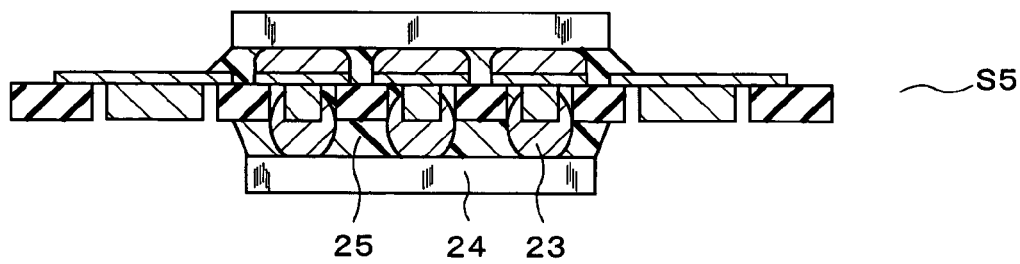

Next, the electrodes (not shown) of the semiconductor element 24 are flip-chip connected to the second electrodes 14 by way of solder balls 23, as shown in FIG. 25E. An underfill resin is thereafter filled into the space between the semiconductor element 24 and the wiring board on which the solder balls 23 are formed (step 5). The material and method for forming the solder balls 23 are the same as in the sixth embodiment of the present invention. The underfill resin is composed of an epoxy-based material and is used for the purpose of reducing the difference in the coefficient of thermal expansion in order to prevent the solder balls 23 from breaking due to the difference in the coefficient of thermal expansion between the wiring board and the semiconductor element 24. An underfill resin is not necessarily required to be used as long as the solder balls 23 have sufficient strength to ensure the desired reliability.

In the diagram shown in FIG. 25E, the semiconductor element 24 is connected by flip-chip connection, but no limitation is imposed by this configuration, and the semiconductor device according to the tenth embodiment of the present invention shown in FIG. 14 can be fabricated by forming a wire-bonding connection, applying the sealing resin 29 so as to cover the semiconductor element 24, and performing the subsequent steps. In this case, the adhesive 27 is applied to the surface of the semiconductor element 26 on which the circuitry is not formed, and an organic material, or Ag paste or the like may be used. The electrodes (not shown) of the semiconductor element 26 and the second electrodes 14 can be electrically connected using bonding wires 28 composed of a material that primarily comprises gold.

Figure 25F:
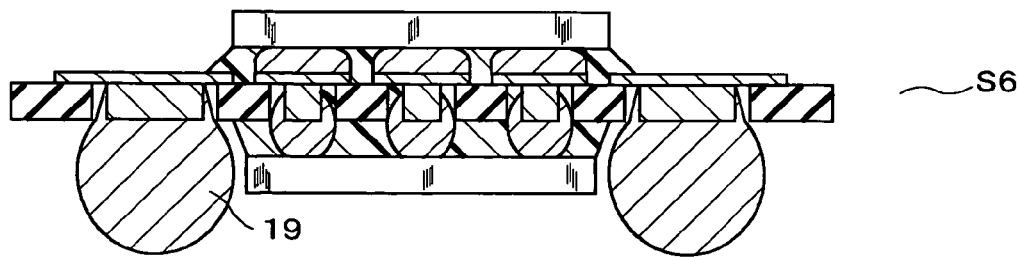

Next, solder balls 19 are attached to the second electrodes 14 (step 6) as shown in FIG. 25F. The solder balls 19 are attached to the second electrodes 14 in order for the semiconductor device of the present invention to be mounted on another base board. The solder balls 19 are balls composed of solder material and are formed by ball transfer or printing on the second electrodes 14. Depending on the mode of attachment, metal pins may be soldered without attaching the solder balls 19 to the second electrodes 14. The diagram in FIG. 25F shows an example in which the solder balls 19 are formed on the second electrodes 14, but no limitation is imposed by this configuration, and the solder balls 19 may be formed on the first electrodes 13, or may be optionally formed both on the first electrodes 13 and on the second electrodes 14.

In accordance with the present embodiment, the semiconductor device according to the ninth embodiment and the semiconductor device according to the tenth of the present invention can be efficiently fabricated.

The twenty-second embodiment of the present invention is described next. The present embodiment involves a method for manufacturing the semiconductor device according to the eleventh embodiment described above. FIGS. 26A to 26G are schematic cross-sectional views showing, as a sequence of steps, an example of a method for manufacturing the wiring board according to the eleventh embodiment of the present invention shown in FIG. 15. In FIG. 26, the same reference numerals are used for the same constituent elements as in FIGS. 1 to 25, and a description thereof is omitted. Washing and heating treatments are suitably carried out between each step.

Figure 26A:
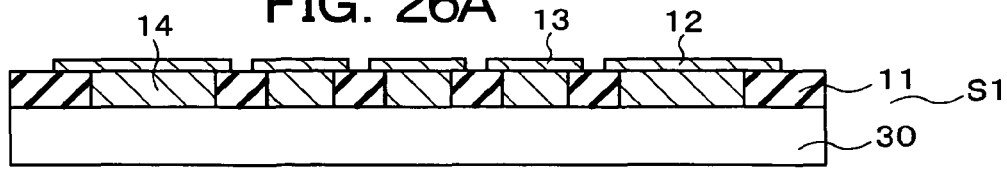
FIGS. 26A to 26G are schematic cross-sectional views showing an example of the method for manufacturing a semiconductor device according to the twenty-second embodiment of the present invention.

In the present embodiment, description begins in a state immediately prior to the step for removing the support board 30 (step 1) in the method for manufacturing the wiring board according to the thirteenth to seventeenth embodiments described above. The diagram in FIG. 26A shows the state of step 5 of the above-described thirteenth embodiment shown in FIG. 17E, and step 6 of the above-described fifteenth embodiment shown in FIG. 19F. However, no limitation is imposed thereby, and it is possible to carry out steps subsequent to the state of step 6 of the above-described fourteenth embodiment shown in FIG. 18F, step 6 of the above-described sixteenth embodiment shown in FIG. 20F, or step 5 of the above-described seventeenth embodiment shown in FIG. 21E. In the present embodiment, the support board 30 may be one in which a release layer (not shown) and an electroconductive seed metal layer (not shown) are sequentially disposed on a silicon wafer that has a thickness of 0.725 mm and a diameter of 8 inches (200 mm) and is provided with a thermal oxidation layer, for example. The insulation layer 11 is formed to a thickness of 7 µm from a photosensitive polyimide resin, and the second electrodes 14 are formed to the same thickness as the insulation layer 11 by layering copper to a thickness of 2 µm and nickel to a thickness of 5 µm in order from the support board 30 by feeding power from the seed metal layer (not shown) formed on the support board 30. A wiring layer 12 can be formed on the second electrodes 14 and insulation layer 11 using copper to a thickness of 10 µm by the semi-additive method in which a sputtered film is used as a power supply layer, and the first electrodes 13 can be formed by sequentially layering copper to a thickness of 5 µm, nickel to a thickness of 3 µm, and gold to a thickness of 0.5 µm, wherein gold is the topmost layer.

Figure 26B:
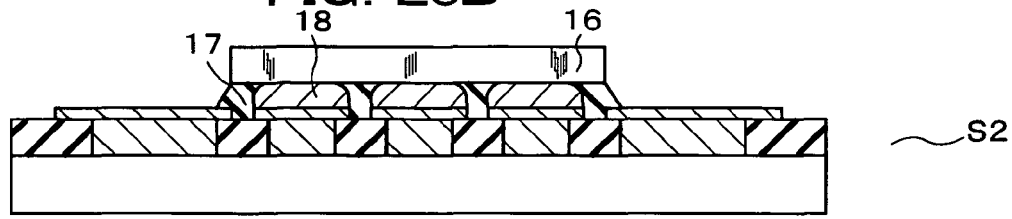

Next, the electrodes (not shown) of the semiconductor element 16 are flip-chip connected to the first electrodes 13 by way of solder balls 18, as shown in FIG. 26B. An underfill resin 17 is thereafter filled into the space between the semiconductor element 16 and the wiring board on which the solder balls 18 are formed (step 2). The material and method for forming the solder balls 18 are the same as in the third embodiment described above. The underfill resin 17 is composed of an epoxy-based material and is used for the purpose of reducing the difference in the coefficient of thermal expansion in order to prevent the solder balls 18 from breaking due to the difference in the coefficient of thermal expansion between the wiring board and the semiconductor element 16. An underfill resin 17 is not necessarily required to be used as long as the solder balls 18 have sufficient strength to ensure the desired reliability. In the diagram shown in FIG. 26B, the semiconductor element 16 is connected by flip-chip connection, but no limitation is imposed by this configuration, and the semiconductor device according to the twelfth embodiment of the present invention shown in FIG. 16 can be fabricated by forming a wire-bonding connection and performing the subsequent steps. In this case, the adhesive 22 is applied to the surface of the semiconductor element 16 on which the circuitry is not formed, and an organic material, or Ag paste or the like may be used. The electrodes (not shown) of the semiconductor element 16 and the first electrodes 13 can be electrically connected using bonding wires 21 composed of a material that primarily comprises gold. A frame in which the area of the semiconductor element 16 is opened may be separately attached when the rigidity of the wiring board is insufficient in areas in which the semiconductor element 16 is not mounted.

Figure 26C:
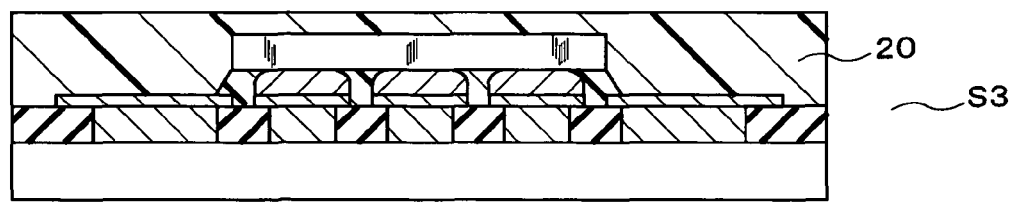

A sealing resin 20 is formed so as to cover the semiconductor element 16 (step 3) as shown in FIG. 26C. The sealing resin 20 may be one comprising a material obtained by adding a silica filler to an epoxy-based material, and may be applied using the printing method, compression molding, or transfer molding in which a metal mold is used, so as to cover the mounted semiconductor element 16 and the connecting portions of the element. The diagram in FIG. 26C shows a structure in which the sealing resin 20 covers the entire surface of the wiring board on which the semiconductor element 16 is mounted, but the entire surface does not necessarily need to be covered, and the structure may be one in which the sealing resin 20 covers a part of the surface that includes the semiconductor element 16 and the connection portions of the element, and in which a part of the wiring board is exposed. The semiconductor element 16 in the semiconductor device can be protected because the semiconductor element 16 is covered by the sealing resin 20. Also, the rigidity of the entire semiconductor device can be improved by disposing a sealing resin 20, and the reliability of the entire package can be improved as well.

Figure 26D:
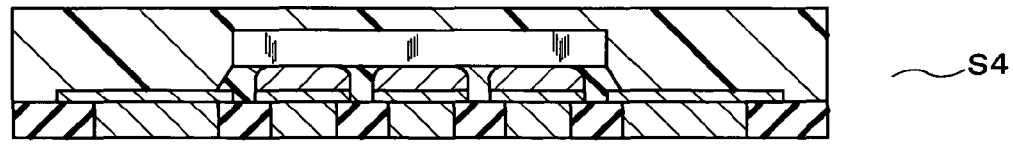

Next, the support board 30 is removed (step 4), as shown in FIG. 26D. The method for removing the support board 30 is the same as in step 6 of the method for manufacturing a wiring board according to the thirteenth embodiment described above. In the present embodiment, a release layer (not shown) that has low adhesiveness and is formed between the silicon and seed metal layers (not shown) is used, for example, and after the release layer has been peeled away, the seed metal layer (not shown) can be removed by etching.

Figure 26E:
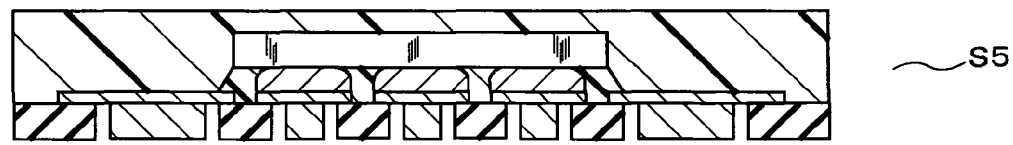

Next, the second electrodes 14 and insulation layer 11 are reliably separated (step 5) as shown in FIG. 26E. The separation of the second electrodes 14 and insulation layer 11 (or the insulating film 31) can be carried out using the same method as in step 7 of the method for manufacturing a wiring board according to the seventeenth embodiment described above. In this case, etching is not necessarily required as long as a gap needed for solder material to flow during reflow is formed between the insulation layer 11 (or the insulating film 31) and the second electrodes 14 when the solder material is reflowed without etching. After etching has been completed, the surfaces of the second electrodes 14 may be treated by electrolytic plating, electroless plating, vapor deposition, printing, inkjet deposition, dipping, or another method so as to form the surfaces of the second electrodes 14 from at least one metal or an alloy selected from the group consisting of gold, silver, copper, tin, and solder materials. In the present embodiment, a gold film can be formed by electroless plating on the exposed copper surfaces of the second electrodes 14, for example.

Figure 26F:
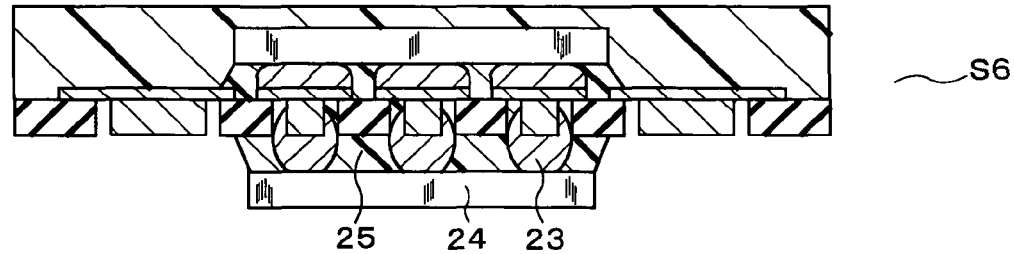

Next, the electrodes (not shown) of the semiconductor element 24 are flip-chip connected to the second electrodes 14 by way of solder balls 23, as shown in FIG. 26F. An underfill resin 25 is thereafter filled into the space between the semiconductor element 24 and the wiring board on which the solder balls 23 are formed (step 6). The material and method for forming the solder balls 23 are the same as in the sixth embodiment of the present invention. The underfill resin 25 is composed of an epoxy-based material and is used for the purpose of reducing the difference in the coefficient of thermal expansion in order to prevent the solder balls 23 from breaking due to the difference in the coefficient of thermal expansion between the wiring board and the semiconductor element 24. An underfill resin 25 is not necessarily required to be used as long as the solder balls 23 have sufficient strength to ensure the desired reliability. A frame in which the area of the semiconductor element 24 is opened may be separately attached when the rigidity of the wiring board is insufficient in areas in which the semiconductor element 24 is not mounted.

In the diagram shown in FIG. 26F, the semiconductor element 24 is connected by flip-chip connection, but no limitation is imposed by this configuration, and the connection may be carried out by wire bonding. In this case, the adhesive 27 is applied to the surface of the semiconductor element 26 on which the circuitry is not disposed, and an organic material, or Ag paste or the like may be used. The electrodes (not shown) of the semiconductor element 26 and the second electrodes 14 can be electrically connected using bonding wires 28 composed of a material that primarily comprises gold. The semiconductor element 26 is mounted on the wiring board and thereafter covered using the sealing resin 29.

Figure 26G:
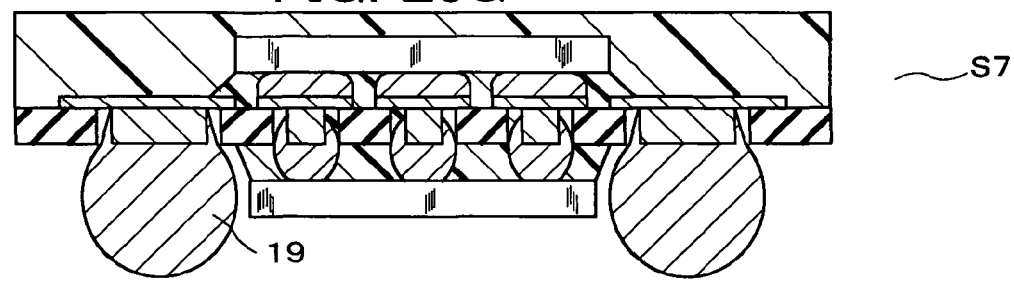

Next, the solder balls 19 are attached to the second electrodes 14 (step 7) as shown in FIG. 26G. The solder balls 19 are attached to the second electrodes 14 in order for the semiconductor device of the present invention to be mounted on another base board. The solder balls 19 are balls composed of solder material and are formed by ball transfer or printing on the second electrodes 14. Depending on the mode of attachment, metal pins may be soldered without attaching the solder balls 19 to the second electrodes 14. The diagram in FIG. 26G shows an example in which the solder balls 19 are formed on the second electrodes 14, but no limitation is imposed by this configuration, and the sealing resin 20 may be formed on a part that includes the semiconductor element 16 and the connection portions of the element. In the case that the structure is one in which the first electrodes 13 are exposed, the solder balls 19 may be formed on the first electrodes 13, or may be optionally formed both on the first electrodes 13 and on the second electrodes 14.

In accordance with the present embodiment, the semiconductor device according to the eleventh embodiment and the semiconductor device according to the twelfth embodiment of the present invention can be efficiently fabricated.

What is claimed is:

1. A wiring board comprising:
   at least a single insulation layer and at least a single wiring layer;
   a first surface and a second surface;
   a first electrode disposed on said first surface; and
   a second electrode disposed on said second surface;
   wherein:
   the second electrode disposed on said second surface is embedded in said insulation layer,
   the surface of said second electrode on the side opposite the surface exposed toward said second surface is connected to said wiring layer,
   all or a part of the side surface of said second electrode does not make contact with said insulation layer, and
   the surface of said second electrode that is exposed toward said second surface is in the same plane as said second surface.

2. The wiring board according to claim 1, wherein said first electrode and said second electrode are directly connected.

3. A semiconductor device comprising:
   the wiring board according to claim 1; and
   one or a plurality of semiconductor elements connected to said first electrode and/or said second electrode in the wiring board.

4. The semiconductor device according to claim 3, wherein
said first electrode and said second electrode are directly connected, one or a plurality of semiconductor elements is connected to said first electrode; and
one or a plurality of semiconductor elements is connected to said second electrode.

5. The wiring board according to claim 1, wherein:
said insulation layer is a single layer,
said wiring layer is a single layer,
said wiring layer is disposed on said insulation layer and said second electrode, and
said first electrode is disposed on said insulation layer and said second electrode.

6. The wiring board according to claim 1, wherein:
said wiring board comprises a plurality of insulation layers,
said wiring board comprises a plurality of wiring layers,
said plurality of insulation layers and said plurality of wiring layers are alternately laminated, and
said plurality of wiring layers are connected to each other by vias disposed within said insulation layers.

7. A wiring board comprising:
at least a single insulation layer and at least a single wiring layer;
a first surface and a second surface;
a first electrode disposed on said first surface; and
a second electrode disposed on said second surface;
wherein:
the second electrode disposed on said second surface is embedded in said insulation layer,
the surface of said second electrode on the side opposite the surface exposed toward said second surface is connected to said wiring layer,
all or a part of the side surface of said second electrode does not make contact with said insulation layer, and
the surface of said second electrode that is exposed toward said second surface is recessed with respect to said second surface.

8. The wiring board according to claim 7, wherein said first electrode and said second electrode are directly connected.

9. A semiconductor device comprising:
the wiring board according to claim 7; and
one or a plurality of semiconductor elements connected to said first electrode and/or said second electrode in the wiring board.

10. The semiconductor device according to claim 9, wherein:
said first electrode and said second electrode are directly connected, one or a plurality of semiconductor elements is connected to said first electrode; and
one or a plurality of semiconductor elements is connected to said second electrode.

11. The wiring board according to claim 7, wherein:
said insulation layer is a single layer,
said wiring layer is a single layer,
said wiring layer is disposed on said insulation layer and said second electrode, and
said first electrode is disposed on said insulation layer and said second electrode.

12. The wiring board according to claim 7, wherein:
said wiring board comprises a plurality of insulation layers,
said wiring board comprises a plurality of wiring layers,
said plurality of insulation layers and said plurality of wiring layers are alternately laminated, and
said plurality of wiring layers are connected to each other by vias disposed within said insulation layers.

13. A semiconductor device comprising:
a wiring board comprising:
at least a single insulation layer and at least a single wiring layer;
a first surface and a second surface;
a first electrode disposed on said first surface; and
a second electrode disposed on said second surface;
wherein:
the second electrode disposed on said second surface is embedded in said insulation layer,
the surface of said second electrode on the side opposite the surface exposed toward said second surface is connected to said wiring layer, and
all or a part of the side surface of said second electrode does not make contact with said insulation layer; and
one or a plurality of semiconductor elements connected to said first electrode and/or said second electrode in the wiring board,
wherein said semiconductor element is flip-chip connected to said first electrode and/or said second electrode by using a material comprising a low-melting metal or an electroconductive resin, and
wherein the surface of said second electrode that is exposed toward said second surface is in the same plane as said second surface.

14. The semiconductor device according to claim 13, wherein:
said first electrode and said second electrode are directly connected, one or a plurality of semiconductor elements is connected to said first electrode; and
one or a plurality of semiconductor elements is connected to said second electrode.

15. The semiconductor device according to claim 13, wherein:
said insulation layer is a single layer,
said wiring layer is a single layer,
said wiring layer is disposed on said insulation layer and said second electrode, and
said first electrode is disposed on said insulation layer and said second electrode.

16. The semiconductor device according to claim 13, wherein:
said wiring board comprises a plurality of insulation layers,
said wiring board comprises a plurality of wiring layers,
said plurality of insulation layers and said plurality of wiring layers are alternately laminated, and
said plurality of wiring layers are connected to each other by vias disposed within said insulation layers.

17. A semiconductor device comprising:
a wiring board comprising:
at least a single insulation layer and at least a single wiring layer;
a first surface and a second surface;
a first electrode disposed on said first surface; and
a second electrode disposed on said second surface;
wherein:
the second electrode disposed on said second surface is embedded in said insulation layer,
the surface of said second electrode on the side opposite the surface exposed toward said second surface is connected to said wiring layer, and
all or a part of the side surface of said second electrode does not make contact with said insulation layer; and
one or a plurality of semiconductor elements connected to said first electrode and/or said second electrode in the wiring board, wherein said semiconductor element is connected by wire bonding to said first electrode and/or said second electrode by using a wire in which the primary metal is gold, and wherein the surface of said second electrode that is exposed toward said second surface is in the same plane as said second surface.

18. The semiconductor device according to claim 17, wherein:
said first electrode and said second electrode are directly connected, one or a plurality of semiconductor elements is connected to said first electrode; and
one or a plurality of semiconductor elements is connected to said second electrode.

19. The semiconductor device according to claim 17, wherein:
said insulation layer is a single layer,
said wiring layer is a single layer,
said wiring layer is disposed on said insulation layer and said second electrode, and
said first electrode is disposed on said insulation layer and said second electrode.

20. The semiconductor device according to claim 17, wherein:
said wiring board comprises a plurality of insulation layers,
said wiring board comprises a plurality of wiring layers,
said plurality of insulation layers and said plurality of wiring layers are alternately laminated, and
said plurality of wiring layers are connected to each other by vias disposed within said insulation layers.

21. A semiconductor device comprising:
a wiring board comprising:
at least a single insulation layer and at least a single wiring layer;
a first surface and a second surface;
a first electrode disposed on said first surface; and
second electrode disposed on said second surface;
wherein:
the second electrode disposed on said second surface is embedded in said insulation layer,
the surface of said second electrode on the side opposite the surface exposed toward said second surface is connected to said wiring layer, and
all or a part of the side surface of said second electrode does not make contact with said insulation layer; and
one or a plurality of semiconductor elements connected to said first electrode and/or said second electrode in the wiring board,
wherein said semiconductor element is connected to said wiring board by using at least one material selected from a group consisting of a low-melting metal, an organic resin, and a metal-containing resin, and
wherein the surface of said second electrode that is exposed toward said second surface is in the same plane as said second surface.

22. The semiconductor device according to claim 21, wherein:
said first electrode and said second electrode are directly connected, one or a plurality of semiconductor elements is connected to said first electrode; and
one or a plurality of semiconductor elements is connected to said second electrode.

23. The semiconductor device according to claim 21, wherein:
said insulation layer is a single layer,
said wiring layer is a single layer,
said wiring layer is disposed on said insulation layer and said second electrode, and
said first electrode is disposed on said insulation layer and said second electrode.

24. The semiconductor device according to claim 21, wherein:
said wiring board comprises a plurality of insulation layers,
said wiring board comprises a plurality of wiring layers,
said plurality of insulation layers and said plurality of wiring layers are alternately laminated, and
said plurality of wiring layers are connected to each other by vias disposed within said insulation layers.

25. A semiconductor device comprising:
a wiring board comprising:
at least a single insulation layer and at least a single wiring layer;
a first surface and a second surface;
a first electrode disposed on said first surface; and
a second electrode disposed on said second surface;
wherein:
the second electrode disposed on said second surface is embedded in said insulation layer,
the surface of said second electrode on the side opposite the surface exposed toward said second surface is connected to said wiring layer, and
all or a part of the side surface of said second electrode does not make contact with said insulation layer; and
one or a plurality of semiconductor elements connected to said first electrode and/or said second electrode in the wiring board,
wherein a metal ball comprising a solder material is provided to said first electrode and/or said second electrode, and
wherein the surface of said second electrode that is exposed toward said second surface is in the same plane as said second surface.

26. The semiconductor device according to claim 25, wherein:
said first electrode and said second electrode are directly connected, one or a plurality of semiconductor elements is connected to said first electrode; and
one or a plurality of semiconductor elements is connected to said second electrode.

27. The semiconductor device according to claim 25, wherein:
said insulation layer is a single layer,
said wiring layer is a single layer,
said wiring layer is disposed on said insulation layer and said second electrode, and
said first electrode is disposed on said insulation layer and said second electrode.

28. The semiconductor device according to claim 25, wherein:
said wiring board comprises a plurality of insulation layers,
said wiring board comprises a plurality of wiring layers,
said plurality of insulation layers and said plurality of wiring layers are alternately laminated, and
said plurality of wiring layers are connected to each other by vias disposed within said insulation layers.

29. A semiconductor device comprising:
a wiring board comprising:
at least a single insulation layer and at least a single wiring layer;
a first surface and a second surface;
a first electrode disposed on said first surface; and
a second electrode disposed on said second surface;
wherein:

the second electrode disposed on said second surface is embedded in said insulation layer, the surface of said second electrode on the side opposite the surface exposed toward said second surface is connected to said wiring layer, and all or a part of the side surface of said second electrode does not make contact with said insulation layer; and one or a plurality of semiconductor elements connected to said first electrode and/or said second electrode in the wiring board, wherein said semiconductor element is flip-chip connected to said first electrode and/or said second electrode by using a material comprising a low-melting metal or an electroconductive resin, and wherein the surface of said second electrode that is exposed toward said second surface is recessed with respect to said second surface.

30. A semiconductor device comprising:
a wiring board comprising:
at least a single insulation layer and at least a single wiring layer;
a first surface and a second surface;
a first electrode disposed on said first surface; and
a second electrode disposed on said second surface;
wherein:
the second electrode disposed on said second surface is embedded in said insulation layer,
the surface of said second electrode on the side opposite the surface exposed toward said second surface is connected to said wiring layer, and
all or a part of the side surface of said second electrode does not make contact with said insulation layer; and
one or a plurality of semiconductor elements connected to said first electrode and/or said second electrode in the wiring board,
wherein said semiconductor element is connected by wire bonding to said first electrode and/or said second electrode by using a wire in which the primary metal is gold, and
wherein the surface of said second electrode that is exposed toward said second surface is recessed with respect to said second surface.

31. A semiconductor device comprising:
a wiring board comprising:
at least a single insulation layer and at least a single wiring layer;
a first surface and a second surface;
a first electrode disposed on said first surface; and
a second electrode disposed on said second surface;
wherein:
the second electrode disposed on said second surface is embedded in said insulation layer,
the surface of said second electrode on the side opposite the surface exposed toward said second surface is connected to said wiring layer, and
all or a part of the side surface of said second electrode does not make contact with said insulation layer; and
one or a plurality of semiconductor elements connected to said first electrode and/or said second electrode in the wiring board,
wherein said semiconductor element is connected to said wiring board by using at least one material selected from a group consisting of a low-melting metal, an organic resin, and a metal-containing resin, and
wherein the surface of said second electrode that is exposed toward said second surface is recessed with respect to said second surface.

32. A semiconductor device comprising:
a wiring board comprising:
at least a single insulation layer and at least a single wiring layer;
a first surface and a second surface;
a first electrode disposed on said first surface; and
a second electrode disposed on said second surface;
wherein:
the second electrode disposed on said second surface is embedded in said insulation layer,
the surface of said second electrode on the side opposite the surface exposed toward said second surface is connected to said wiring layer, and
all or a part of the side surface of said second electrode does not make contact with said insulation layer; and
one or a plurality of semiconductor elements connected to said first electrode and/or said second electrode in the wiring board,
wherein a metal ball comprising a solder material is provided to said first electrode and/or said second electrode, and
wherein the surface of said second electrode that is exposed toward said second surface is recessed with respect to said second surface.

* * * * *

UNITED STATES PATENT AND TRADEMARK OFFICE
CERTIFICATE OF CORRECTION

PATENT NO. : 7,791,186 B2  Page 1 of 1
APPLICATION NO. : 11/542261
DATED : September 7, 2010
INVENTOR(S) : Katsumi Kikuchi et al.

It is certified that error appears in the above-identified patent and that said Letters Patent is hereby corrected as shown below:

In The Specifications:
Column 26, Line 61: After "resin" insert -- 20 --
Column 32, Line 49: After "second" delete "5"
Column 36, Line 5: After "vias" insert -- 15 --
Column 36, Line 13: After "vias" insert -- 15 --
Column 36, Line 18: After "vias" insert -- 15 --
Column 36, Line 28: After "vias" insert -- 15 --
Column 36, Line 30: After "vias" insert -- 15 --
Column 36, Line 34: After "vias" insert -- 15 --
Column 36, Line 36: After "vias" insert -- 15 --
Column 36, Line 44: After "vias" insert -- 15 --
Column 40, Line 34: After "resin" insert -- 20 --
Column 40, Line 35: After "resin" insert -- 20 --
Column 40, Line 42: After "resin" insert -- 20 --
Column 41, Line 25: After "resin" insert -- 20 --
Column 42, Line 27: After "resin" insert -- 25 --
Column 42, Line 31: After "resin" insert -- 25 --
Column 42, Line 37: After "resin" insert -- 25 --
Column 45, Line 17: After "resin" insert -- 25 --
Column 42, Line 21: After "resin" insert -- 25 --
Column 45, Line 27: After "resin" insert -- 25 --
In The Claims:
Column 51, Line 37: In Claim 21, before "second electrode" insert -- a --

Signed and Sealed this

Fourteenth Day of December, 2010

David J. Kappos
*Director of the United States Patent and Trademark Office*